(12) United States Patent
Jinta

(10) Patent No.: US 10,977,995 B2
(45) Date of Patent: Apr. 13, 2021

(54) DISPLAY UNIT, DRIVING METHOD, AND ELECTRONIC APPARATUS

(71) Applicant: Sony Corporation, Tokyo (JP)

(72) Inventor: Seiichiro Jinta, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 16/820,322

(22) Filed: Mar. 16, 2020

(65) Prior Publication Data
US 2020/0286427 A1 Sep. 10, 2020

Related U.S. Application Data

(63) Continuation of application No. 16/116,098, filed on Aug. 29, 2018, now Pat. No. 10,621,914, which is a
(Continued)

(30) Foreign Application Priority Data

May 14, 2014 (JP) ................................. 2014-100767

(51) Int. Cl.
G09G 3/3233 (2016.01)
G09G 3/20 (2006.01)
G09G 3/3266 (2016.01)
G09G 3/3283 (2016.01)
H01L 27/32 (2006.01)

(52) U.S. Cl.
CPC ......... G09G 3/3233 (2013.01); G09G 3/2022 (2013.01); G09G 3/3266 (2013.01); G09G 3/3283 (2013.01); G09G 2300/0809 (2013.01); G09G 2300/0819 (2013.01); G09G 2300/0852 (2013.01); G09G 2300/0861 (2013.01); G09G 2310/0251 (2013.01); G09G 2310/08 (2013.01); H01L 27/3265 (2013.01)

(58) Field of Classification Search
CPC .. G09G 3/3233; G09G 3/2022; G09G 3/3266; G09G 3/3283; G09G 2300/0819; G09G 2300/0852; G09G 2300/0861; G09G 2310/0251; G09G 2310/08; G09G 2300/0809; H01L 27/3265
USPC .......................................................... 345/76
See application file for complete search history.

(56) References Cited

U.S. PATENT DOCUMENTS

2006/0139259 A1* 6/2006 Choi .................... G09G 3/3241
345/76
2010/0289830 A1 11/2010 Yamamoto et al.
(Continued)

FOREIGN PATENT DOCUMENTS

JP 2006-317696 A 11/2006
JP 2008-287139 A 11/2008
(Continued)

*Primary Examiner* — Koosha Sharifi-Tafreshi
(74) *Attorney, Agent, or Firm* — Michael Best & Friedrich LLP

(57) ABSTRACT

A display unit of the disclosure includes a unit pixel and a driving section that drives the unit pixel. The unit pixel includes a light-emitting device, a capacitor section having a first capacitor and a second capacitor that are coupled in series through a first node, a drive transistor that supplies a drive current corresponding to a potential difference across both ends of the capacitor section to the light-emitting device, and a first transistor that delivers a first voltage to the first node by turning on.

20 Claims, 55 Drawing Sheets

Related U.S. Application Data continuation of application No. 15/305,527, filed as application No. PCT/JP2015/062522 on Apr. 24, 2015, now Pat. No. 10,096,282.

(56) References Cited

U.S. PATENT DOCUMENTS

| | | |
|---|---|---|
| 2011/0090200 A1 | 4/2011 | Choi et al. |
| 2013/0335399 A1 | 12/2013 | Tsuge |
| 2014/0347347 A1 | 11/2014 | Jeong et al. |
| 2015/0302798 A1 | 10/2015 | Tan |
| 2016/0379552 A1 | 12/2016 | Kim et al. |

FOREIGN PATENT DOCUMENTS

| | | |
|---|---|---|
| JP | 2009-276796 A | 11/2009 |
| WO | 2013/021621 A1 | 2/2013 |
| WO | 2013/021622 A1 | 2/2013 |

\* cited by examiner

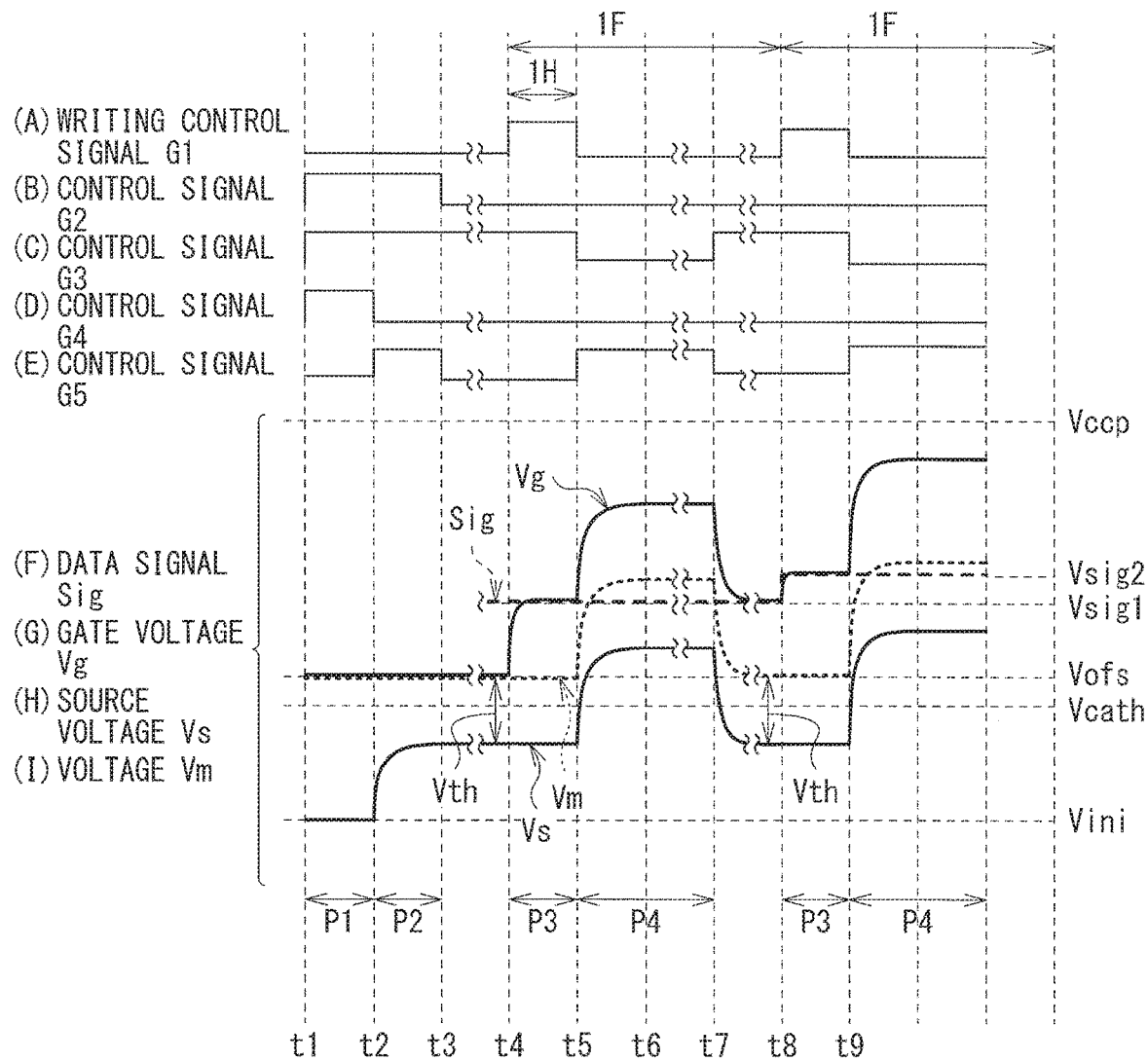
[FIG. 4]

[ FIG. 5A ]
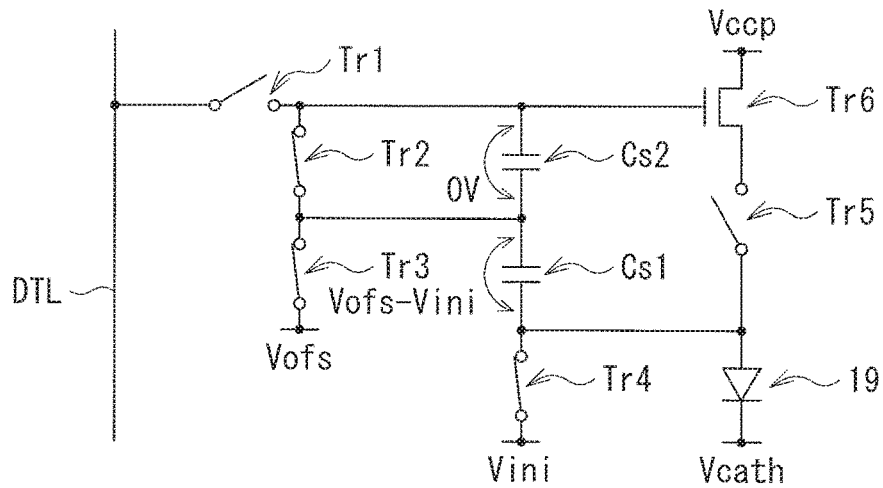
[ FIG. 5B ]
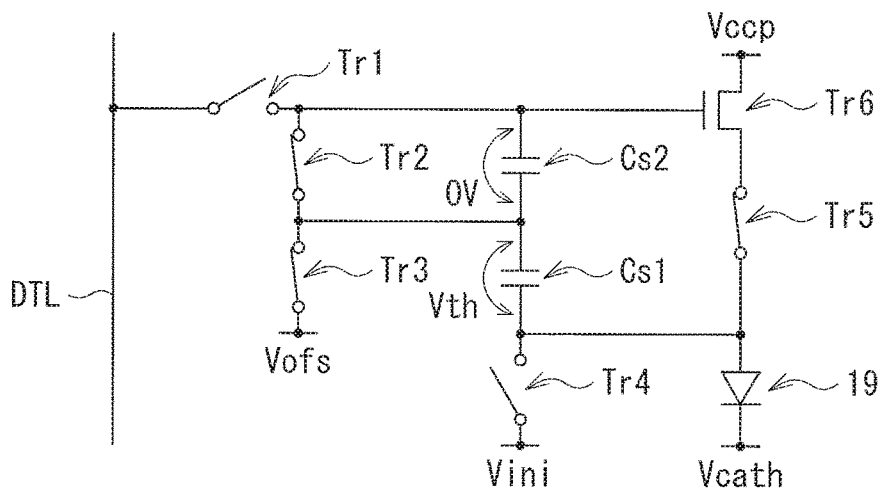
[ FIG. 5C ]
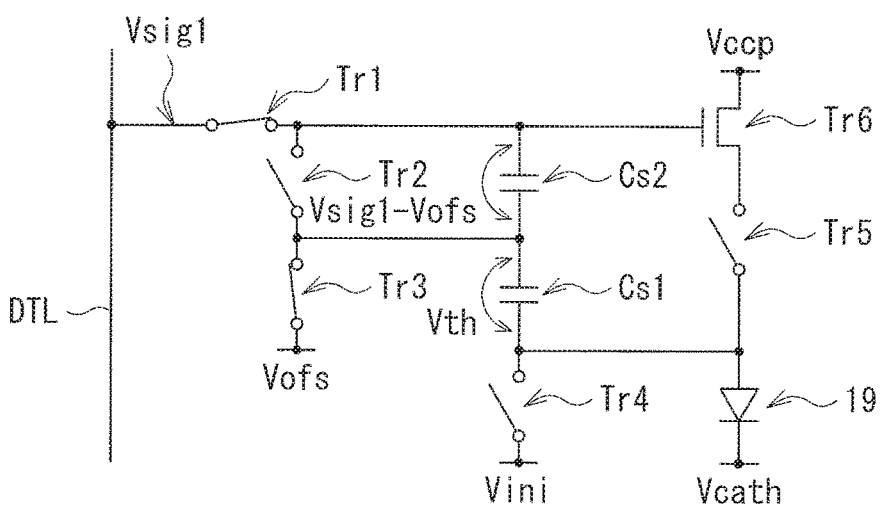

[FIG. 5D]
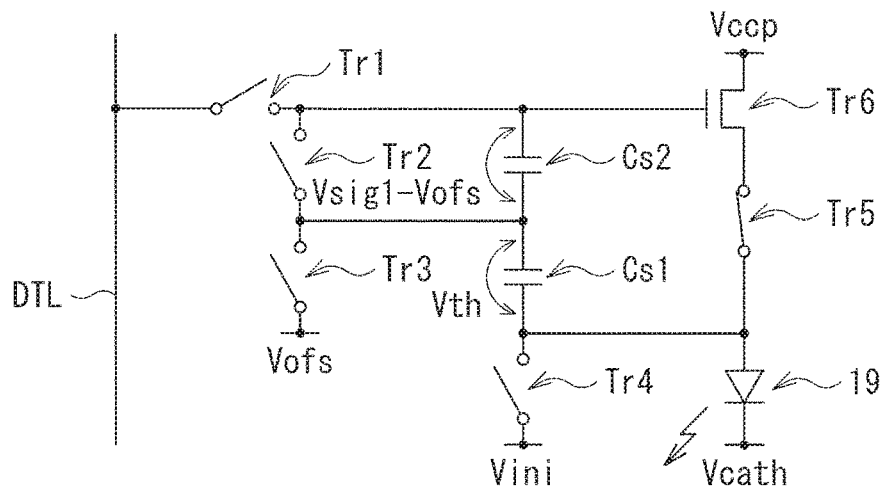
[FIG. 5E]
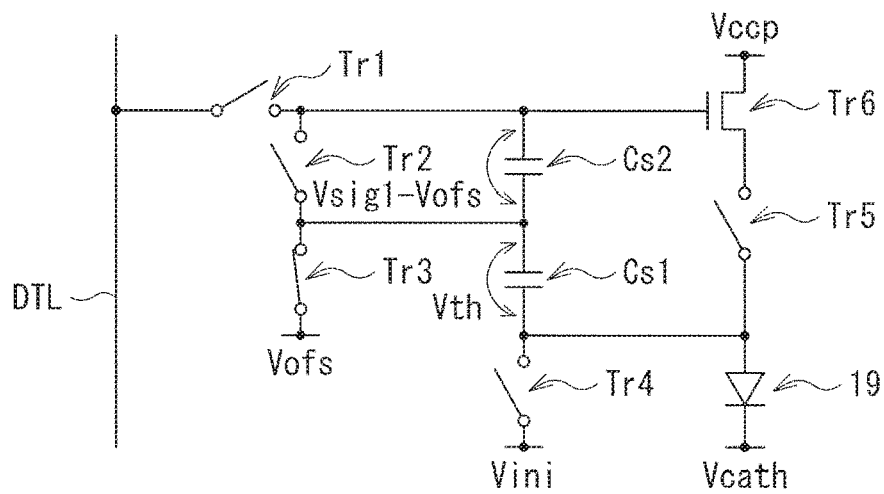
[FIG. 5F]
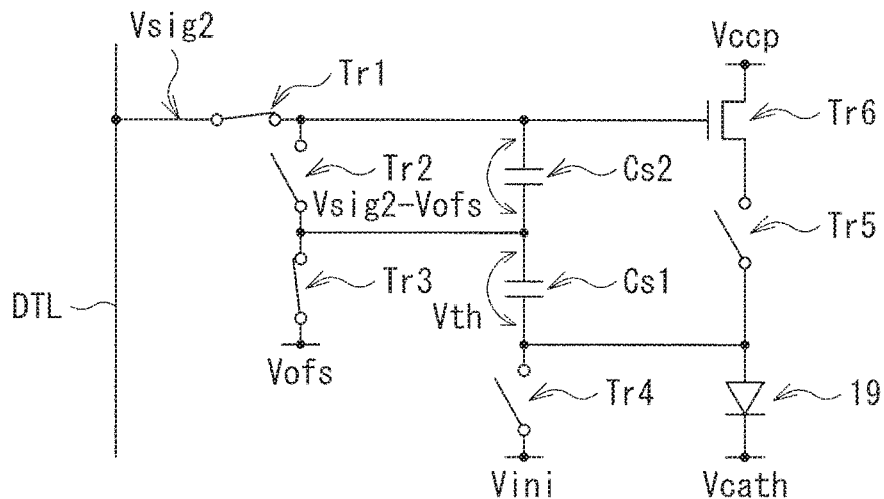

[ FIG. 5G ]
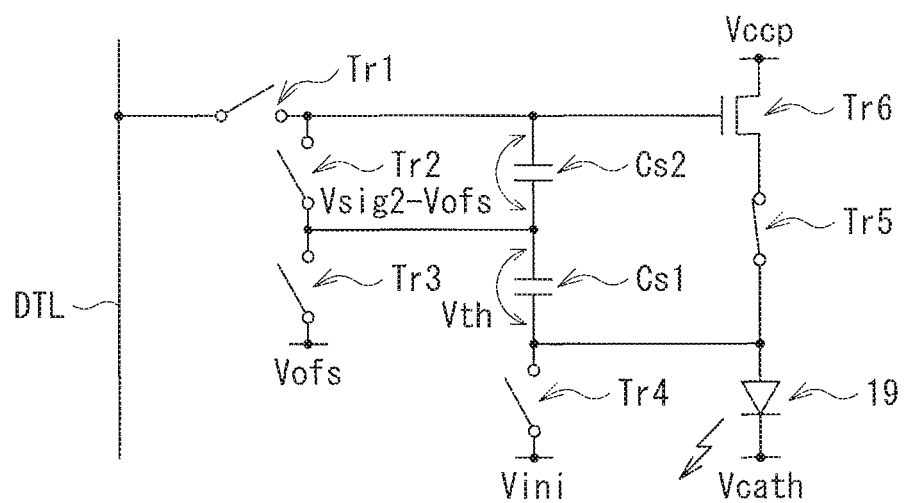

[ FIG. 22 ]
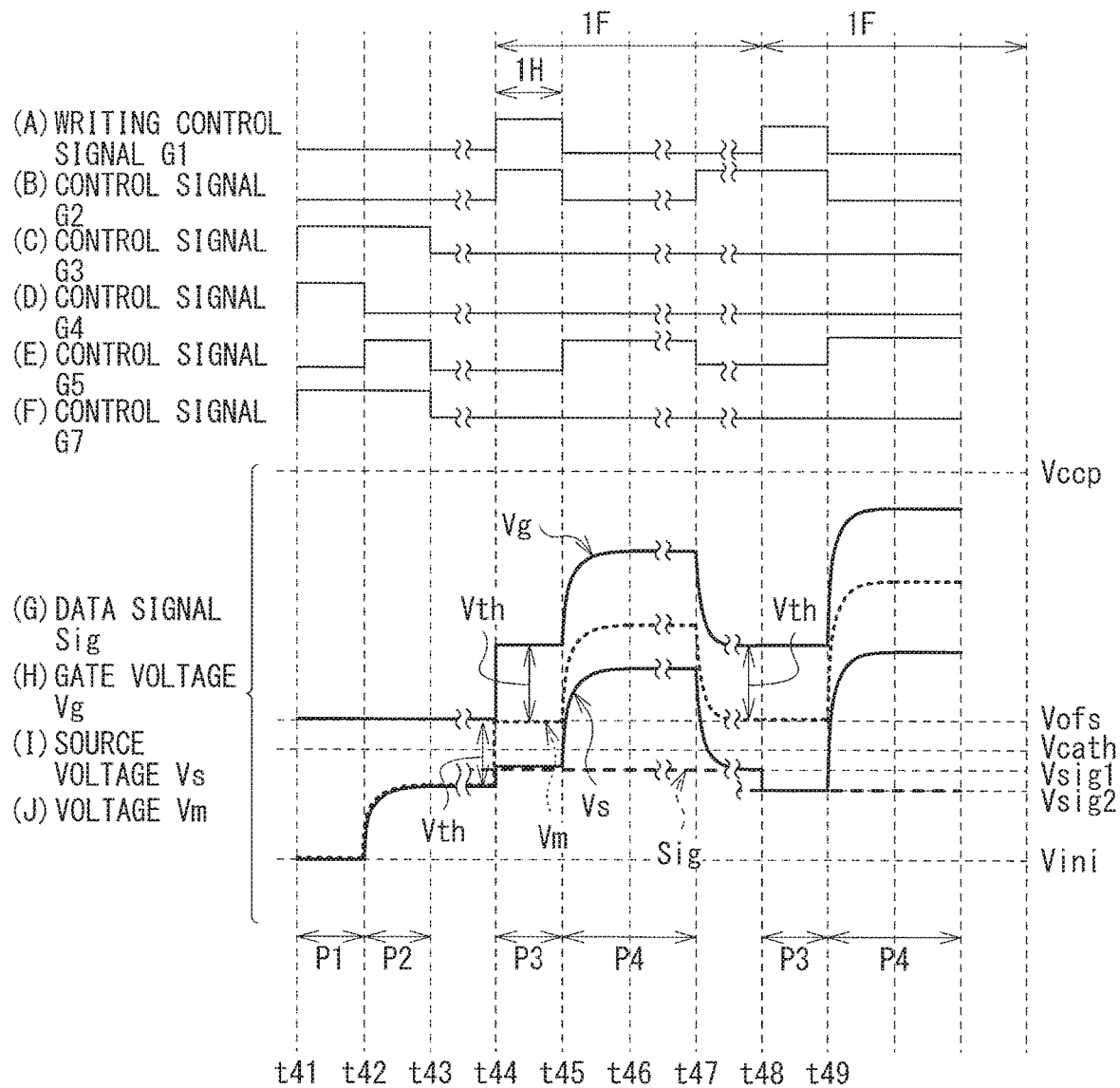

[ FIG. 23A ]
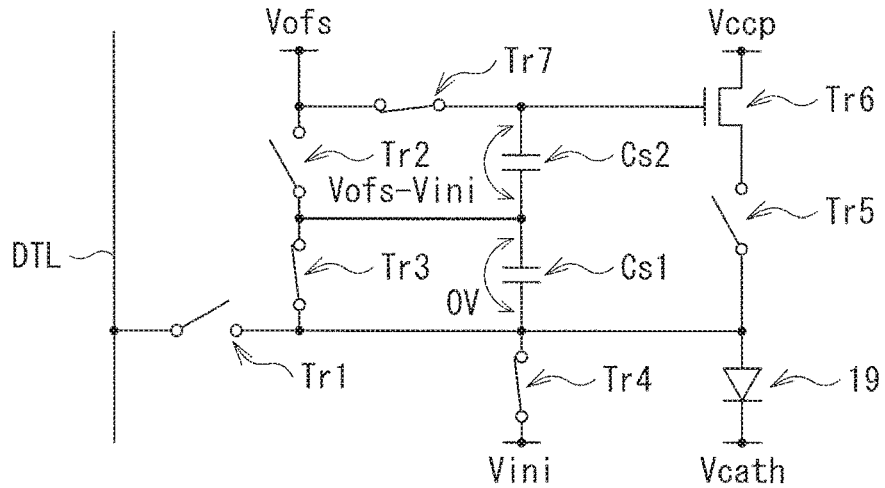
[ FIG. 23B ]
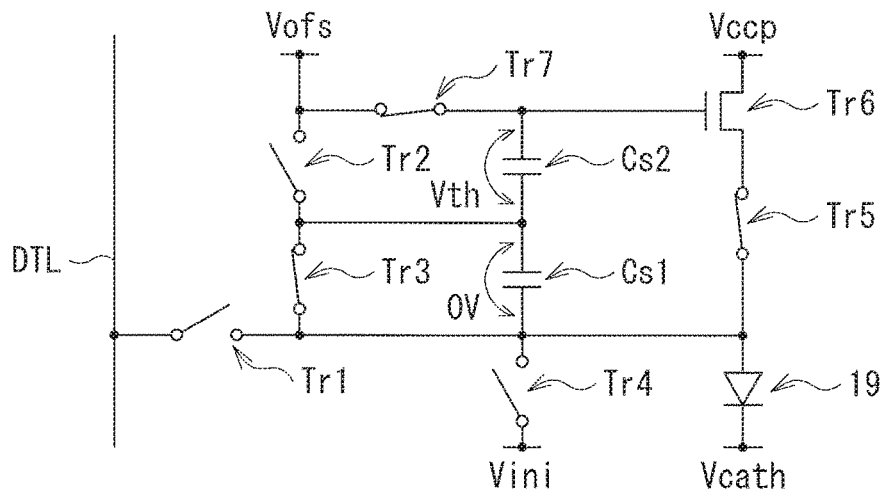
[ FIG. 23C ]
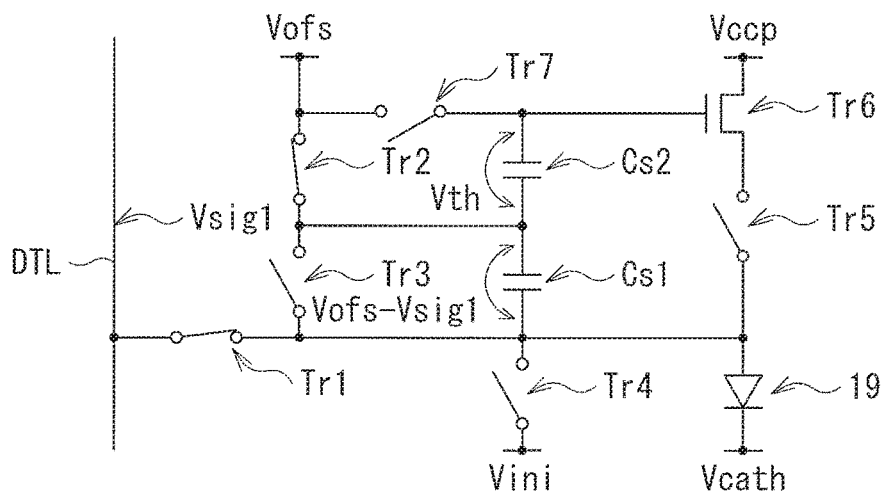

[ FIG. 23D ]
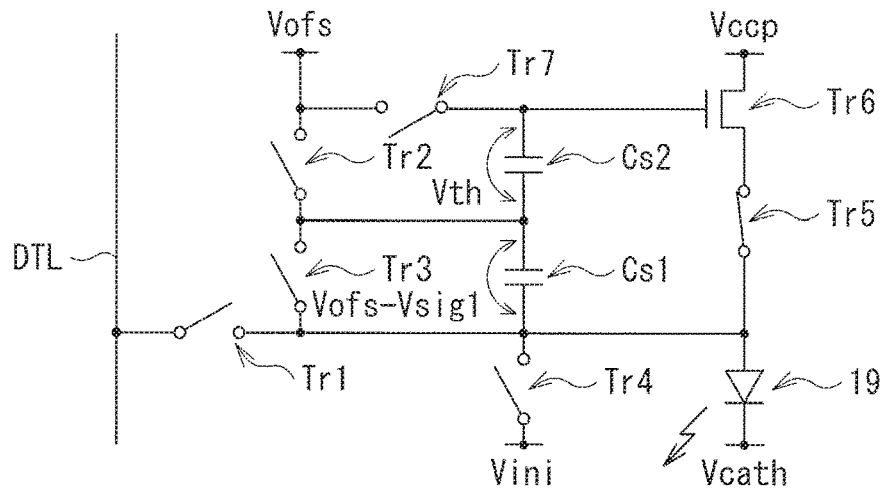
[ FIG. 23E ]
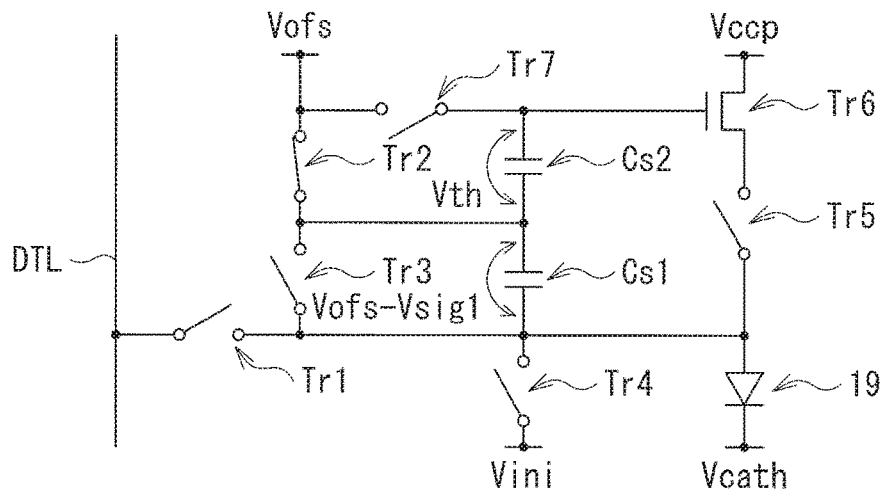
[ FIG. 23F ]
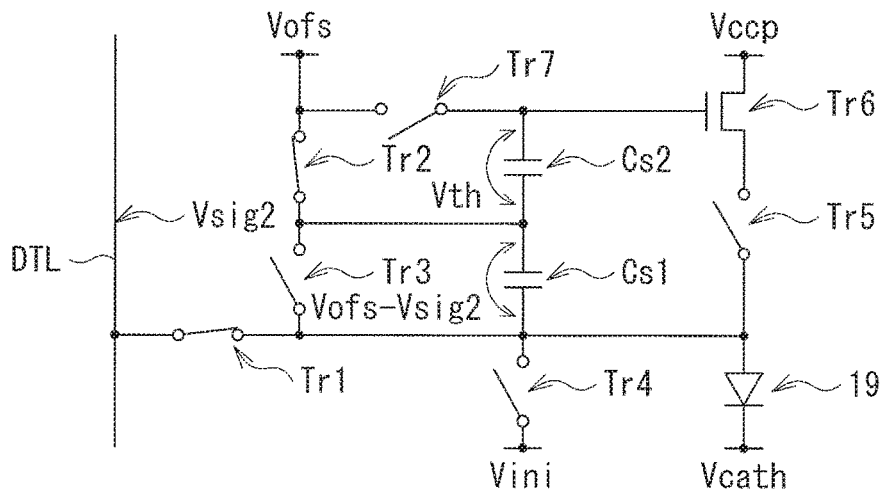

[ FIG. 23G ]
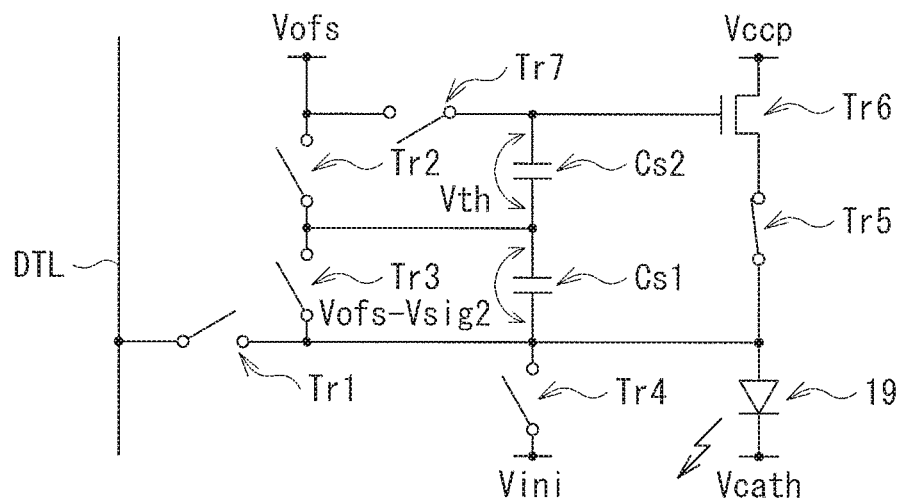

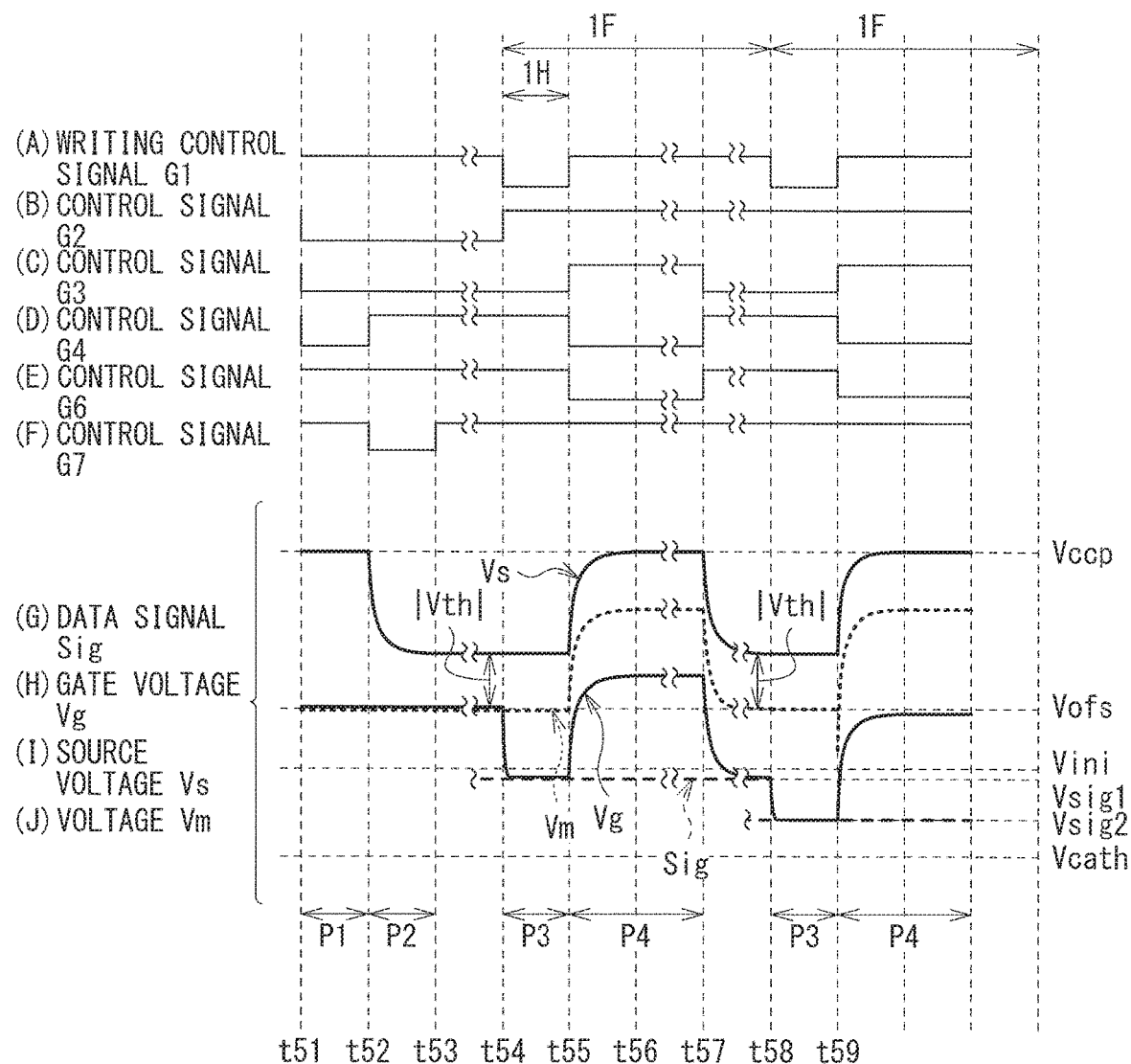
[FIG. 25]

[ FIG. 26A ]
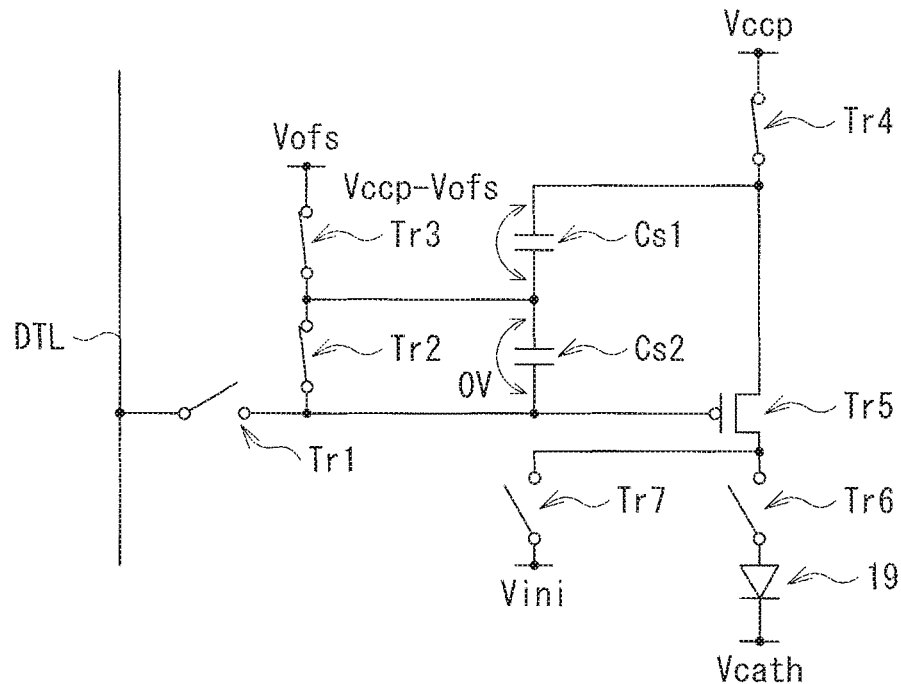
[ FIG. 26B ]
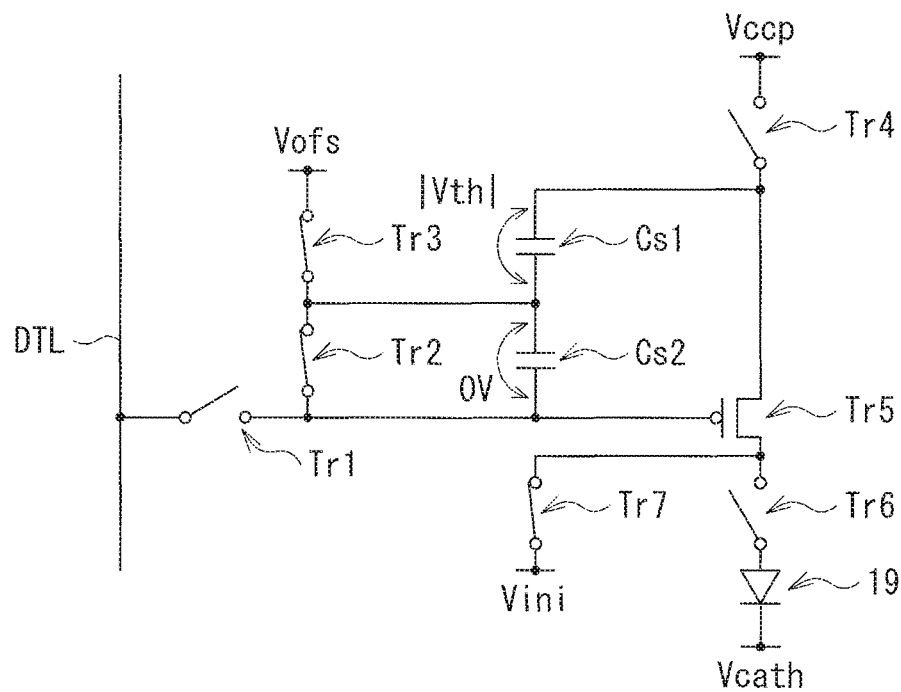

[ FIG. 26C ]
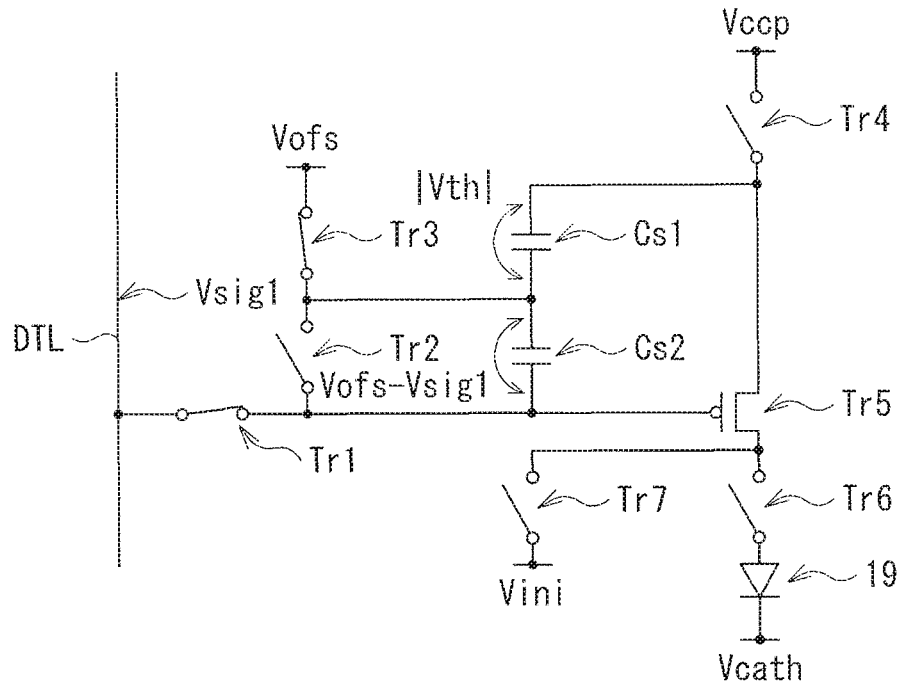
[ FIG. 26D ]
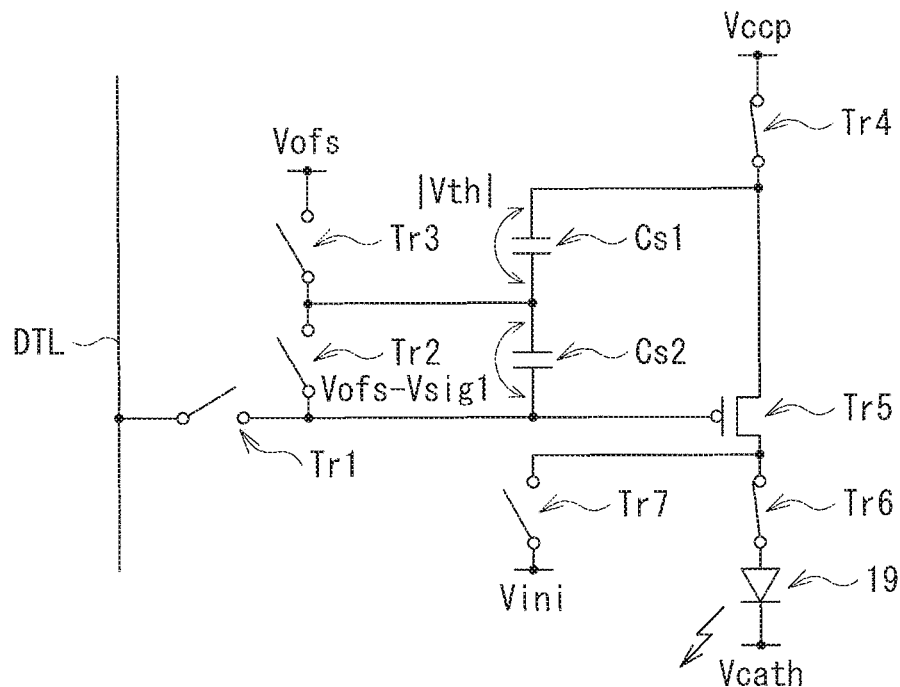

[ FIG. 26E ]
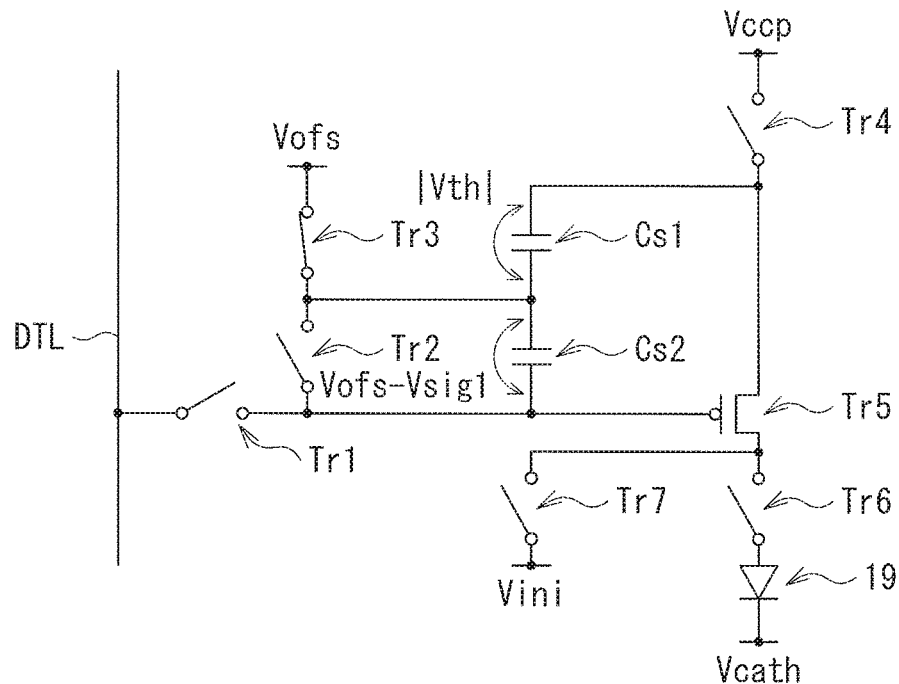
[ FIG. 26F ]
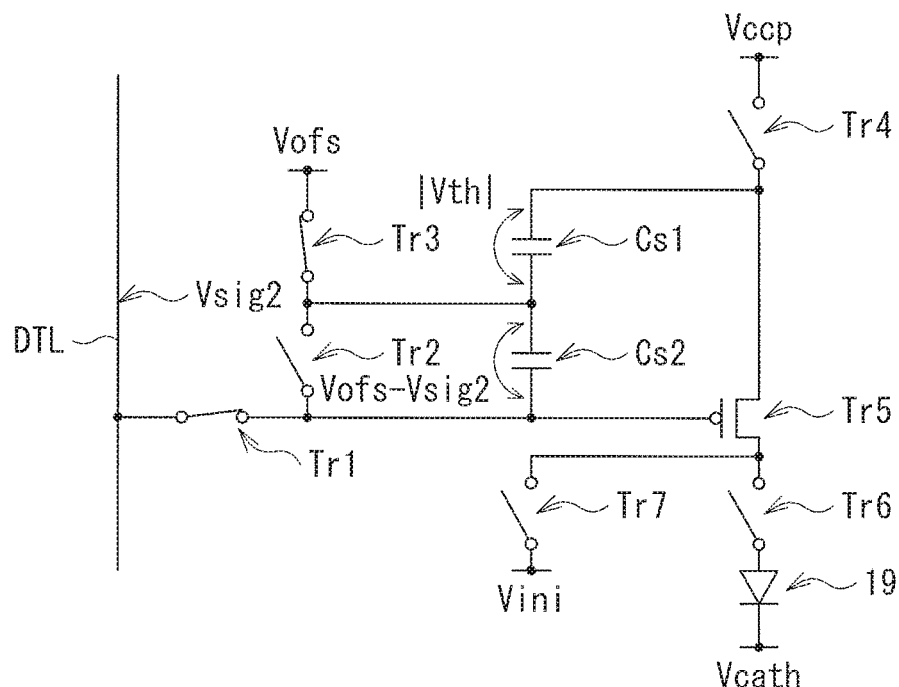

[ FIG. 26G ]
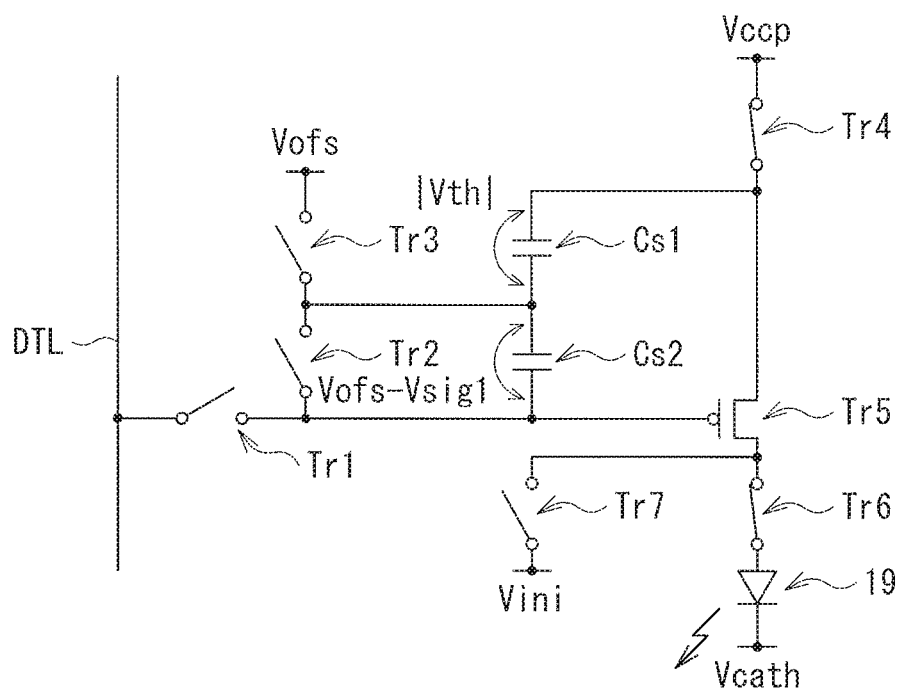

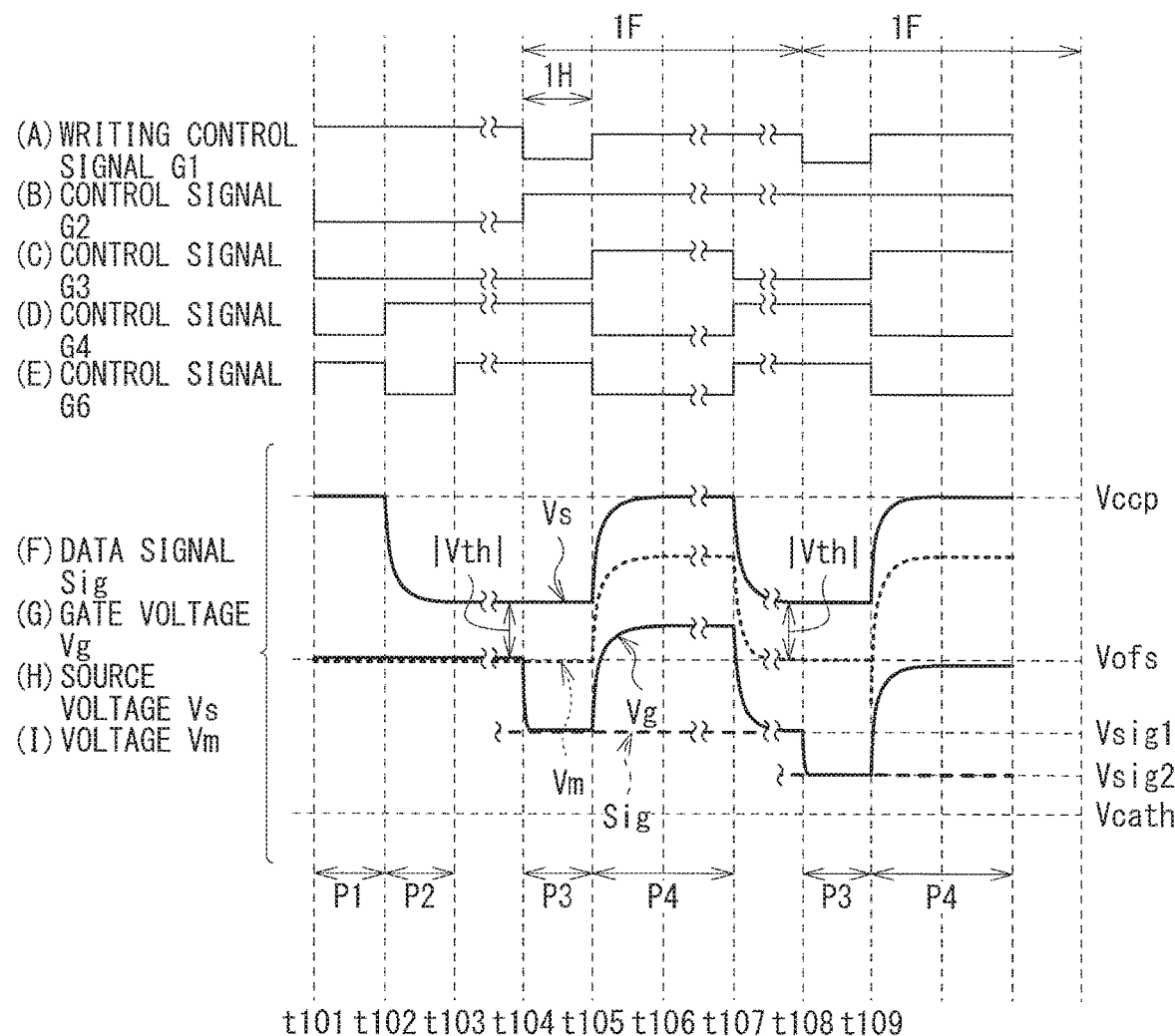
[ FIG. 37 ]

[FIG. 38A]
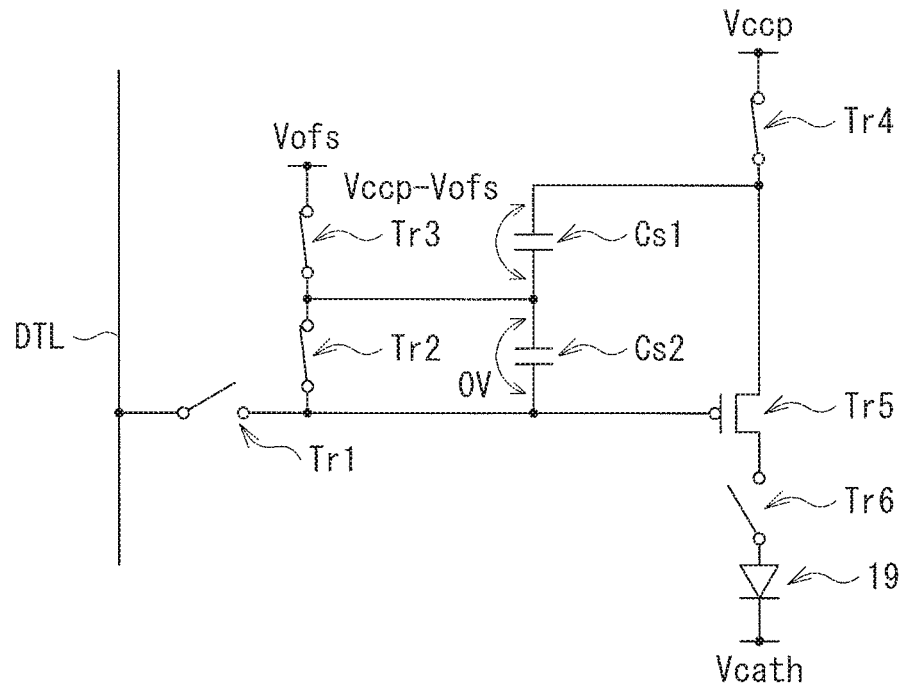
[FIG. 38B]
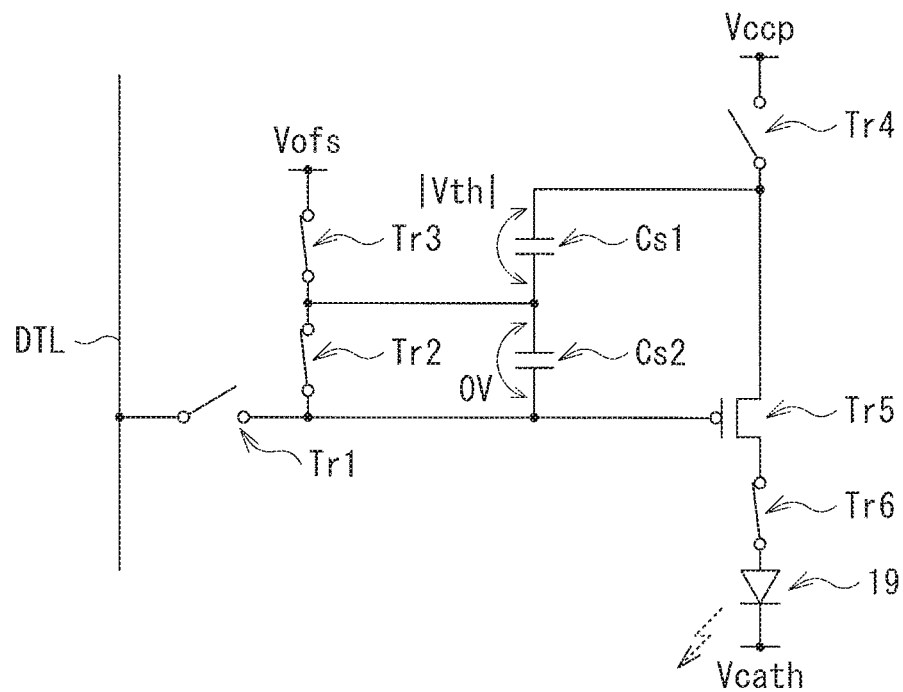

[ FIG. 38C ]
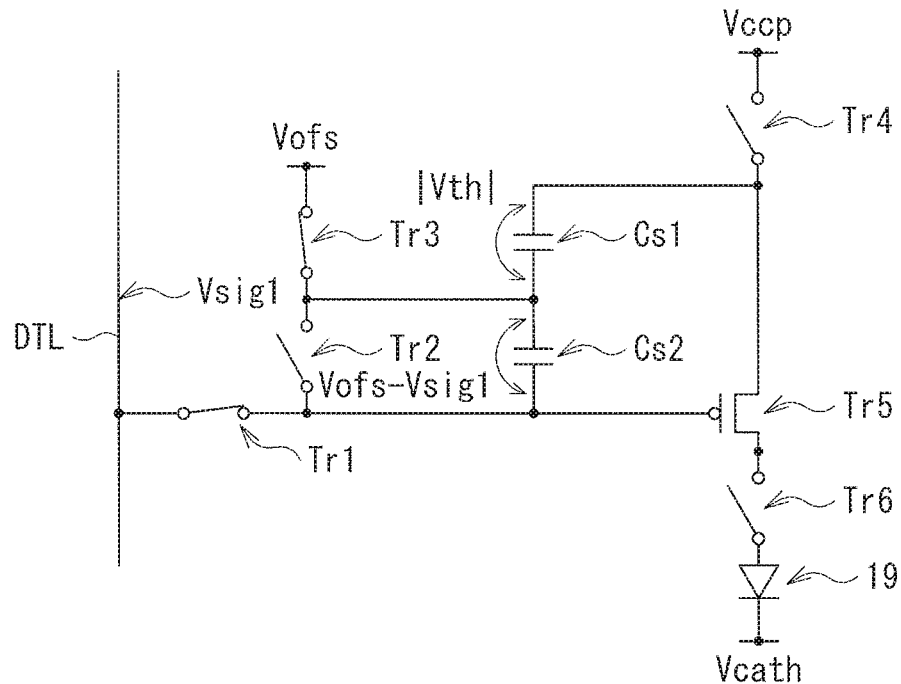
[ FIG. 38D ]
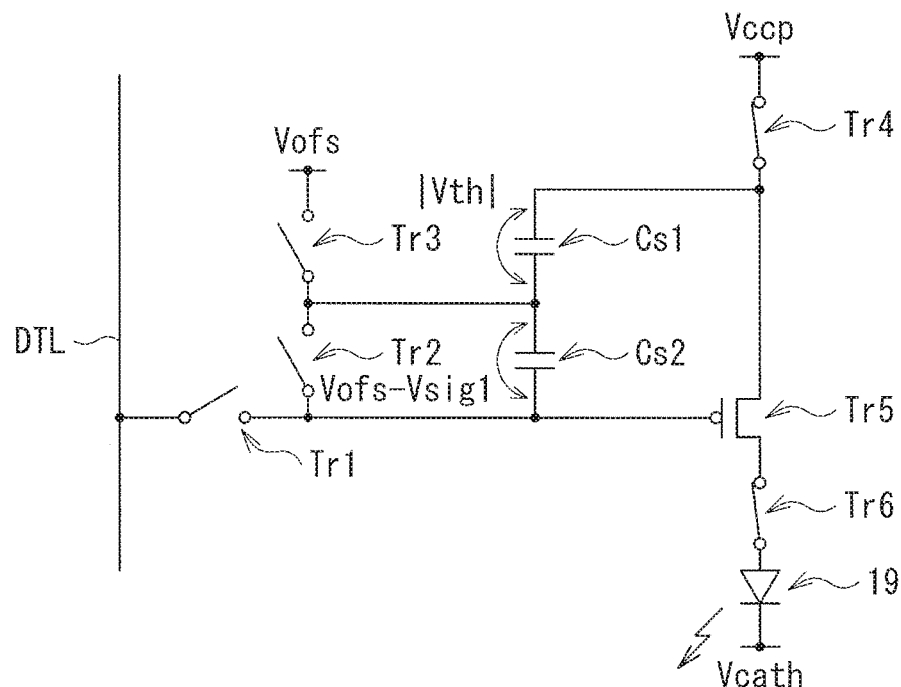

[ FIG. 38E ]
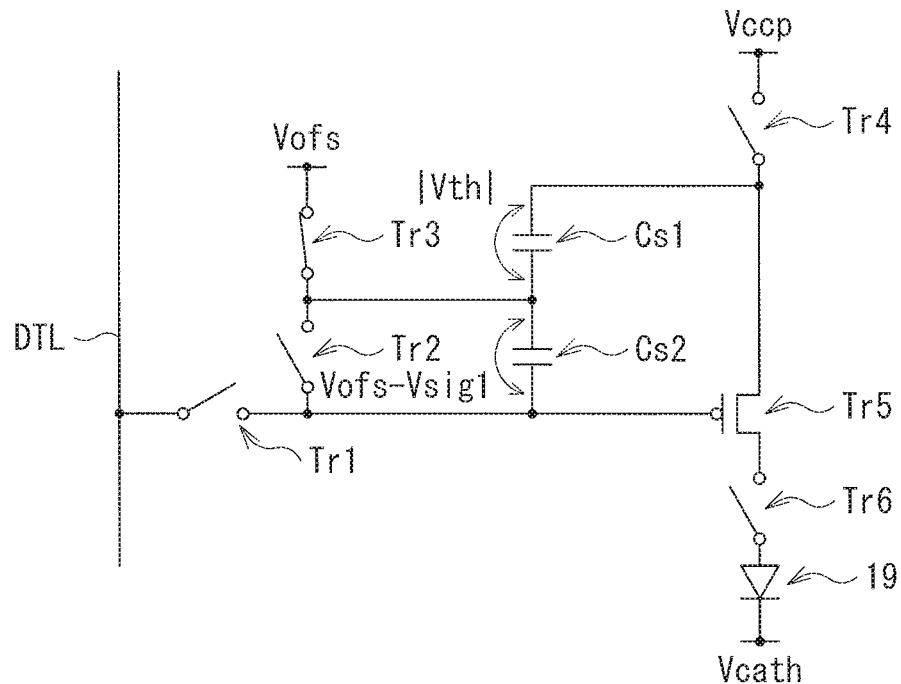
[ FIG. 38F ]
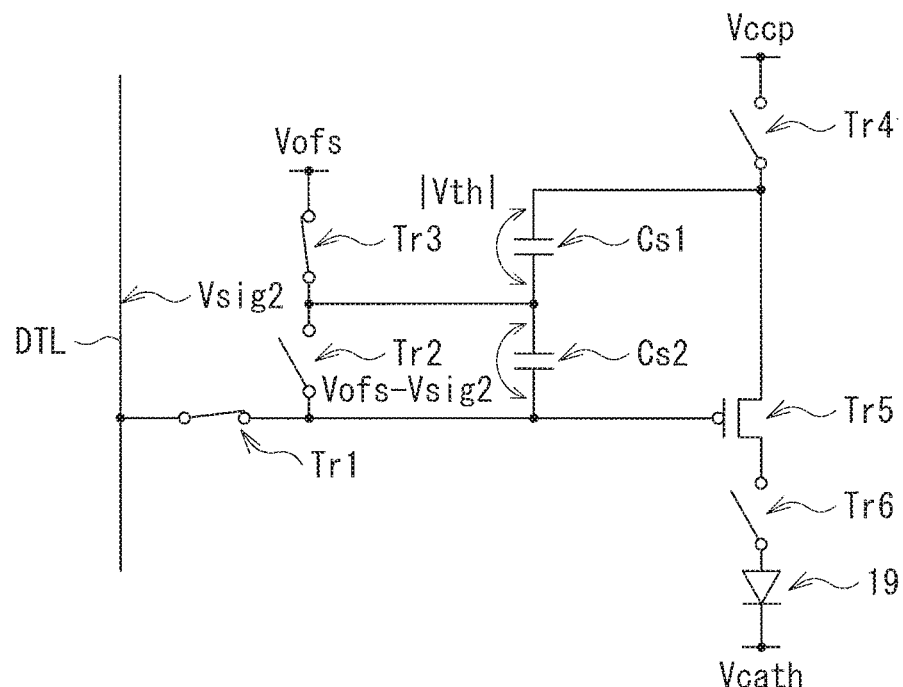

[FIG. 38G]
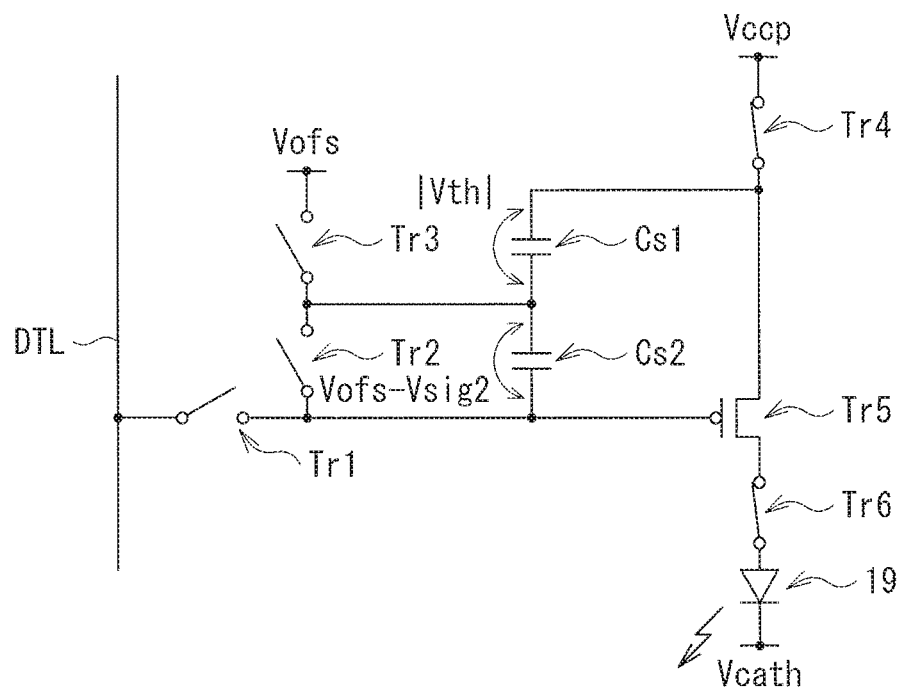

DISPLAY UNIT, DRIVING METHOD, AND ELECTRONIC APPARATUS

CROSS-REFERENCE TO RELATED APPLICATION

This application is a Continuation of application Ser. No. 16/116,098, filed Aug. 29, 2018, which is a Continuation of application Ser. No. 15/305,527, filed Oct. 20, 2016, now U.S. Pat. No. 10,096,282, issued on Oct. 9, 2018, which is a National Stage Application of PCT/JP2015/062522, filed Apr. 24, 2015, and is based upon and claims the benefit of priority from Japanese Patent Application No. 2014-100767, filed May 14, 2014, the entire contents of which are incorporated herein by reference.

TECHNICAL FIELD

The disclosure relates to a display unit having current-drive type display devices, a method of driving such a display unit, and an electronic apparatus that includes such a display unit.

BACKGROUND ART

In recent years, in the field of a display unit that performs image display, a display unit (organic Eectroluminescence (EL) display unit) has been developed that uses, as a light-emitting device, a current-drive type optical device in which the emission luminance varies depending on a value of a flowing current, such as an organic EL device, and the product commercialization of such a display unit has been carried forward. Unlike a liquid crystal device and the like, such an optical device is a self-emitting device, thus eliminating the necessity for providing a light source (backlight) separately. Therefore, for example, the organic EL display unit may have characteristics including the higher visibility of images, lower power consumption, and higher response speed of devices than those of a liquid crystal display unit involving a light source.

In such a display unit, for example, a unit pixel may have a light-emitting device and a drive transistor that supplies a current to the light-emitting device. The drive transistor may have variations in the characteristics thereof on each pixel basis, and it is likely that the image quality will deteriorate in such a case. As an example, PTL 1 discloses a display unit that corrects for variations in the characteristics of a drive transistor each time a pixel voltage is written into a unit pixel.

CITATION LIST

Patent Literature

[PTL 1] Japanese Unexamined Patent Application Publication No. 2008-287139

SUMMARY OF THE INVENTION

Meanwhile, in an electronic apparatus, low power consumption has been typically desired, and reduction in the power consumption has been expected in a display unit as well.

Accordingly, it is desirable to provide a display unit, a driving method, and an electronic apparatus that make it possible to reduce the power consumption.

A display unit according to an embodiment of the disclosure includes a unit pixel and a driving section. The driving section drives the unit pixel. The unit pixel has a light-emitting device, a capacitor section, a drive transistor, and a first transistor. The capacitor section has a first capacitor and a second capacitor that are coupled in series through a first node. The first transistor delivers a first voltage to the first node by turning on.

A driving method according to an embodiment of the disclosure includes: performing preparatory driving to set a predetermined voltage in the first capacitor of the capacitor section having the first capacitor and the second capacitor that are coupled in series through the first node; and performing write driving to set a voltage corresponding to a pixel voltage in the second capacitor and luminescent driving to provide a drive current corresponding to a potential difference across both ends of the capacitor section to the light-emitting device more than once alternately after the preparatory driving.

An electronic apparatus according to an embodiment of the disclosure includes the above-described display unit, and examples thereof may include a television receiver, an electronic book, a smartphone, a digital camera, a notebook personal computer, a video camera, and a head-mounted display.

In the display unit, the driving method, and the electronic apparatus according to an embodiment of the disclosure, a drive current corresponding to a potential difference across both ends of the capacitor section is supplied to the light-emitting device. In this capacitor section, the first capacitor and the second capacitor are coupled in series through the first node. There is provided the first transistor that delivers the first voltage to the first node.

According to the display unit, the driving method, and the electronic apparatus of an embodiment of the disclosure, the first capacitor and the second capacitor are coupled in series, and there is provided the first transistor that delivers the first voltage to the first node, thus allowing for reduction of the power consumption. It is to be noted that effects of the embodiments of the disclosure are not necessarily limited thereto, and may include any of effects that will be hereinafter described in the disclosure.

BRIEF DESCRIPTION OF DRAWINGS

FIG. 4 is a timing waveform chart illustrating an operation example of a sub-pixel illustrated in FIG. 1.

FIG. 5A is a circuit diagram illustrating a state of the sub-pixel illustrated in FIG. 1.

FIG. 5B is a circuit diagram illustrating another state of the sub-pixel illustrated in FIG. 1.

FIG. 5C is a circuit diagram illustrating another state of the sub-pixel illustrated in FIG. 1.

FIG. 5D is a circuit diagram illustrating another state of the sub-pixel illustrated in FIG. 1.

FIG. 5E is a circuit diagram illustrating another state of the sub-pixel illustrated in FIG. 1.

FIG. 5F is a circuit diagram illustrating another state of the sub-pixel illustrated in FIG. 1.

FIG. 5G is a circuit diagram illustrating another state of the sub-pixel illustrated in FIG. 1.

FIG. 22 is a timing waveform chart illustrating an operation example of a sub-pixel illustrated in FIG. 21.

FIG. 23A is a circuit diagram illustrating a state of the sub-pixel illustrated in FIG. 21.

FIG. 23B is a circuit diagram illustrating another state of the sub-pixel illustrated in FIG. 21.

FIG. 23C is a circuit diagram illustrating another state of the sub-pixel illustrated in FIG. 21.

FIG. 23D is a circuit diagram illustrating another state of the sub-pixel illustrated in FIG. 21.

FIG. 23E is a circuit diagram illustrating another state of the sub-pixel illustrated in FIG. 21.

FIG. 23F is a circuit diagram illustrating another state of the sub-pixel illustrated in FIG. 21.

FIG. 23G is a circuit diagram illustrating another state of the sub-pixel illustrated in FIG. 21.

FIG. 25 is a timing waveform chart illustrating an operation example of a sub-pixel illustrated in FIG. 24.

FIG. 26A is a circuit diagram illustrating a state of the sub-pixel illustrated in FIG. 24.

FIG. 26B is a circuit diagram illustrating another state of the sub-pixel illustrated in FIG. 24.

FIG. 26C is a circuit diagram illustrating another state of the sub-pixel illustrated in FIG. 24.

FIG. 26D is a circuit diagram illustrating another state of the sub-pixel illustrated in FIG. 24.

FIG. 26E is a circuit diagram illustrating another state of the sub-pixel illustrated in FIG. 24.

FIG. 26F is a circuit diagram illustrating another state of the sub-pixel illustrated in FIG. 24.

FIG. 26G is a circuit diagram illustrating another state of the sub-pixel illustrated in FIG. 24.

FIG. 37 is a timing waveform chart illustrating an operation example of a sub-pixel illustrated in FIG. 36.

FIG. 38A is a circuit diagram illustrating a state of the sub-pixel illustrated in FIG. 36.

FIG. 38B is a circuit diagram illustrating another state of the sub-pixel illustrated in FIG. 36.

FIG. 38C is a circuit diagram illustrating another state of the sub-pixel illustrated in FIG. 36.

FIG. 38D is a circuit diagram illustrating another state of the sub-pixel illustrated in FIG. 36.

FIG. 38E is a circuit diagram illustrating another state of the sub-pixel illustrated in FIG. 36.

FIG. 38F is a circuit diagram illustrating another state of the sub-pixel illustrated in FIG. 36.

FIG. 38G is a circuit diagram illustrating another state of the sub-pixel illustrated in FIG. 36.

EMBODIMENTS FOR CARRYING OUT THE INVENTION

Hereinafter, some embodiments of the disclosure are described in detail with reference to the drawings. It is to be noted that description will be given in the following order.
1. First Embodiment
2. Second Embodiment
3. Application Examples

1. First Embodiment

[Examples of Configuration]

Figure 1:
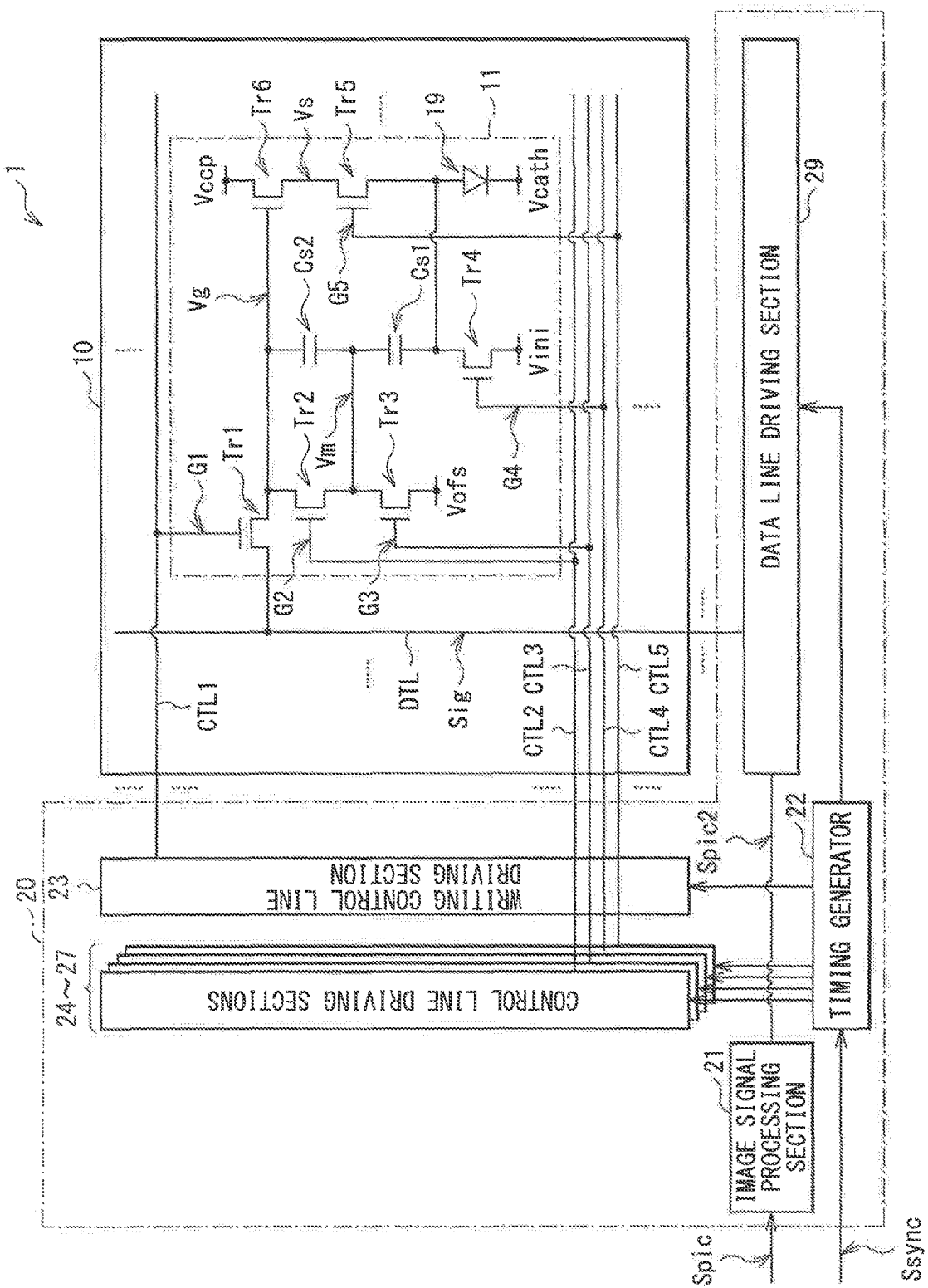
FIG. 1 is a circuit diagram illustrating a configuration example of a display unit according to a first embodiment of the disclosure.

FIG. 1 illustrates a configuration example of a display unit according to a first embodiment. A display unit 1 is an active matrix type display unit using organic EL devices. It is to be noted that a driving circuit and a driving method according to the respective embodiments of the disclosure are embodied by the present embodiment, and therefore are described together. The display unit 1 includes a display section 10 and a driving section 20.

The display section 10 displays images on the basis of driving performed by the driving section 20. The display section 10 has a plurality of sub-pixels 11 that are arranged in matrix. Further, the display section 10 has a plurality of writing control lines CTL1 extending in a row direction (transverse direction), a plurality of control lines CTL2 to CTL5 extending in a row direction, and a plurality of data lines DTL extending in a column direction (longitudinal direction). One end of each of the plurality of writing control lines CTL1, the plurality of control lines CTL2 to CTL5, and the plurality of data lines DTL is coupled to the driving section 20. Each of the sub-pixels 11 is coupled to the writing control line CTL1, the control lines CTL2 to CTL5, and the data line DTL.

Figure 2:
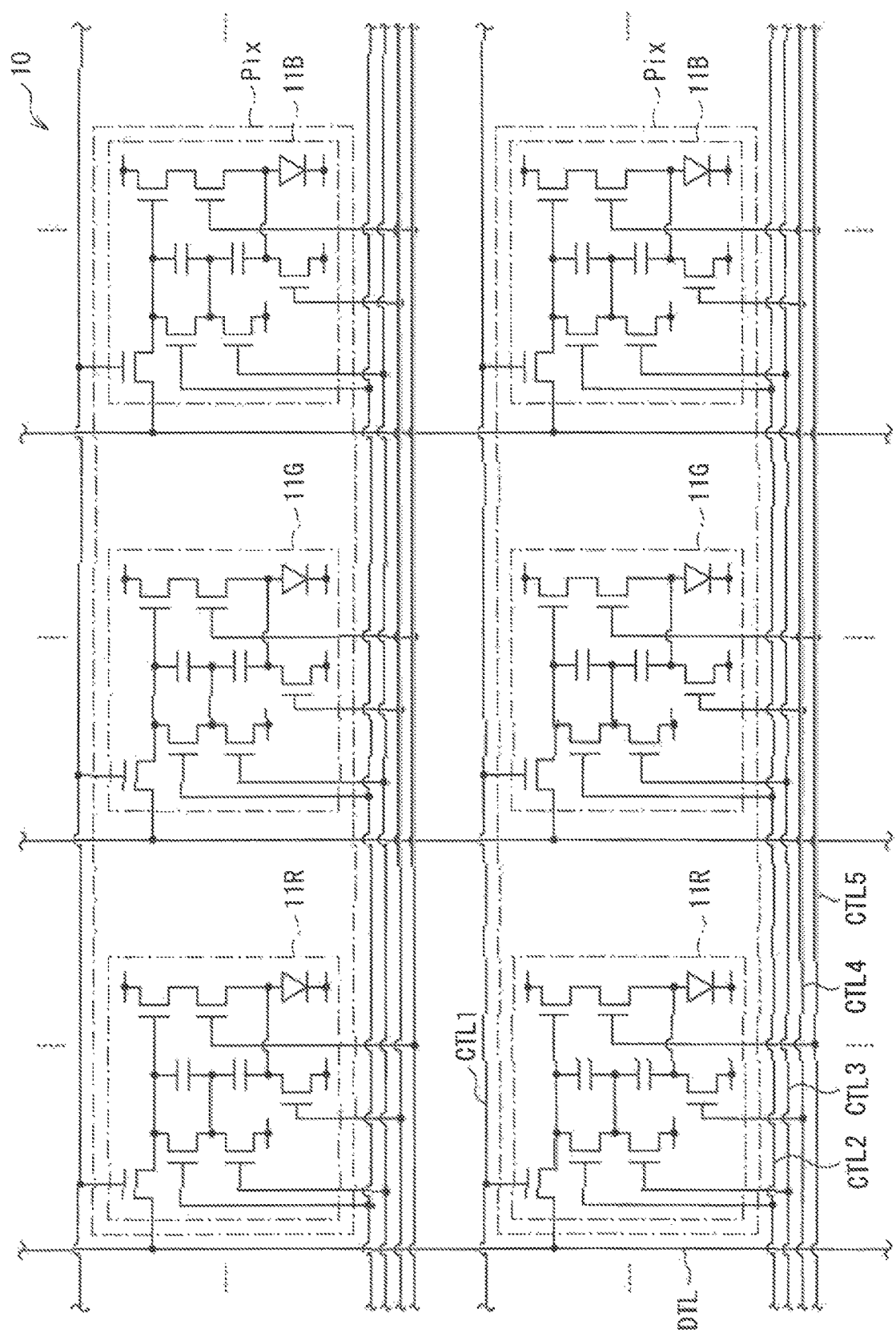
FIG. 2 is a circuit diagram illustrating a configuration example of a display section illustrated in FIG. 1.

FIG. 2 illustrates a configuration example of the display section 10. In the display section 10, the sub-pixels 11 of red (R), green (G), and blue (B) (11R, 11G, and 11B) configure a single pixel Pix.

As illustrated in FIG. 1, the sub-pixel 11 includes a write transistor Tr1, a drive transistor Tr6, control transistors Tr2 to Tr5, capacitors Cs1 and Cs2, and a light-emitting device 19. In other words, in this example, the sub-pixel 11 has a so-called "6Tr2C" configuration where the sub-pixel 11 is configured using six transistors and two capacitors.

Each of the write transistor Tr1, the drive transistor Tr6, and the control transistors Tr2 to Tr5 may be configured by, for example, an N-channel metal oxide semiconductor (MOS) thin-film transistor (TFT). A gate of the write transistor Tr1 is coupled to the writing control line CTL1; a source thereof is coupled to the data line DTL; and a drain thereof is coupled to a gate of the drive transistor Tr6, a drain of the control transistor Tr2, and a first end of the capacitor Cs2. The gate of the drive transistor Tr6 is coupled to the drain of the write transistor Tr1, the drain of the control transistor Tr2, and the first end of the capacitor Cs2; a drain thereof is supplied with a supply voltage Vccp by the driving section 20; and a source thereof is coupled to a drain of the control transistor Tr5. A gate of the control transistor Tr2 is coupled to the control line CTL2; a drain thereof is coupled to the drain of the write transistor Tr1, the gate of the drive transistor Tr6, and the first end of the capacitor Cs2; a source thereof is coupled to a drain of the control transistor Tr3, a first end of the capacitor Cs1, and a second end of the capacitor Cs2. A gate of the control transistor Tr3 is coupled to the control line CTL3; a drain thereof is coupled to the source of the control transistor Tr2, the first end of the capacitor Cs1, and the second end of the capacitor Cs2; and a source thereof is supplied with a voltage Vofs by the driving section 20. A gate of the control transistor Tr4 is coupled to the control line CTL4; and a drain thereof is coupled to a source of the control transistor Tr5, a second end of the capacitor Cs1, and an anode of the light-emitting device 19. A gate of the control transistor Tr5 is coupled to the control line CTL5; a drain thereof is coupled to the source of the drive transistor Tr6; and a source thereof is coupled to the drain of the control transistor Tr4, the second end of the capacitor Cs1, and the anode of the light-emitting device 19.

It is to be noted that, in this example, the write transistor Tr1 and the control transistors Tr2 to Tr5 may be configured by the N-channel MOS TFTs; however, the configuration is not limited thereto, and one or more of these transistors may be configured by P-channel MOS TFTs alternatively.

The capacitor Cs1 holds a voltage corresponding to a threshold voltage Vth of the drive transistor Tr6, and the first end thereof is coupled to the source of the control transistor Tr2, the drain of the control transistor Tr3, and the second end of the capacitor Cs2, while the second end thereof is coupled to the drain of the control transistor Tr4, the source of the control transistor Tr5, and the anode of the light-emitting device 19. The capacitor Cs2 holds a voltage corresponding to a pixel voltage Vsig (to be hereinafter described), and the first end thereof is coupled to the drain of the write transistor Tr1, the gate of the control transistor Tr6, and the drain of the control transistor Tr2, while the second end thereof is coupled to the source of the control transistor Tr2, the drain of the control transistor Tr3, and the first end of the capacitor Cs1. The light-emitting device 19 is, in this example, an organic EL device that emits light of color (red, green, and blue) corresponding to each of the sub-pixels 11, and the anode thereof is coupled to the drain of the control transistor Tr4, the source of the control transistor Tr5, and the second end of the capacitor Cs1, while a cathode thereof is supplied with a voltage Vcath by the driving section 20. It is to be noted that, in this example, the light-emitting device 19 is configured using an organic EL device; however, the configuration is not limited thereto, and any light-emitting device of a current drive type may be used alternatively.

With such a configuration, in the sub-pixel 11, a voltage corresponding to the threshold voltage Vth of the drive transistor Tr6 is set up in the capacitor Cs1 (Vth correcting operation), and a voltage corresponding to the pixel voltage Vsig is set up in the capacitor Cs2 (writing operation). Then, the drive transistor Tr6 provides a drive current to the light-emitting device 19 via the drive transistor Tr5. This ensures that the light-emitting device 19 emits light at a luminance in accordance with the pixel voltage Vsig.

The driving section 20 drives the display section 10 on the basis of an image signal Spic and a synchronous signal Ssync to be provided externally. As illustrated in FIG. 1, the driving section 20 has an image signal processor 21, a timing generator 22, a writing control line driving section 23, control line driving sections 24 to 27, and a data line driving section 29.

The image signal processor 21 performs a predetermined signal processing operation for the image signal Spic to be provided externally, and generates an image signal Spic2.

Examples of the predetermined signal processing operation may include gamma correction and overdrive correction.

The timing generator 22 provides a control signal to each of the writing control line driving section 23, the control line driving sections 24 to 27, and the data line driving section 29 on the basis of the synchronous signal Ssync to be provided externally, and controls these line driving sections to operate in synchronization with one another.

The writing control line driving section 23 selects the sub-pixels 11 sequentially on each row basis by applying writing control signals G1 sequentially to the plurality of writing control lines CTL1 in accordance with the control signal provided from the timing generator 22.

The control line driving section 24 controls operation of the sub-pixels 11 on each row basis by applying control signals G2 sequentially to the plurality of control lines CTL2 in accordance with the control signal provided from the timing generator 22. Similarly, the control line driving section 25 controls operation of the sub-pixels 11 on each row basis by applying control signals G3 sequentially to the plurality of control lines CTL3 in accordance with the control signal provided from the timing generator 22. The control line driving section 26 controls operation of the sub-pixels 11 on each row basis by applying control signals G4 sequentially to the plurality of control lines CTL4 in accordance with the control signal provided from the timing generator 22. The control line driving section 27 controls operation of the sub-pixels 11 on each row basis by applying control signals G5 sequentially to the plurality of control lines CTL5 in accordance with the control signal provided from the timing generator 22.

The data line driving section 29 generates a data signal Sig including the pixel voltage Vsig indicating the emission luminance of each of the sub-pixels 11 in accordance with the image signal Spic2 provided from the image signal processor 21 and the control signal provided from the timing generator 22. Subsequently, the data line driving section 29 applies the data signal Sig to each of the data lines DTL.

With such a configuration, as described later, the driving section 20 performs initialization for the sub-pixels 11, and carries out Vth correction to reduce the influence of element variations in the drive transistor Tr6 on the image quality, and thereafter performs writing of the pixel voltage Vsig.

Here, the sub-pixel 11 corresponds to a specific but not limitative example of a "unit pixel" in one embodiment of the disclosure. The capacitor Cs1 and the capacitor Cs2 correspond to specific but not limitative examples of a "first capacitor" and a "second capacitor", respectively in one embodiment of the disclosure. The control transistor Tr3, the control transistor Tr5, the control transistor Tr4, and the control transistor Tr2 correspond to specific but not limitative examples of a "first transistor", a "second transistor", a "third transistor", and a "fourth transistor", respectively in one embodiment of the disclosure. The voltage Vofs and the voltage Vini correspond to specific but not limitative examples of a "first voltage" and a "second voltage", respectively in one embodiment of the disclosure.

[Operation and Function]

Subsequently, the description will be provided on operation and function of the display unit 1 according to the first embodiment of the disclosure.

(Overview of Overall Operation)

First, an overview of overall operation of the display unit 1 is described with reference to FIG. 1. The driving section 20 drives the display section 10 on the basis of the image signal Spic and the synchronous signal Ssync to be provided externally. More specifically, the image signal processor 21 performs a predetermined signal processing operation for the image signal Spic to be provided externally, and generates the image signal Spic2. The timing generator 22 provides a control signal to each of the writing control line driving section 23, the control line driving sections 24 to 27, and the data line driving section 29 on the basis of the synchronous signal Ssync to be provided externally, and controls these line driving sections to operate in synchronization with one another. The writing control line driving section 23 selects the sub-pixels 11 sequentially on each row basis by applying the writing control signals G1 sequentially to the plurality of writing control lines CTL1 in accordance with the control signal provided from the timing generator 22. The control line driving section 24 controls operation of the sub-pixels 11 on each row basis by applying the control signals G2 sequentially to the plurality of control lines CTL2 in accordance with the control signal provided from the timing generator 22. The control line driving section 25 controls operation of the sub-pixels 11 on each row basis by applying the control signals G3 sequentially to the plurality of control lines CTL3 in accordance with the control signal provided from the timing generator 22. The control line driving section 26 controls operation of the sub-pixels 11 on each row basis by applying the control signals G4 sequentially to the plurality of control lines CTL4 in accordance with the control signal provided from the timing generator 22. The control line driving section 27 controls operation of the sub-pixels 11 on each row basis by applying the control signals G5 sequentially to the plurality of control lines CTL5 in accordance with the control signal provided from the timing generator 22. The data line driving section 29 generates the data signal Sig including the pixel voltage Vsig corresponding to the luminance of each of the sub-pixels 11 in accordance with the image signal Spic2 provided from the image signal processor 21 and the control signal provided from the timing generator 22, and applies the generated data signal Sig to each of the data lines DTL. The display section 10 performs display on the basis of the writing control signal G1, the control signals G2 to G5, and the data signal Sig that are provided from the driving section 20.

(Detailed Operation)

Next, the description will be provided on detailed operation of the display unit 1.

Figure 3:
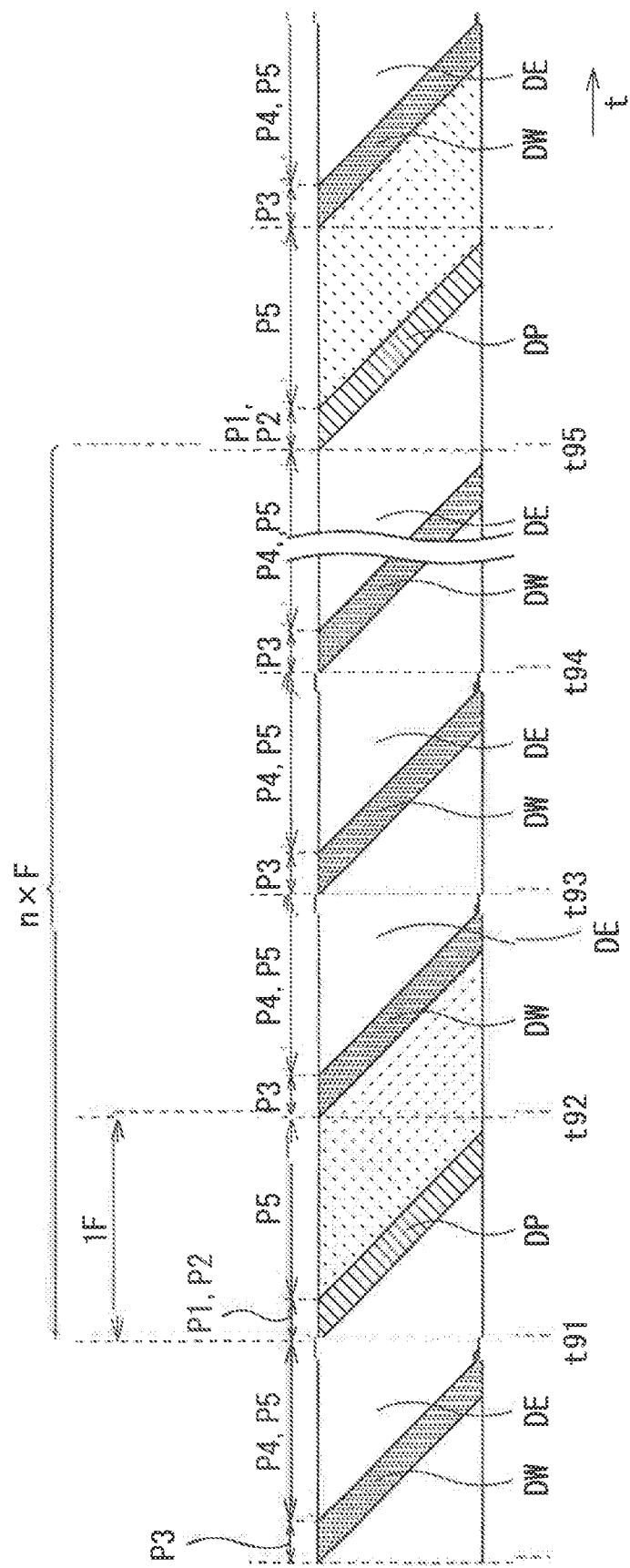
FIG. 3 is a timing chart illustrating an operation example of the display unit illustrated in FIG. 1.

FIG. 3 illustrates scan driving in the display unit 1. In FIG. 3, a vertical scale denotes a column direction (longitudinal direction) of the display section 10, and a horizontal scale denotes time t.

In the display unit 1, the driving section 20 performs write driving DW during each frame period to write the pixel voltage Vsig into each of the sub-pixels 11. At this time, the driving section 20 carries out preparatory driving DP instead of the write driving DW at a rate of once per a plurality of frames ("n" frames) to perform the Vth correction for each of the sub-pixels 11. Hereinafter, this operation is described in detail.

The driving section 20 carries out sequential scanning from an uppermost part toward a lowermost part of the display section 10 during a frame period (1F) starting with timing t91 to perform the preparatory driving DP. Subsequently, upon completion of the preparatory driving DP, the driving section 20 puts each of the sub-pixels 11 in the display section 10 in a non-luminescent state until it performs the sequential scanning during the next frame period.

This ensures that, for example, the sub-pixel 11 at an uppermost part of the display section 10 may be initialized during a predetermined period starting with the timing t91 (initialization period P1 and Vth correction period P2), and thereafter the Vth correction may be performed. As a result, a voltage corresponding to the threshold voltage Vth of the drive transistor Tr6 is set up in the capacitor Cs1 of the sub-pixel 11. Subsequently, this sub-pixel 11 remains in a non-luminescent state until being subjected to the sequential scanning next time (non-luminescent period P5).

Next, the driving section 20 carries out the sequential scanning from an uppermost part toward a lowermost part of the display section 10 during a frame period starting with timing t92 to perform the write driving DW. Subsequently, upon completion of the write driving DW, the driving section 20 carries out the sequential scanning from an uppermost part toward a lowermost part of the display section 10 to perform display driving DE.

This ensures that, for example, the pixel voltage Vsig may be written into the sub-pixel 11 at an uppermost part of the display section 10 during a predetermined period starting with timing t92 (writing period P3). As a result, a voltage corresponding to the pixel voltage Vsig is set up in the capacitor Cs2 of the sub-pixel 11. Subsequently, this sub-pixel 11 emits light over a time of length in accordance with a predetermined luminescent duty ratio at the luminance corresponding to this pixel voltage Vsig until being subjected to the sequential scanning next time (luminescent period P4 and non-luminescent period P5).

From then on, during a period until timing t95, the display unit 1 repeats the operation performed during a period of the timing between t92 and t93 (n−1) times.

As described above, during a period of the timing between t91 and t95, the driving section 20 performs the preparatory driving DP once, and thereafter performs the write driving DW and the display driving DE (n−1) times. From then on, the driving section 20 repeats the operation performed during a period of the timing t91 and t95. In such a manner, the sub-pixel 11 performs the Vth correction periodically at a rate of once per a plurality of frames ("n" frames).

FIG. 4 illustrates a timing chart of the display operation in the display unit 1. This chart represents an operation example of display driving for the single sub-pixel 11 on which attention is focused. In FIG. 4, (A) denotes a waveform of the writing control signal G1; (B) denotes a waveform of the control signal G2; (C) denotes a waveform of the control signal G3; (D) denotes a waveform of the control signal G4; (E) denotes a waveform of the control signal G5; (F) denotes a waveform of the data signal Sig; (G) denotes a waveform of a gate voltage Vg of the drive transistor Tr6; (H) denotes a waveform of a source voltage Vs of the drive transistor Tr6; and (I) denotes a voltage Vm on the first end of the capacitor Cs1 (second end of the capacitor Cs2). In (F) to (I) of FIG. 4, each waveform is illustrated using the same voltage scale. FIGS. 5A to 5G illustrate status of the sub-pixel 11 during various periods.

First, the driving section 20 initializes the sub-pixel 11 during a period of timing between t1 and t2 (initialization period P1). More specifically, to begin with, the control line driving section 25 varies a voltage of the control signal G3 from low level to high level at the timing t1 ((C) of FIG. 4). With this operation, the control transistor Tr3 turns on, and the voltage Vm on the first end of the capacitor Cs1 is set at the voltage Vofs ((I) of FIG. 4). At the same time, the control line driving section 24 varies a voltage of the control signal G2 from low level to high level ((B) of FIG. 4). With this operation, the control transistor Tr2 turns on to discharge the capacitor Cs2, and the gate voltage Vg of the drive transistor Tr6 is set at the voltage Vofs ((G) of FIG. 4). Further, at the same time, the control line driving section 26 varies a voltage of the control signal G4 from low level to high level ((D) of FIG. 4). With this operation, the control transistor Tr4 turns on, and a voltage on the second end of the capacitor Cs1 is set at the voltage Vini. It is to be noted that the voltage Vini is lower than the voltage Vcath in this example, and therefore the light-emitting device 19 keeps an inversely-biased state and remains in a non-luminescent state.

In such a manner, in the sub-pixel 11, a potential difference across both ends of the capacitor Cs1 is set at (Vofs−Vini), and a potential difference across both ends of the capacitor Cs2 is set at 0 V as illustrated in FIG. 5A. The potential difference across both ends of the capacitor Cs1 of (Vofs−Vini) is greater than the threshold voltage Vth of the drive transistor Tr6.

Next, the driving section 20 carries out the Vth correction during a period of timing between t2 and t3 (Vth correction period P2). More specifically, the control line driving section 26 varies a voltage of the control signal G4 from high level to low level at the timing t2 ((D) of FIG. 4). With this operation, the control transistor Tr4 turns off, and feeding of the voltage Vini to the second end of the capacitor Cs1 is stopped. Further, at the same time, the control line driving section 27 varies a voltage of the control signal G5 from low level to high level ((E) of FIG. 4). With this operation, the control transistor Tr5 turns on, and a gate-source voltage Vgs of the drive transistor Tr6 is set at (Vofs−Vini). As a result, a current flows from the drain to the source of the drive transistor Tr6, and a potential difference across both ends of the capacitor Cs1 is reduced. In other words, at the timing t2, the gate-source voltage Vgs of the drive transistor Tr6 is greater than the threshold voltage Vth of the drive transistor Tr6, and therefore a current in accordance with the gate-source voltage Vgs flows from the drain to the source of the drive transistor Tr6. Accordingly, the source voltage Vs of the drive transistor Tr6 increases gradually ((H) of FIG. 4). With an increase in the source voltage Vs, the gate-source voltage Vgs of the drive transistor Tr6 decreases, and therefore the current flowing from the drain to the source of the drive transistor Tr6 also decrease gradually. With such a negative feedback operation, the source voltage Vs of the drive transistor Tr6 converges on a voltage (Vofs−Vth). In other words, at this time, a potential difference across both ends of the capacitor Cs1 becomes equal to the threshold voltage Vth of the drive transistor Tr6 (Vgs=Vth). In such a manner, in the sub-pixel 11, a potential difference across both ends of the capacitor Cs1 is set at the voltage Vth as illustrated in FIG. 5B.

Subsequently, at the timing t3, the control line driving section 24 varies a voltage of the control signal G2 from high level to low level ((B) of FIG. 4), and the control line driving section 27 varies a voltage of the control signal G5 from high level to low level ((E) of FIG. 4). With this operation, the control transistors Tr2 and Tr5 turn off.

Next, the driving section 20 writes the pixel voltage Vsig (Vsig1) into the sub-pixel 11 during a period of timing between t4 and t5 (writing period P3). More specifically, at the timing t4, the data line driving section 29 sets a voltage of the data signal Sig at the pixel voltage Vsig1 ((F) of FIG. 4), and the writing control line driving section 23 varies a voltage of the writing control signal G1 from low level to high level ((A) of FIG. 4). With this operation, the write transistor Tr1 turns on, and a voltage on the first end of the capacitor Cs2 is set at the voltage Vsig1. In such a manner, in the sub-pixel 11, a potential difference across both ends of the capacitor Cs1 is set at (Vsig1−Vofs) while the capacitor Cs1 keeps a potential difference across both ends of (Vth) as illustrated in FIG. 5C.

Next, the driving section 20 makes the sub-pixel 11 luminescent during a period of timing between t5 and t7 (luminescent period P4). More specifically, at the timing t5, the writing control line driving section 23 varies a voltage of the writing control signal G1 from high level to low level ((A) of FIG. 4), and the control line driving section 25 varies a voltage of the control signal G3 from high level to low level ((C) of FIG. 4). With this operation, the write transistor Tr1 and the control transistor Tr3 turn off, and from then on a voltage corresponding to the pixel voltage Vsig1 is held in the capacitor Cs2. At the same time, the control line driving section 27 varies a voltage of the control signal G5 from low level to high level ((E) of FIG. 4). With this operation, the control transistor Tr5 turns on, and the gate-source voltage Vgs of the drive transistor Tr6 is set at (Vsig1−Vofs+Vth). In other words, the gate-source voltage Vgs of the drive transistor Tr6 is set at a sum of a voltage corresponding to the luminance (Vsig1−Vofs) and a threshold voltage (Vth). Then, depending on this gate-source voltage Vgs, a current flows from the drain to the source of the drive transistor Tr6 to increase the source voltage Vs ((H) of FIG. 4), and the gate voltage Vg also increases accordingly ((G) of FIG. 4). Thereafter, when the source voltage Vs of the drive transistor Tr6 becomes greater than (Ve1+Vcath), a sum of a threshold voltage Ve1 of the light-emitting device 19 and the voltage Vcath, a current flows from the anode to the cathode of the light-emitting device 19, leading to light emission of the light-emitting device 19. More specifically, the source voltage Vs rises to the degree corresponding to element variations in the light-emitting device 19, resulting in light emission of the light-emitting device 19. In such a manner, in the sub-pixel 11, the light-emitting device 19 is put in a luminescent state while the capacitor Cs1 keeps a potential difference across both ends of (Vth) and while the capacitor Cs2 keeps a potential difference across both ends of (Vsig1−Vofs) as illustrated in FIG. 5D.

Subsequently, after the elapse of a period of a time length corresponding to a luminescent duty ratio, at the timing t7, the control line driving section 25 varies a voltage of the control signal G3 from low level to high level ((C) of FIG. 4), and the control line driving section 27 varies a voltage of the control signal G5 from high level to low level ((E) of FIG. 4). With this operation, the control transistor Tr3 turns on, and the control transistor Tr5 turns off to stop supply of a current to the light-emitting device 19. Then, the gate voltage Vg and the source voltage Vs of the drive transistor Tr6 drop ((G) and (H) of FIG. 4), resulting in the light-emitting device 19 being put in a non-luminescent state. At this time, in the sub-pixel 11, the light-emitting device 19 is put in a non-luminescent state while the capacitor Cs1 keeps a potential difference across both ends and while the capacitor Cs2 keeps a potential difference across both ends as illustrated in FIG. 5E.

Next, the driving section 20 writes the pixel voltage Vsig (Vsig2) into the sub-pixel 11 during a period of timing between t8 and t9 (writing period P3). More specifically, at the timing t8, the data line driving section 29 sets a voltage of the data signal Sig at the pixel voltage Vsig2 ((F) of FIG. 4), and the writing control line driving section 23 varies a voltage of the writing control signal G1 from low level to high level ((A) of FIG. 4). With this operation, the write transistor Tr1 turns on, and a voltage on the first end of the capacitor Cs2 is set at the voltage Vsig2. In such a manner, in the sub-pixel 11, a potential difference across both ends of the capacitor Cs2 is set at (Vsig2−Vofs) while the capacitor Cs1 keeps a potential difference across both ends of (Vth) as illustrated in FIG. 5F.

Next, the driving section 20 makes the sub-pixel 11 luminescent during a period from the timing t9 on (luminescent period P4). More specifically, at the timing t9, the writing control line driving section 23 varies a voltage of the writing control signal G1 from high level to low level ((A) of FIG. 4), and the control line driving section 25 varies a voltage of the control signal G3 from high level to low level ((C) of FIG. 4). With this operation, the write transistor Tr1 and the control transistor Tr3 turn off, and from then on a voltage corresponding to the pixel voltage Vsig2 is held in the capacitor Cs2. At the same time, the control line driving section 27 varies a voltage of the control signal G5 from low level to high level ((E) of FIG. 4). With this operation, the control transistor Tr5 turns on, and the gate-source voltage Vgs of the drive transistor Tr6 is set at (Vsig2−Vofs+Vth). Then, depending on this gate-source voltage Vgs, a current flows from the drain to the source of the drive transistor Tr6 to increase gate voltage Vg and the source voltage Vs ((G) and (H) of FIG. 4), leading to light emission of the light-emitting device 19. In such a manner, in the sub-pixel 11, the light-emitting device 19 is put in a luminescent state while the capacitor Cs1 keeps a potential difference across both ends of (Vth) and while the capacitor Cs2 keeps a potential difference across both ends of (Vsig2−Vofs) as illustrated in FIG. 5G.

Thereafter, in the display unit 1, after the elapse of a period of a time length corresponding to a luminescent duty ratio, the luminescent period P4 is terminated, and the light-emitting device 19 is put in a non-luminescent state.

As described above, in the display unit 1, two capacitors Cs1 and Cs2 are coupled in series to enable respective voltages to be set independently, thus allowing for reduction of the power consumption. More specifically, in the display unit 1, a potential difference across both ends of the capacitor Cs1 is set at the threshold voltage Vth of the drive transistor Tr6 during the Vth correction period P2, and it is possible to reset only a potential difference across both ends of the capacitor Cs2 during the writing period P3 while keeping the above setting of the capacitor Cs1. This makes it possible to carry out the Vth correction periodically at a rate of once per a plurality of frames, thus allowing for reduction of the power consumption.

In other words, for example, like a display unit mentioned in PTL 1, in a case where the Vth correction is performed each time a pixel voltage is written into a sub-pixel, it is likely that the power consumption will increase. Specifically, in such a case, a data line driving section needs to generate the data signal Sig with predetermined voltages for performing the Vth correction and pixel voltages allocated alternately. That is, in this data signal Sig, the pixel voltages and the predetermined voltages for performing the Vth correction appear in a time-division manner in a single horizontal time frame (1H), leading to an increase in a frequency band of the data signal Sig. Accordingly, it is necessary to enhance a driving capability of the data line driving section for achieving transition of the data signal Sig in less time, and as a result there is a possibility that the power consumption may increase. On the contrary, in the display unit 1 according to the first embodiment, the Vth correction is carried out periodically at a rate of once per a plurality of frames. This ensures that, in the data signal Sig, only either the pixel voltage Vsig or the voltage Vofs appears in a single horizontal time frame (1H), and therefore it is possible to lower frequency band of the data signal Sig. This makes it possible to lower a driving capability of the data line driving section 29, thus allowing for reduction of the power consumption.

It is to be noted that the rate of performing the Vth correction may be determined depending on, for example, a variation in a voltage held in the capacitor Cs1 of the sub-pixel 11 (a voltage corresponding to the threshold voltage Vth). In other words, in the sub-pixel 11, it is likely that a voltage held in the capacitor Cs1 will be varied due to, for example, off-leakage of each transistor, and therefore in such a case the Vth correction may be preferably carried out on a regular basis to reset a potential difference across both ends of the capacitor Cs1. Accordingly, it is desirable to perform the Vth correction at a rate ensuring that a variation in a voltage held in the capacitor Cs1 will have no influence on the image quality. Further, it is possible to reduce off-leakage of each transistor by relaxing a drain-source voltage of each transistor, thus allowing the rate of performing the Vth correction to be lowered. More specifically, any off-leakage of each transistor may be reduced in such a manner that the transistor is configured by a double-gate structure, a triple-gate structure, or a Lightly-Doped Drain (LDD) structure, or a channel width of the transistor is reduced. Especially, by reducing off-leakage of the control transistors Tr2, Tr3, and Tr5 that are directly coupled with the capacitor Cs1, it is possible to lower the rate of performing the Vth correction. Alternatively, a variation in a voltage held in the capacitor Cs1 may be reduced by raising a capacitance value of the capacitor Cs1.

Effects

As described thus far, in the first embodiment, two capacitors are coupled in series to enable respective voltages to be set independently, thus allowing for reduction of the power consumption.

Modification Example 1-1

Figure 6:
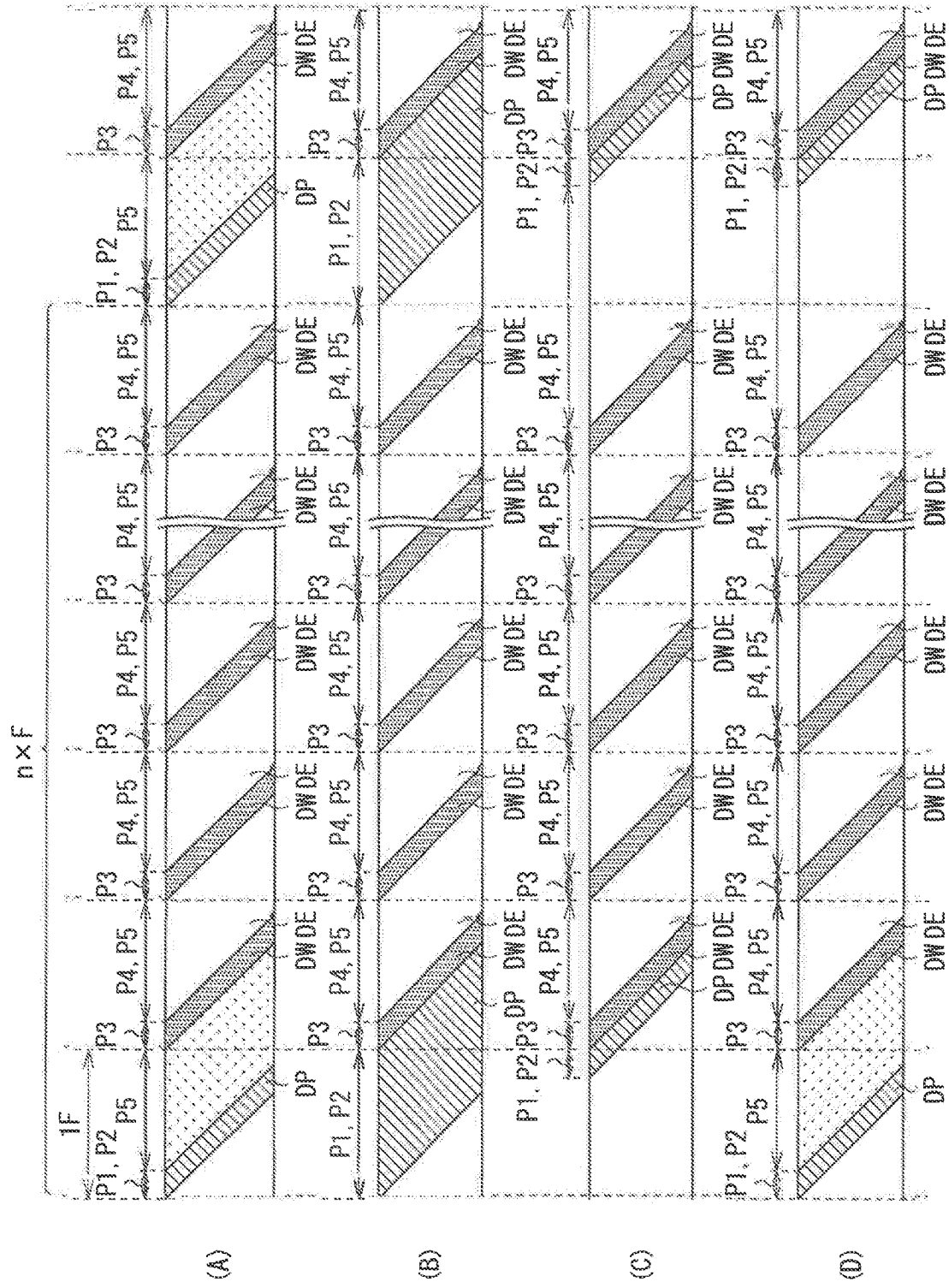
FIG. 6 is a timing chart illustrating an operation example of a display unit according to a modification example.

In the above-described embodiment as illustrated in FIG. 3, each of the sub-pixels 11 is put in a non-luminescent state until starting of the next write driving DW upon completion of the preparatory driving DP; however, operation timing is not limited thereto, and various methods may be achievable. For example, in addition to an example of the above-described first embodiment as illustrated in (A) of FIG. 6, the write driving DW may be carried out immediately after the preparatory driving DP is performed over a single frame period (1F) as illustrated in (B) of FIG. 6. Further, for example as illustrated in (C) of FIG. 6, the preparatory driving DP may be performed only in a short time immediately before the write driving DW. Alternatively as illustrated in (D) of FIG. 6, these examples may be combined. An example of (D) of FIG. 6 combines the example of (A) of FIG. 6 and the example of (C) of FIG. 6. It is to be noted that a combination method is not limited to those combinations, and a variety of combinations may be achieved.

Modification Example 1-2

In the above-described embodiment, the control transistor Tr5 is provided between the drive transistor Tr6 and the light-emitting device 19; however, a configuration is not limited thereto. Hereinafter, the modification example 1-2 is described in detail.

Figure 7:
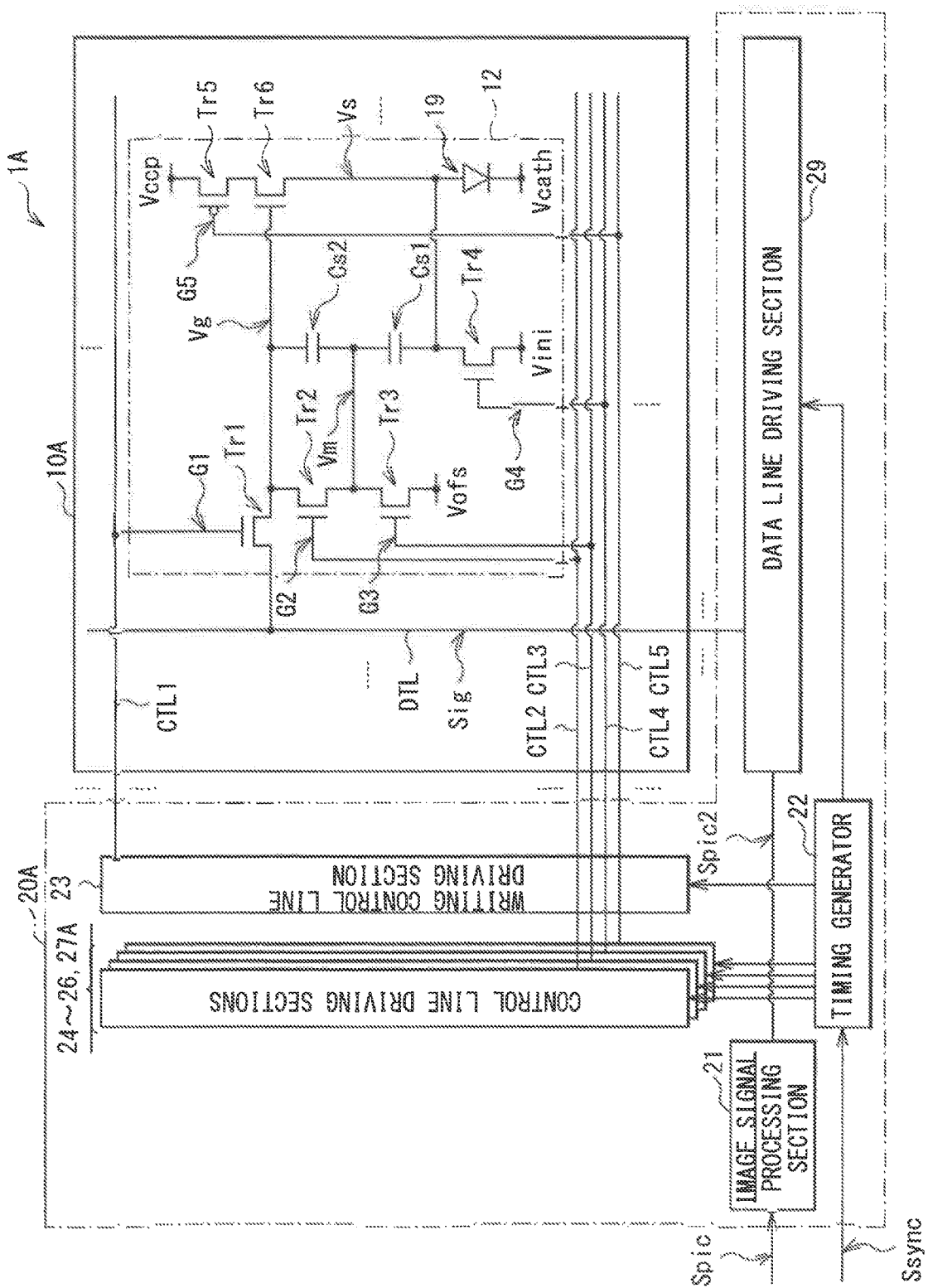
FIG. 7 is a circuit diagram illustrating a configuration example of a display unit according to a modification example.

FIG. 7 illustrates a configuration example of a display unit 1A according to a modification example 1-2. The display unit 1A includes a display section 10A and a driving section 20A. The display section 10A has a sub-pixel 12. The sub-pixel 12 has a control transistor Tr5A. In this example, the control transistor Tr5A is configured by a P-channel MOS TFT. A gate of the control transistor Tr5A is coupled to the control line CTL5; a source thereof is supplied with a supply voltage Vccp by the driving section 20A; and a drain thereof is coupled to a drain of the drive transistor Tr6. In other words, in the display section 10 according to the above-described embodiment (FIG. 1), the control transistor Tr5 is provided between the drive transistor Tr6 and the light-emitting device 19; however, the control transistor Tr5A is provided on the drain side of the drive transistor Tr6 in the display section 10A according to the present modification example (FIG. 7). The driving section 20A has a control line driving section 27A. The control line driving section 27A controls operation of the sub-pixels 12 on each row basis by applying control signals G5 sequentially to the plurality of control lines CTL5 in accordance with the control signal provided from the timing generator 22.

Here, the control transistor Tr5A corresponds to a specific but not limitative example of a "fifth transistor" in one embodiment of the disclosure.

Figure 8:
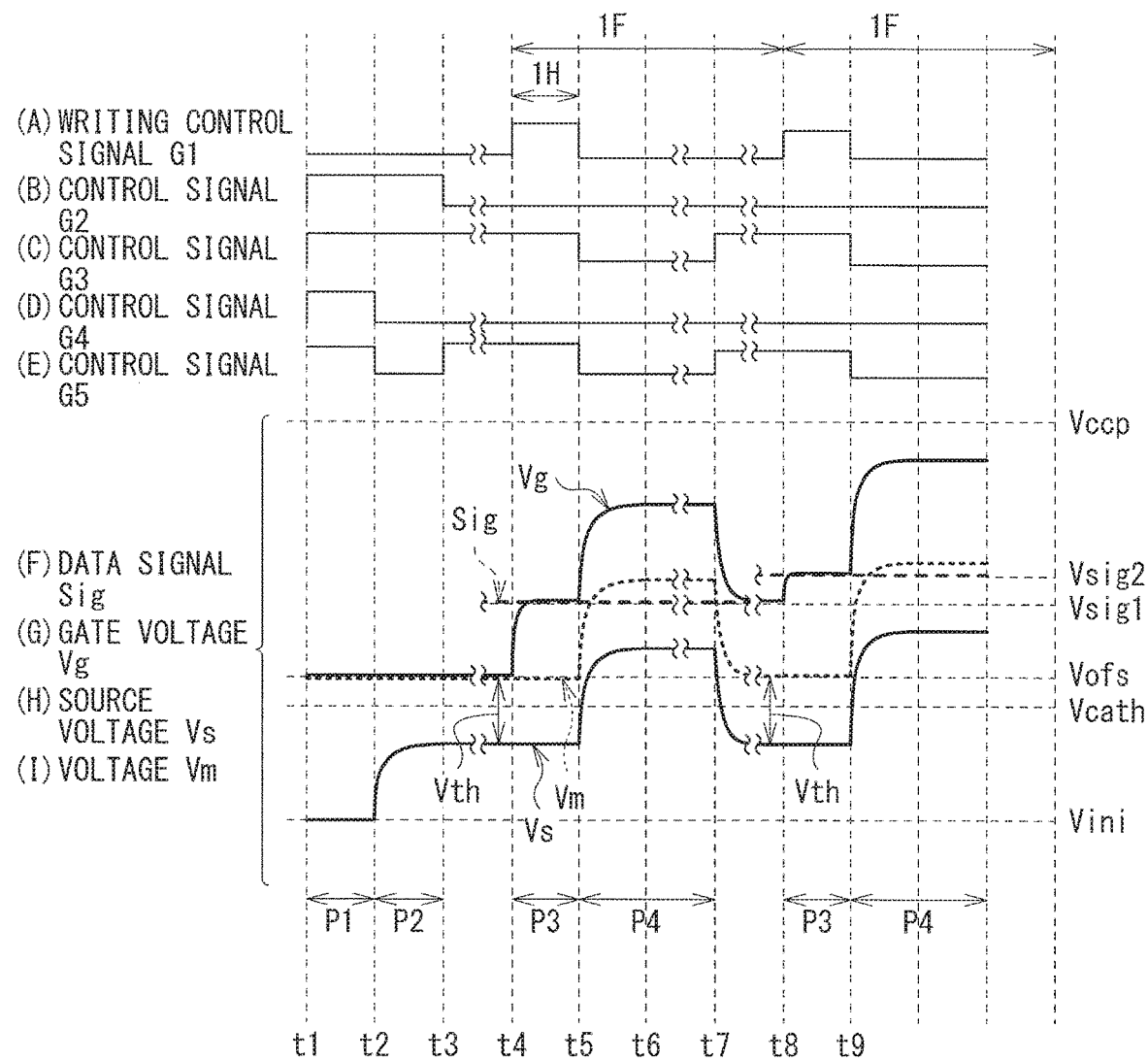
FIG. 8 is a timing waveform chart illustrating an operation example of a sub-pixel illustrated in FIG. 7.

FIG. 8 illustrates a timing chart of the display operation in the display unit 1A. In the display unit 1A, a voltage waveform of the control signal G5 ((E) of FIG. 8) is inverted to that in a case of the display unit 1 according to the above-described embodiment ((E) of FIG. 4). In other words, in the display unit 1 according to the above-described embodiment, the control transistor Tr5 is an N-channel MOS. On the other hand, in the display unit 1A according to the present modification example, the control transistor Tr5A is a P-channel MOS, and therefore the voltage waveform of the control signal G5 is inverted. Any other operation with the exception of such a difference is similar to that in a case of the above-described embodiment. With such a configuration, it is also possible to obtain the effects similar to those achieved by the display unit 1 according to the above-described embodiment.

Modification Example 1-3

In the above-described embodiment, the control transistor Tr4 is provided; however, a configuration is not limited thereto. Hereinafter, the modification example 1-3 is described in detail.

Figure 9:
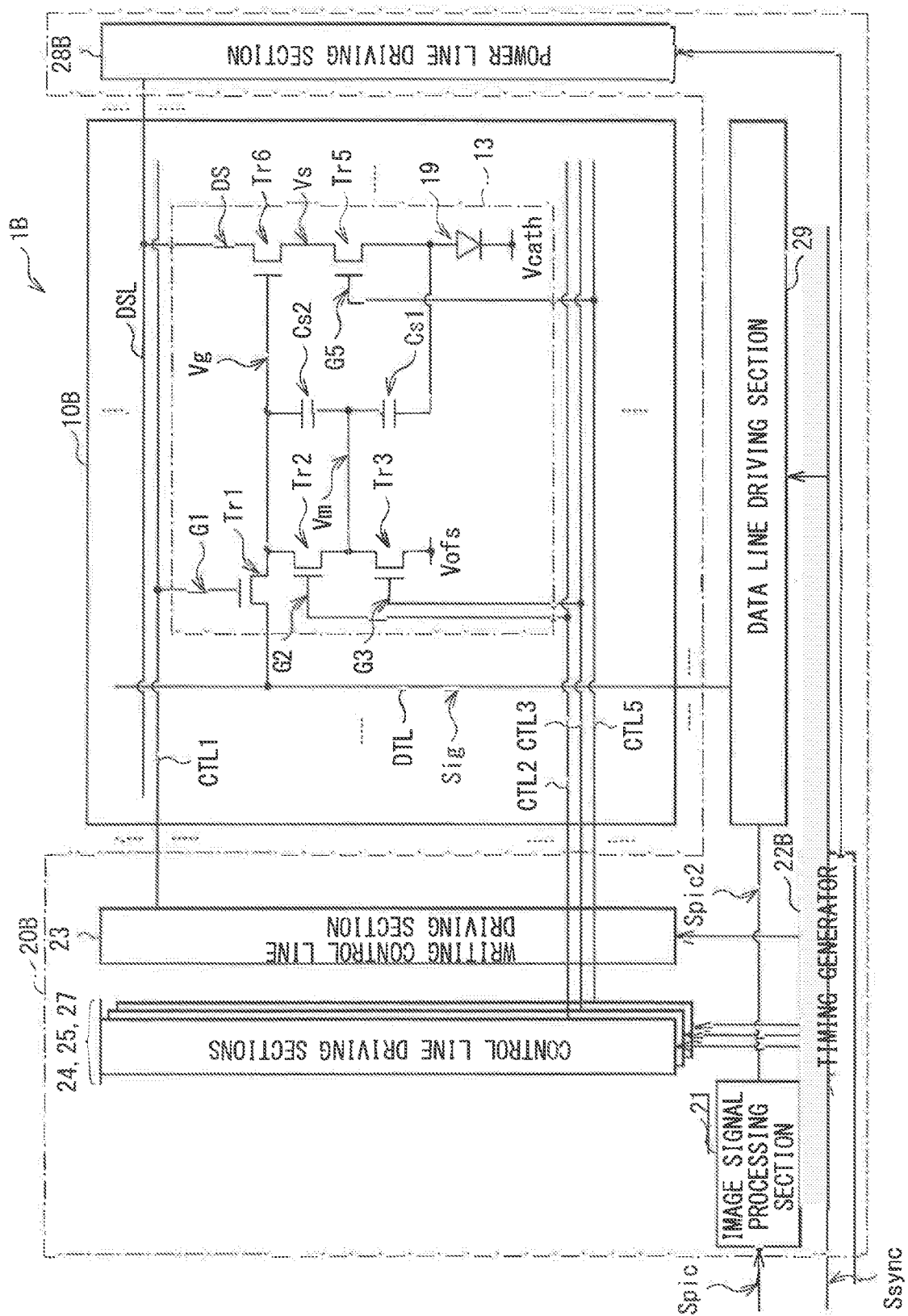
FIG. 9 is a circuit diagram illustrating a configuration example of a display unit according to a modification example.

FIG. 9 illustrates a configuration example of a display unit 1B according to a modification example 1-3. The display unit 1B includes a display section 10B and a driving section 20B. The display section 10B has a sub-pixel 13. The sub-pixel 13 has a write transistor Tr1, a drive transistor Tr6, control transistors Tr2, Tr3, and Tr5, capacitors Cs1 and Cs2, and a light-emitting device 19. In other words, the sub-pixel 13 eliminates the control transistor Tr4 from the sub-pixel 11 according to the above-described embodiment (FIG. 1), and has a so-called "5Tr2C" configuration. Further, the display section 10B has a plurality of power lines DSL extending in a row direction (transverse direction). A drain of the drive transistor Tr6 is coupled to the power line DSL. The driving section 20B has an image signal processor 21, a timing generator 22B, a writing control line driving section 23, control line driving sections 24, 25, and 27, a power line driving section 28B, and a data line driving section 29. The timing generator 22B provides a control signal to each of the writing control line driving section 23, the control line driving sections 24, 25, and 27, the power line driving section 28B, and the data line driving section 29 on the basis of the synchronous signal Ssync to be provided externally, and controls these line driving sections to operate in synchronization with one another. The power line driving section 28B controls operation of the sub-pixels 13 on each row basis by applying power signals DS sequentially to the plurality of power lines DSL in accordance with the control signal provided from the timing generator 22B. The power signal DS makes the transition between the voltage Vini and the voltage Vccp. In other words, the driving section 20B is configured in a manner of eliminating the control line driving section 26, adding the power line driving section 28B, and changing the timing generator 22 to the timing generator 22B in the driving section 20 according to the above-described embodiment (FIG. 1).

Figure 10:
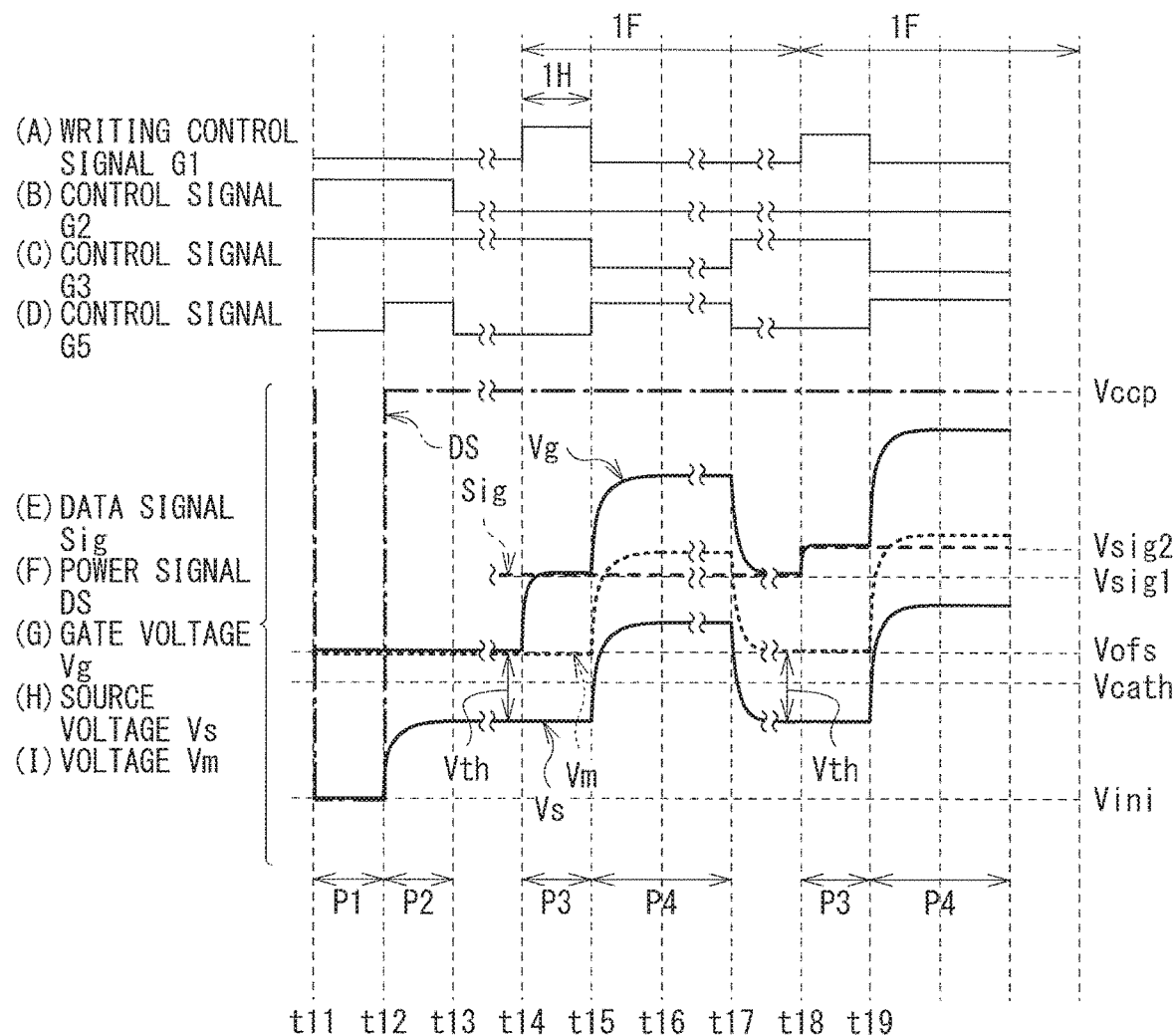
FIG. 10 is a timing waveform chart illustrating an operation example of a sub-pixel illustrated in FIG. 9.

FIG. 10 illustrates a timing chart of the display operation in the display unit 1B. (A) denotes a waveform of the writing control signal G1; (B) denotes a waveform of the control signal G2; (C) denotes a waveform of the control signal G3; (D) denotes a waveform of the control signal G5; (E) denotes a waveform of the data signal Sig; (F) denotes a waveform of the power signal DS; (G) denotes a waveform of a gate voltage Vg of the drive transistor Tr6; (H) denotes a waveform of a source voltage Vs of the drive transistor Tr6; and (I) denotes a voltage Vm.

First, the driving section 20B initializes the sub-pixel 13 during a period of timing between t11 and t12 (initialization period P1). More specifically, at the timing t11, the control line driving section 24 varies a voltage of the control signal G2 from low level to high level ((B) of FIG. 10), and the control line driving section 25 varies a voltage of the control signal G3 from low level to high level ((C) of FIG. 10). With this operation, as with the case of the above-described embodiment (FIG. 4), the voltage Vm on the first end of the capacitor Cs1 is set at the voltage Vofs, and the gate voltage Vg of the drive transistor Tr6 is set at the voltage Vofs ((I) and (G) of FIG. 10). At the same time, the power line driving section 28B changes a voltage of the power signal DS to the voltage Vini ((F) of FIG. 10). With this operation, the drive transistor Tr6 and the control transistor Tr5 turn on, and a voltage on the second end of the capacitor Cs1 is set at the voltage Vini.

Next, the driving section 20B carries out the Vth correction during a period of timing between t12 and t13 (Vth correction period P2). More specifically, the power line driving section 28B changes a voltage of the power signal DS to the voltage Vccp at the timing t12 ((F) of FIG. 10). With this operation, the drive transistor Tr6 and the control transistor Tr5 turn off, and feeding of the voltage Vini to the second end of the capacitor Cs1 is stopped. Further, at the same time, the control line driving section 27 varies a voltage of the control signal G5 from low level to high level ((D) of FIG. 10). As a result, as with the case of the above-described embodiment, the Vth correction is carried out.

The operation from this timing period on is similar to that in a case of the display unit 1 according to the above-described embodiment (FIG. 4).

With such a configuration, it is also possible to obtain the effects similar to those achieved by the display unit 1 according to the above-described embodiment. Further, the display unit 1B allows the number of transistors to be reduced in each of the sub-pixels 13, and therefore, for example, it is possible to enhance degrees of freedom in layout of the sub-pixel 13, or to increase the pixel density by reducing the area of the sub-pixel 13.

Modification Example 1-4

In the above-described embodiment, the control transistor Tr2 is provided; however, a configuration is not limited thereto. Hereinafter, the modification example 1-4 is described in detail.

Figure 11:
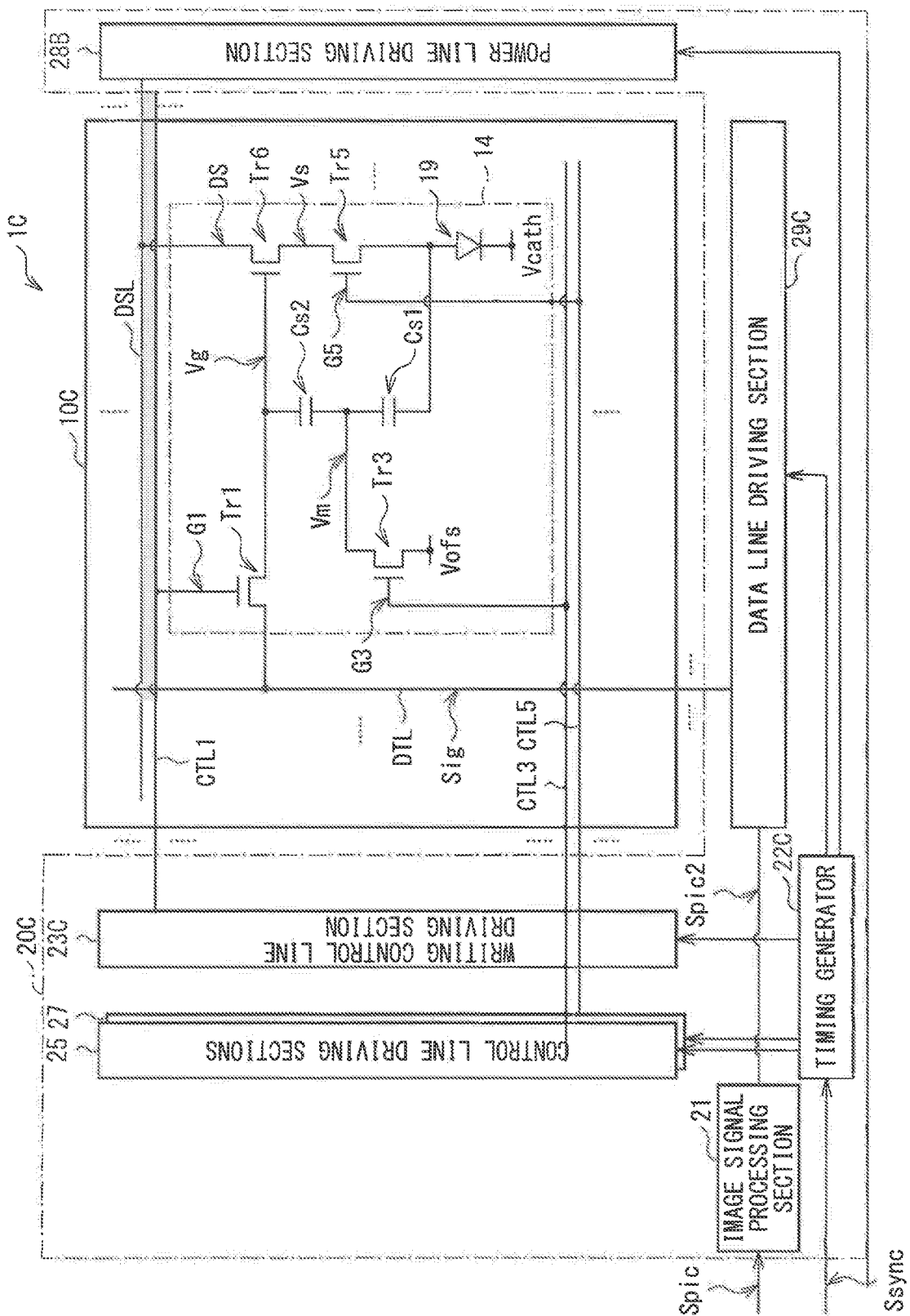
FIG. 11 is a circuit diagram illustrating a configuration example of a display unit according to a modification example.

FIG. 11 illustrates a configuration example of a display unit 1C according to a modification example 1-4. The display unit 1C is configured in such a manner that the present modification example is applied to the display unit 1B according to the above-described modification example 1-3 (FIG. 9). The display unit 1C includes a display section 10C and a driving section 20C. The display section 10C has a sub-pixel 14. The sub-pixel 14 has a write transistor Tr1, a drive transistor Tr6, control transistors Tr3 and Tr5, capacitors Cs1 and Cs2, and a light-emitting device 19. In other words, the sub-pixel 14 eliminates the control transistor Tr2 from the sub-pixel 13 according to the above-described modification example 1-3 (FIG. 9), and has a so-called "4Tr2C" configuration. The driving section 20C has an image signal processor 21, a timing generator 22C, a writing control line driving section 23C, control line driving sections 25 and 27, a power line driving section 28B, and a data line driving section 29C. The timing generator 22C provides a control signal to each of the writing control line driving section 23C, the control line driving sections 25 and 27, the power line driving section 28B, and the data line driving section 29C on the basis of the synchronous signal Ssync to be provided externally, and controls these line driving sections to operate in synchronization with one another. The writing control line driving section 23C selects the sub-pixels 14 sequentially on each row basis by applying writing control signals G1 sequentially to the plurality of writing control lines CTL1 in accordance with the control signal provided from the timing generator 22C. The data line driving section 29C generates the data signal Sig including the pixel voltage Vsig and the voltage Vofs in accordance with the image signal Spic2 provided from the image signal processor 21 and the control signal provided from the timing generator 22C, and applies the data signal Sig to each of the data lines DTL. In other words, the driving section 20C is configured in a manner of eliminating the control line driving sections 24, changing the writing control line driving section 23 to the writing control line driving section 23C, changing the data line driving section 29 to the data line driving section 29C, and changing the timing generator 22B to the timing generator 22C in the driving section 20B according to the above-described modification example 1-3 (FIG. 9).

Figure 12:
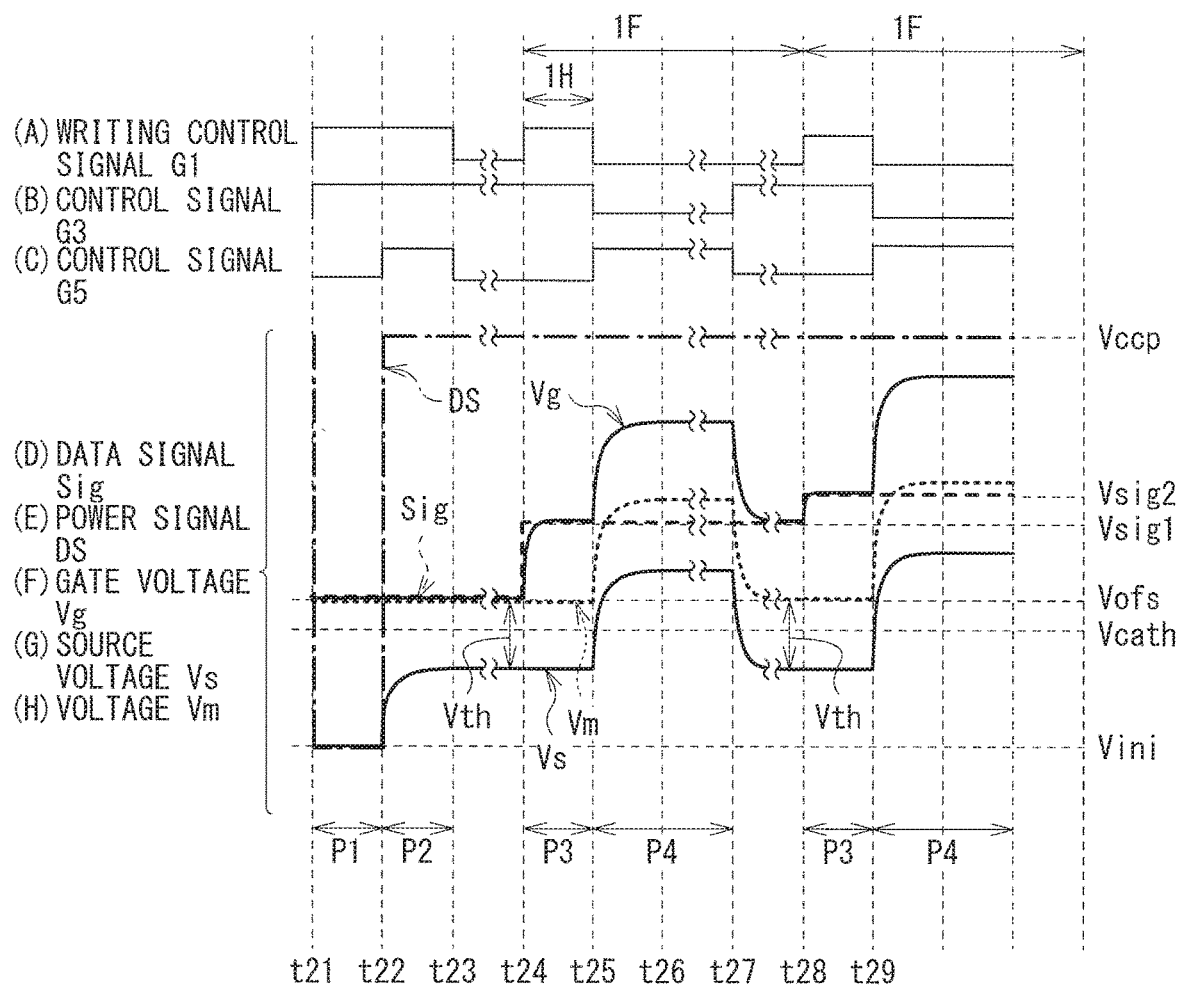
FIG. 12 is a timing waveform chart illustrating an operation example of a sub-pixel illustrated in FIG. 11.

FIG. 12 illustrates a timing chart of the display operation in the display unit 1C. (A) denotes a waveform of the writing control signal G1; (B) denotes a waveform of the control signal G3; (C) denotes a waveform of the control signal G5; (D) denotes a waveform of the data signal Sig; (E) denotes a waveform of the power signal DS; (F) denotes a waveform of a gate voltage Vg of the drive transistor Tr6; (G) denotes a waveform of a source voltage Vs of the drive transistor Tr6; and (H) denotes a voltage Vm.

First, the driving section 20C initializes the sub-pixel 14 during a period of timing between t21 and t22 (initialization period P1). More specifically, at the timing t21, the data line driving section 29C sets a voltage of the data line DTL at the voltage Vofs ((D) of FIG. 12), and the writing control line driving section 23C varies a voltage of the writing control signal G1 from low level to high level ((A) of FIG. 12). With this operation, the write transistor Tr1 turns on, and the gate voltage Vg of the drive transistor Tr6 is set at the voltage Vofs ((F) of FIG. 12). At the same time, the control line driving section 25 varies a voltage of the control signal G3 from low level to high level ((B) of FIG. 12), and the power line driving section 28B changes a voltage of the power signal DS to the voltage Vini ((E) of FIG. 12). As a result, the sub-pixel 14 is initialized as with the case of the above-described modification example 1-3.

Next, the driving section 20C carries out the Vth correction during a period of timing between t22 and t23 (Vth correction period P2) as with the case of the above-described modification example 1-3.

Subsequently, at the timing t23, the writing control line driving section 23C varies a voltage of the writing control signal G1 from high level to low level ((A) of FIG. 12), and the control line driving section 27 varies a voltage of the control signal G5 from high level to low level ((C) of FIG. 12). With this operation, the write transistor Tr1 turns off to stop feeding of the voltage Vofs to the gate of the drive transistor Tr6, and the control transistor Tr5 turns off.

The operation from this timing period on is similar to that in a case of the display unit 1B according to the above-described modification example 1-3 (FIG. 10).

Figure 13:
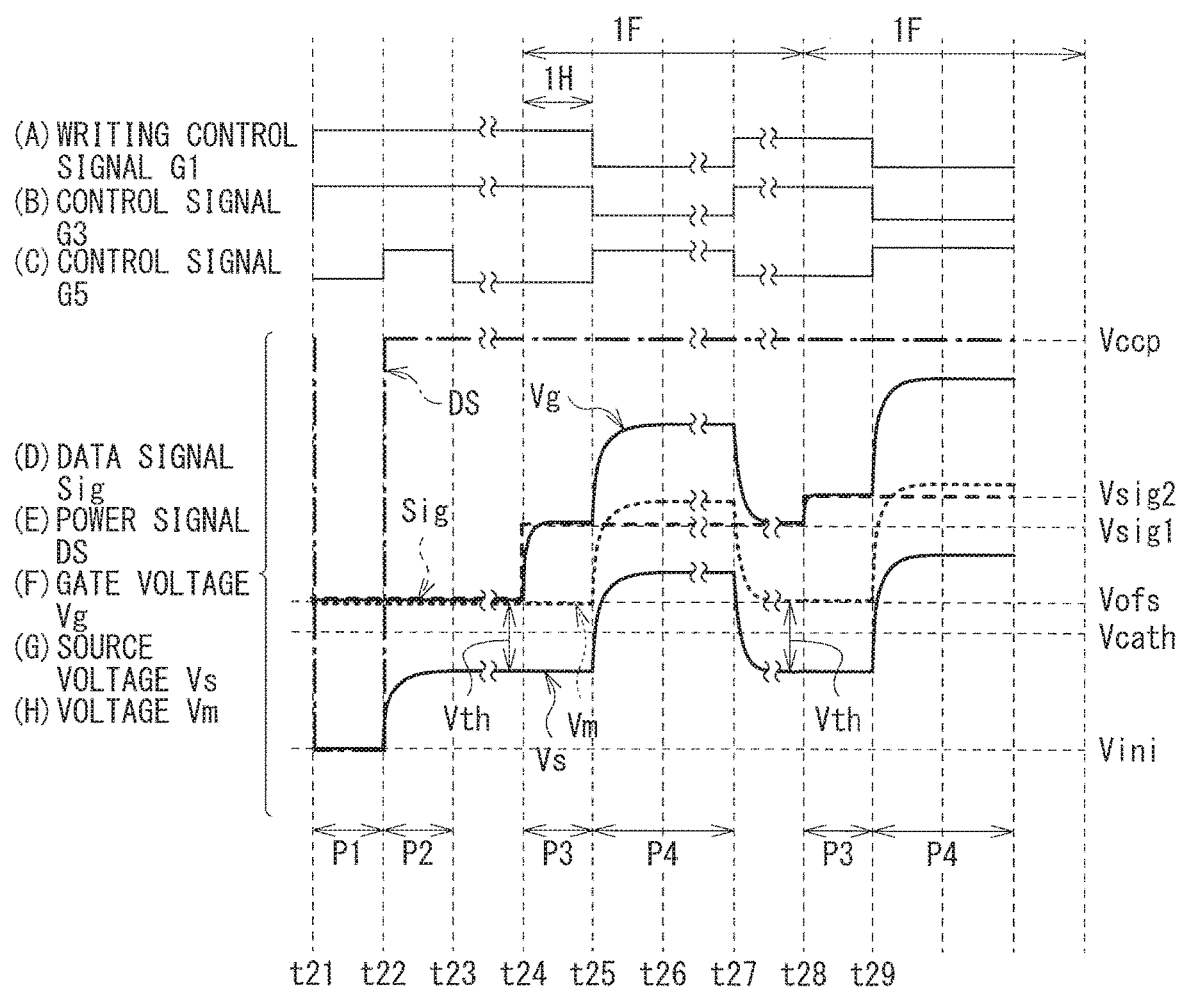
FIG. 13 is a timing waveform chart illustrating another operation example of the sub-pixel illustrated in FIG. 11.

FIG. 13 illustrates a timing chart of another display operation in the display unit 1C. In this example, a voltage of the writing control signal G1 is held at high level during a period of timing between t23 and t24 and during a period of timing between t27 and t28. Hereinafter, this operation is described in detail.

First, the driving section 20C initializes the sub-pixel 14 during a period of timing between t21 and t22 (initialization period P1) as with the case of FIG. 12, and carries out the Vth correction during a period of timing between t22 and t23 (Vth correction period P2) as with the case of FIG. 12.

Next, at the timing t23, the control line driving section 27 varies a voltage of the control signal G5 from high level to low level ((C) of FIG. 13). With this operation, the control transistor Tr5 turns off.

Subsequently, the driving section 20C writes the pixel voltage Vsig (Vsig1) into the sub-pixel 14 during a period of timing between t24 and t25 (writing period P3). More specifically, at the timing t24, the data line driving section 29C sets a voltage of the data signal Sig at the pixel voltage Vsig1 ((C) of FIG. 13). With this operation, a voltage on the first end of the capacitor Cs2 is set at the voltage Vsig1.

Next, the driving section 20C makes the sub-pixel 14 luminescent during a period of timing between t25 and t27 (luminescent period P4) as with the case of FIG. 12.

Then, after the elapse of a period of a time length corresponding to a luminescent duty ratio, at the timing t27, the writing control line driving section 23C varies a voltage of the writing control signal G1 from low level to high level ((A) of FIG. 13); the control line driving section 25 varies a voltage of the control signal G3 from low level to high level ((B) of FIG. 13); and the control line driving section 27 varies a voltage of the control signal G5 from high level to low level ((C) of FIG. 13). With this operation, the write transistor Tr1 and the control transistor Tr3 turn on, and the control transistor Tr5 turns off, resulting in the light-emitting device 19 being put in a non-luminescent state as with the case of FIG. 12.

Next, the driving section 20C writes the pixel voltage Vsig (Vsig2) into the sub-pixel 14 during a period of timing between t28 and t29 (writing period P3). More specifically, at the timing t28, the data line driving section 29C sets a voltage of the data signal Sig at the pixel voltage Vsig2 ((D) of FIG. 13). With this operation, a voltage on the first end of the capacitor Cs2 is set at the voltage Vsig2.

Next, the driving section 20C makes the sub-pixel 14 luminescent during a period from the timing t39 on (luminescent period P4) as with the case of FIG. 12.

Thereafter, in the display unit 1C, after the elapse of a period of a time length corresponding to a luminescent duty ratio, the luminescent period P4 is terminated, and the light-emitting device 19 is put in a non-luminescent state.

With such a configuration, it is also possible to obtain the effects similar to those achieved by the display unit 1 according to the above-described embodiment. Further, the display unit 1C allows the number of transistors to be reduced in each of the sub-pixels 14, and therefore, for example, it is possible to enhance degrees of freedom in layout of the sub-pixel 14, or to increase the pixel density by reducing the area of the sub-pixel 14. Moreover, the display unit 1C allows the number of the control line driving sections to be reduced, thus making it possible to achieve a simple configuration.

Modification Example 1-5

In the above-described embodiment, the gate of the control transistor Tr3 is coupled to the control line CTL3; however, a configuration is not limited thereto. Hereinafter, the modification example 1-5 is described in detail.

Figure 14:
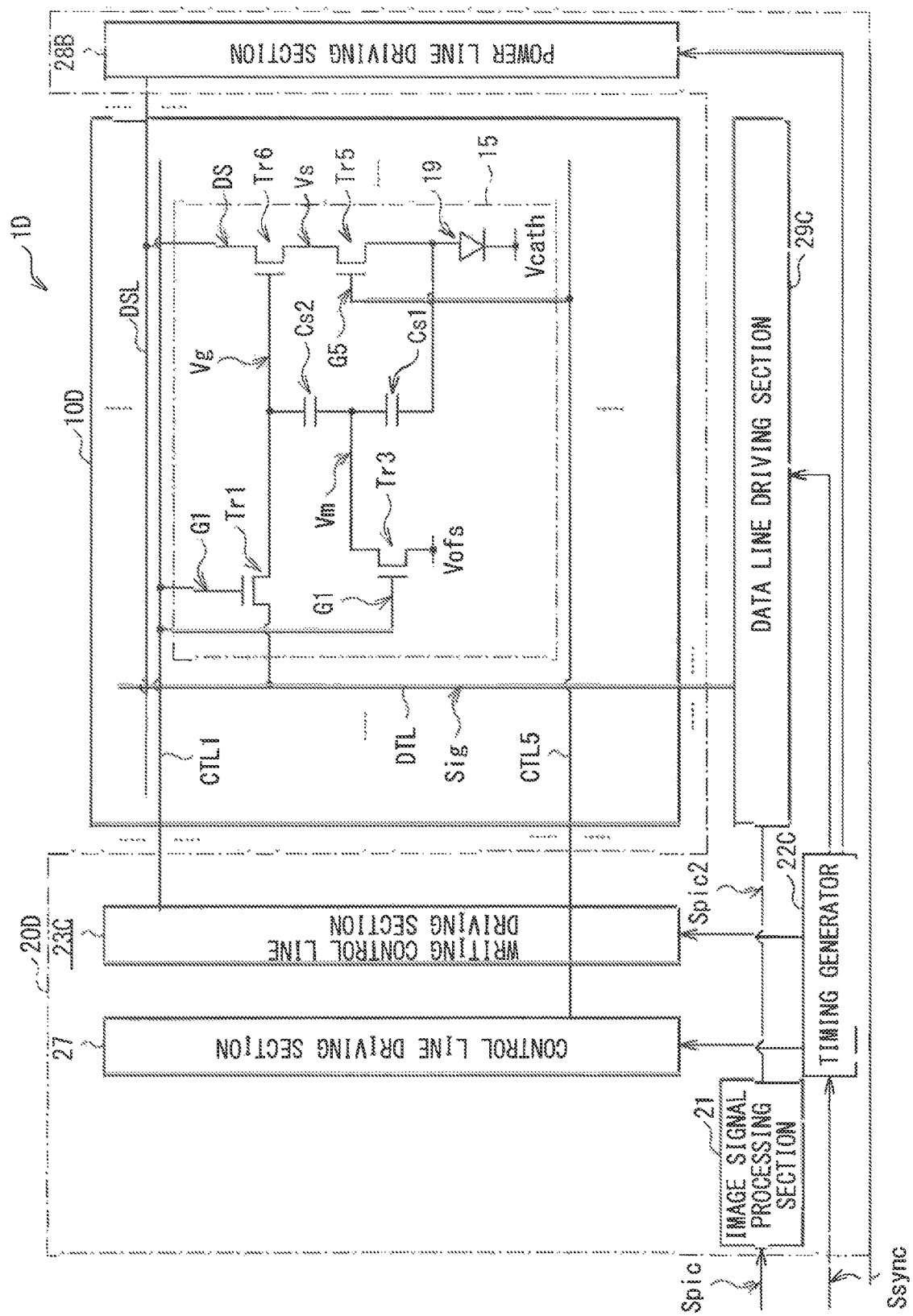
FIG. 14 is a circuit diagram illustrating a configuration example of a display unit according to a modification example.

FIG. 14 illustrates a configuration example of a display unit 1D according to a modification example 1-5. The display unit 1D is configured in such a manner that the present modification example is applied to the display unit 1C according to the above-described modification example 1-4 (FIG. 11). The display unit 1D includes a display section 10D and a driving section 20D.

The display section 10D has a plurality of sub-pixels 15 that are arranged in matrix. Further, the display section 10D has a plurality of writing control lines CTL1 extending in a row direction (transverse direction), a plurality of control lines CTL5 extending in a row direction, and a plurality of data lines DTL extending in a column direction (longitudinal direction). A gate of a control transistor Tr3 of the sub-pixel 15 is coupled to the writing control line CTL1. In other words, in the sub-pixel 14 according to the above-described modification example 1-4 (FIG. 11), a gate of the control transistor Tr3 is coupled to the control line CTL3; however, the gate of the control transistor Tr3 is coupled to the writing control line CTL1 in the sub-pixel 15 according to the present modification example (FIG. 14).

Figure 15:
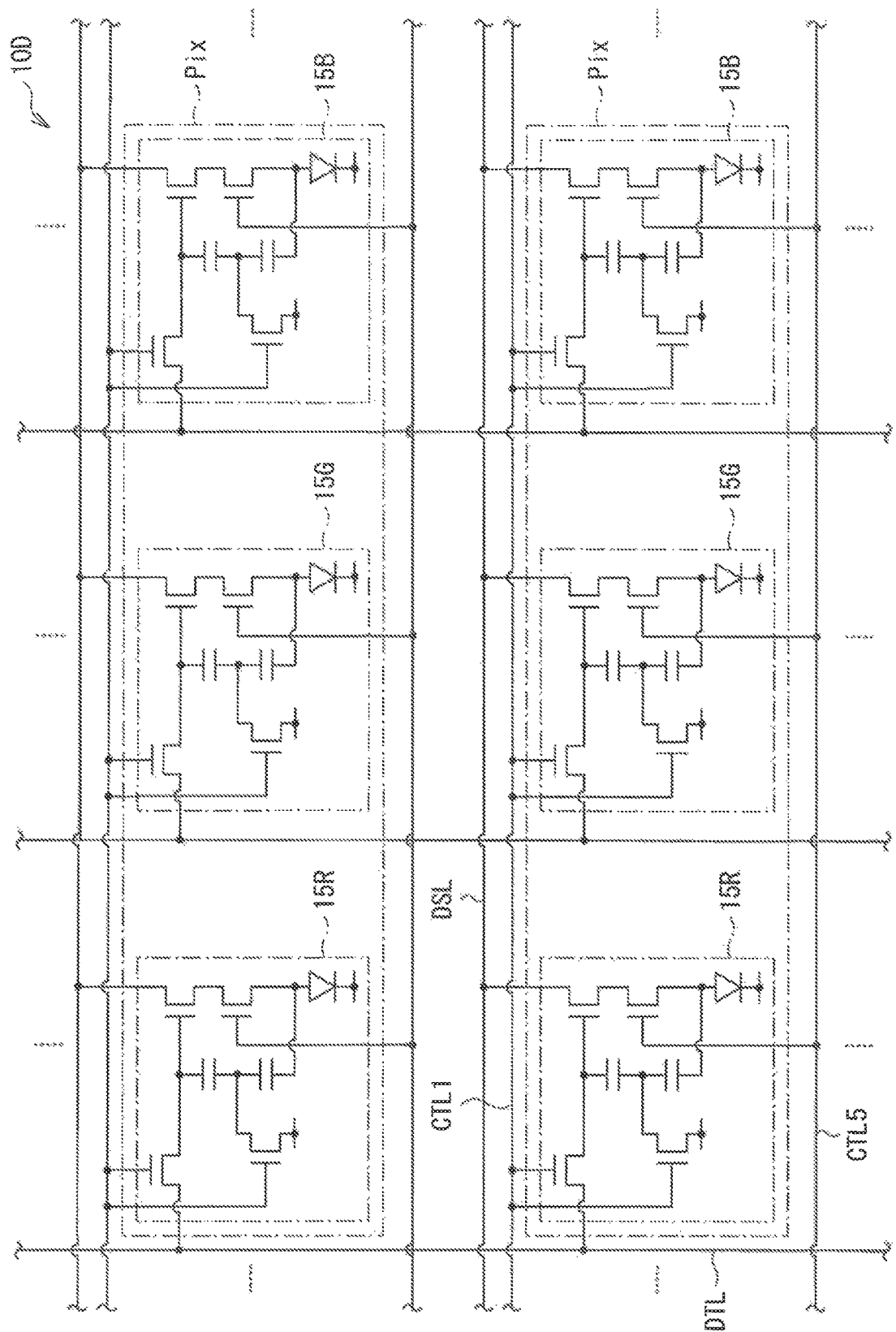
FIG. 15 is a circuit diagram illustrating a configuration example of a display section illustrated in FIG. 14.

FIG. 15 illustrates a configuration example of the display section 10D. In the display section 10D, the sub-pixels 15 of red (R), green (G), and blue (B) (15R, 15G, and 15B) configure a single pixel Pix.

The driving section 20D has an image signal processor 21, a timing generator 22D, a writing control line driving section 23C, a control line driving section 27, a power line driving section 28B, and a data line driving section 29C. The timing generator 22D provides a control signal to each of the writing control line driving section 23C, the control line driving section 27, the power line driving section 28B, and the data line driving section 29C on the basis of the synchronous signal Ssync to be provided externally, and controls these line driving sections to operate in synchronization with one another. In other words, the driving section 20D is configured in a manner of eliminating the control line driving section 25 and changing the timing generator 22C to the timing generator 22D in the driving section 20C according to the above-described modification example 1-4 (FIG. 11).

In other words, in the display unit 1D, the writing control signal G1 is provided to the gate of the control transistor Tr3 with attention focused on a fact that a waveform of the writing control signal G1 ((A) of FIG. 13) and a waveform of the control signal G3 ((B) of FIG. 13) are similar to each other in the display unit 1C according to the above-described modification example 1-4 (FIG. 13).

Figure 16:
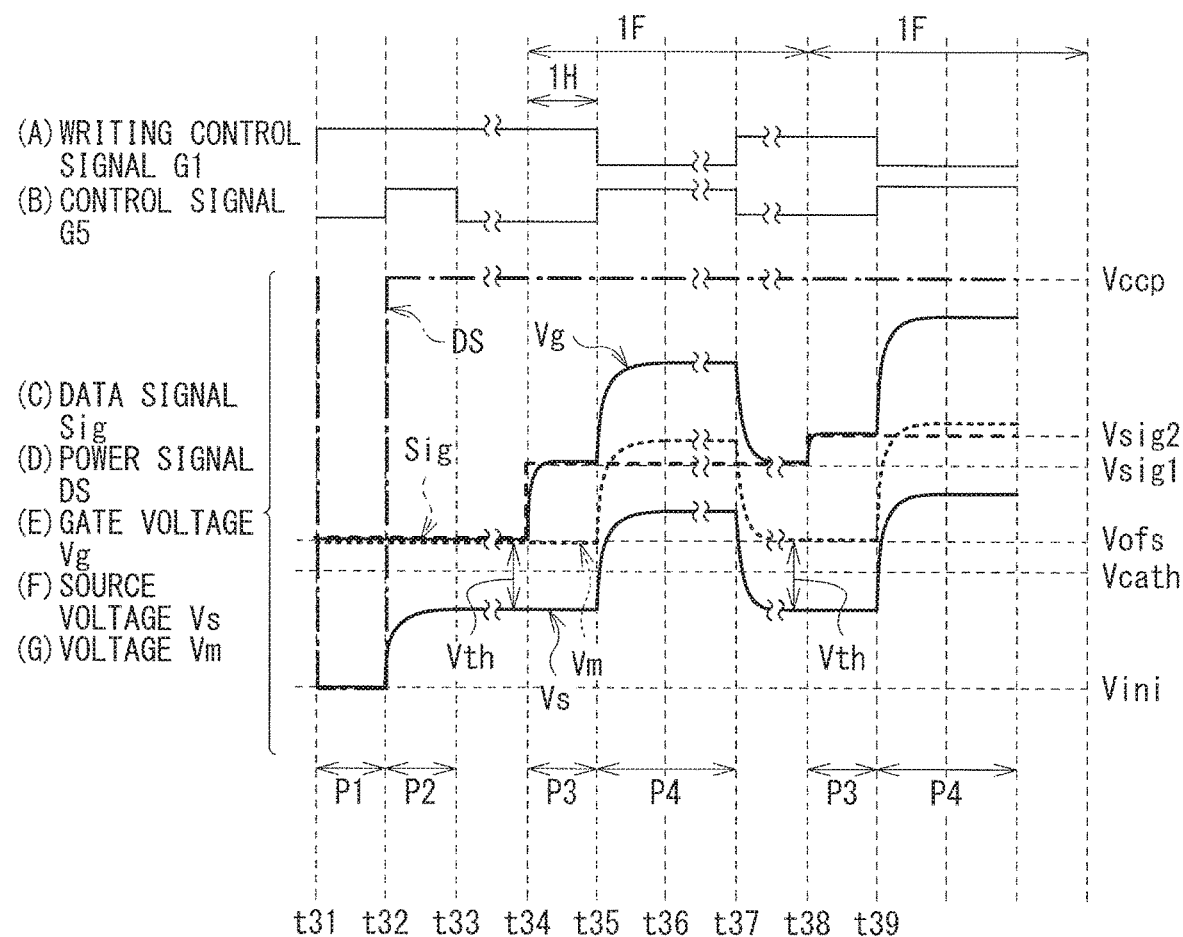
FIG. 16 is a timing waveform chart illustrating an operation example of a sub-pixel illustrated in FIG. 14.

FIG. 16 illustrates a timing chart of the display operation in the display unit 1D. (A) denotes a waveform of the writing control signal G1; (B) denotes a waveform of the control signal G5; (C) denotes a waveform of the data signal Sig; (D) denotes a waveform of the power signal DS; (E) denotes a waveform of a gate voltage Vg of the drive transistor Tr6; (F) denotes a waveform of a source voltage Vs of the drive transistor Tr6; and (G) denotes a voltage Vm. FIG. 16 omits a waveform of the control signal G3 from the timing chart (FIG. 13) of the display unit 1C according to the modification example 1-4. In other words, the display unit 1D performs the operation similar to that of the display unit 1C (FIGS. 11 and 13).

With such a configuration, it is also possible to obtain the effects similar to those achieved by the display unit 1 according to the above-described embodiment. Further, the display unit 1D allows the number of the control line driving sections to be reduced, thus making it possible to achieve a simple configuration.

Modification Example 1-6

Figure 17:
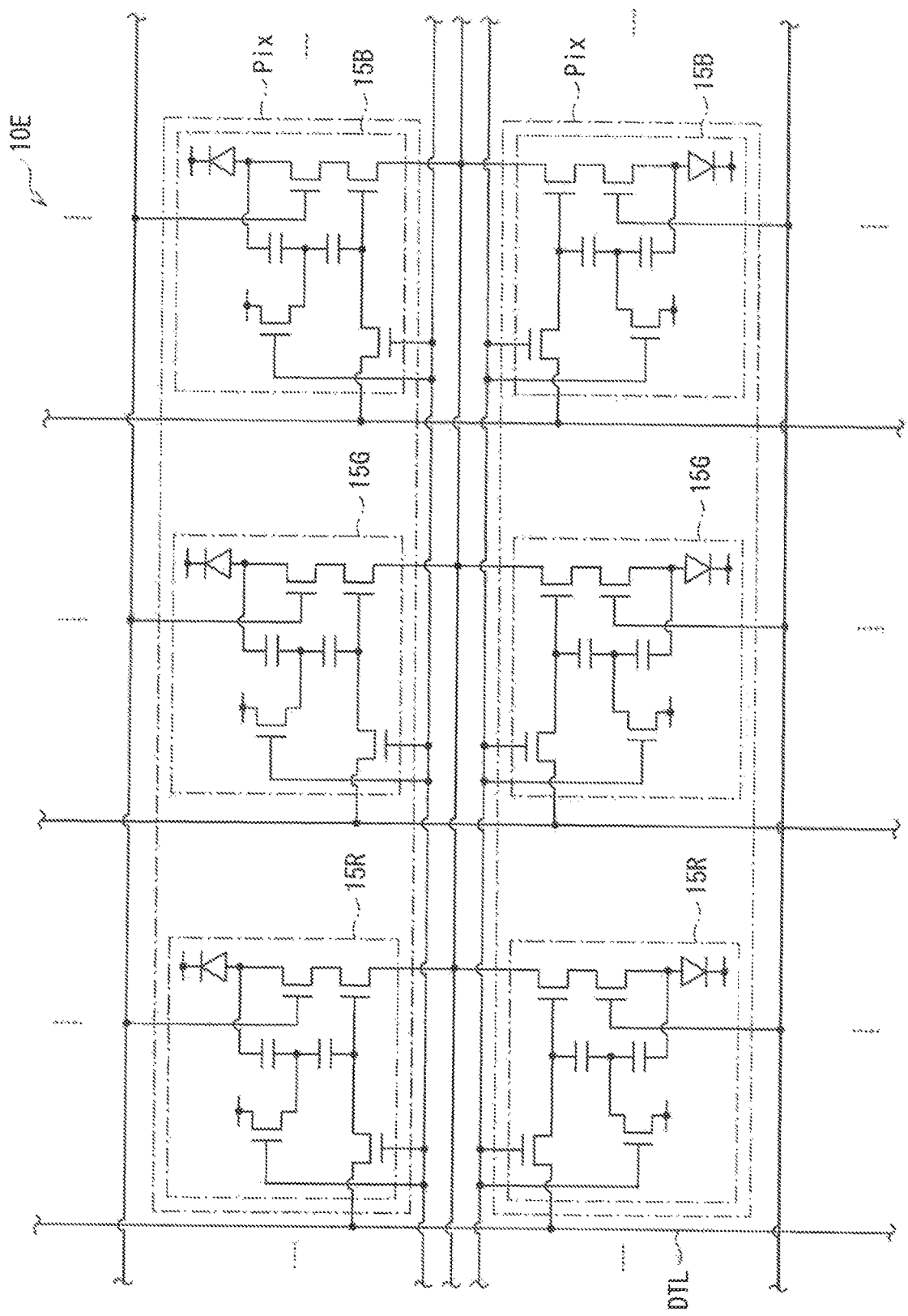
FIG. 17 is a circuit diagram illustrating a configuration example of a display section according to a modification example.

Further, in the display unit 1D according to the modification example 1-5 as illustrated in FIG. 15, two sub-pixels 15 adjacent in a vertical direction (longitudinal direction) are coupled to the power lines DSL different from each other; however, a configuration is not limited thereto, and such sub-pixels 15 may be coupled to the same power line DSL like a display section 10E according to a display unit 1E illustrated in FIG. 17 as an example. In this example, the sub-pixels 15 corresponding to two lines are coupled to the same power line DSL. In such a case, in the sub-pixels 15 corresponding to two lines, initialization and Vth correction are carried out at the same time. In other words, a driving section 20E of this display unit 1E carries out sequential scanning from an uppermost part toward a lowermost part of the display section 10E in a unit of two lines to perform the preparatory driving DP. It is to be noted that a configuration is not limited thereto, and, for example, the sub-pixels 15 corresponding to three lines or more (n lines) may be alternatively coupled to the same power line DSL. In this case, in the sub-pixels 15 corresponding to n lines, initialization and Vth correction are carried out at the same time. In other words, the driving section 20E of the display unit 1E carries out sequential scanning from an uppermost part toward a lowermost part of the display section 10E in a unit of n lines to perform the preparatory driving DP. Further, for example, the sub-pixels 15 corresponding to all the lines may be coupled to the same power line DSL. In such a case, in all of the sub-pixels 15, initialization and Vth correction are carried out at the same time. In other words, the driving section 20E of the display unit 1E performs the preparatory driving DP at the same time for all of the sub-pixels 15 as with a modification example 1-7 to be hereinafter described. These modification examples may be also applicable to, for example, the display unit 1B according to the modification example 1-3 or the display unit 1C according to the modification example 1-4. This allows the number of the power lines DSL to be reduced, thus making it possible to achieve simple operation of the power line driving section 28B.

Modification Example 1-7

In the above-described embodiment as illustrated in FIG. 3, the preparatory driving DP is carried out in such a manner that the driving section 20 performs sequential scanning; however, the operation is not limited thereto, and, for example, the preparatory driving DP may be alternatively carried out at the same time for all of the sub-pixels 15. Hereinafter, a display unit 1F according to a modification example 1-7 is described in detail.

Figure 18:
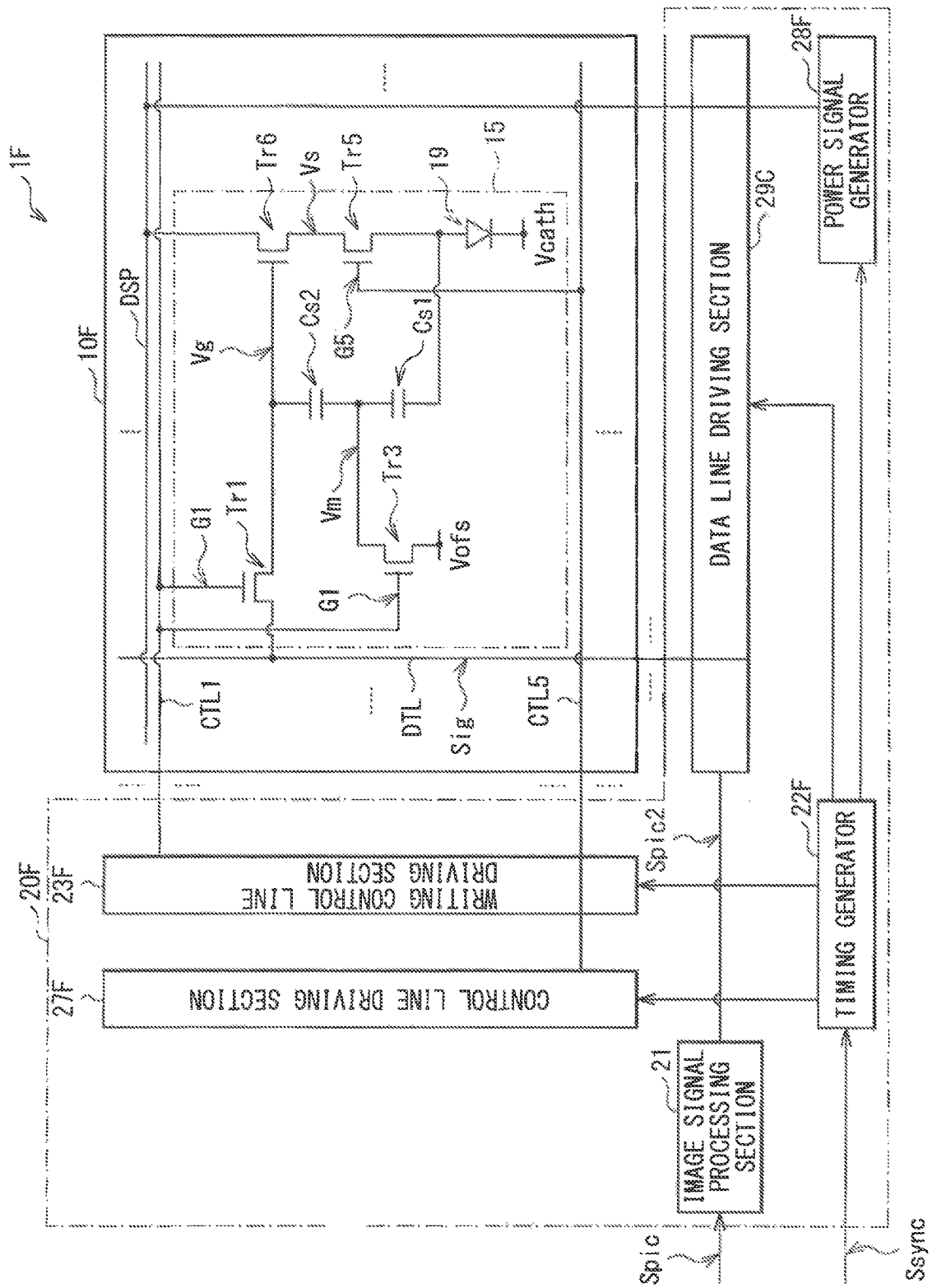
FIG. 18 is a circuit diagram illustrating a configuration example of a display unit according to a modification example.

FIG. 18 illustrates a configuration example of the display unit 1F according to the modification example 1-7. The display unit 1F is configured in such a manner that the present modification example is applied to the display unit 1D according to the above-described modification example 1-5 (FIG. 14). The display unit 1F includes a display section 10F and a driving section 20F.

Figure 19:
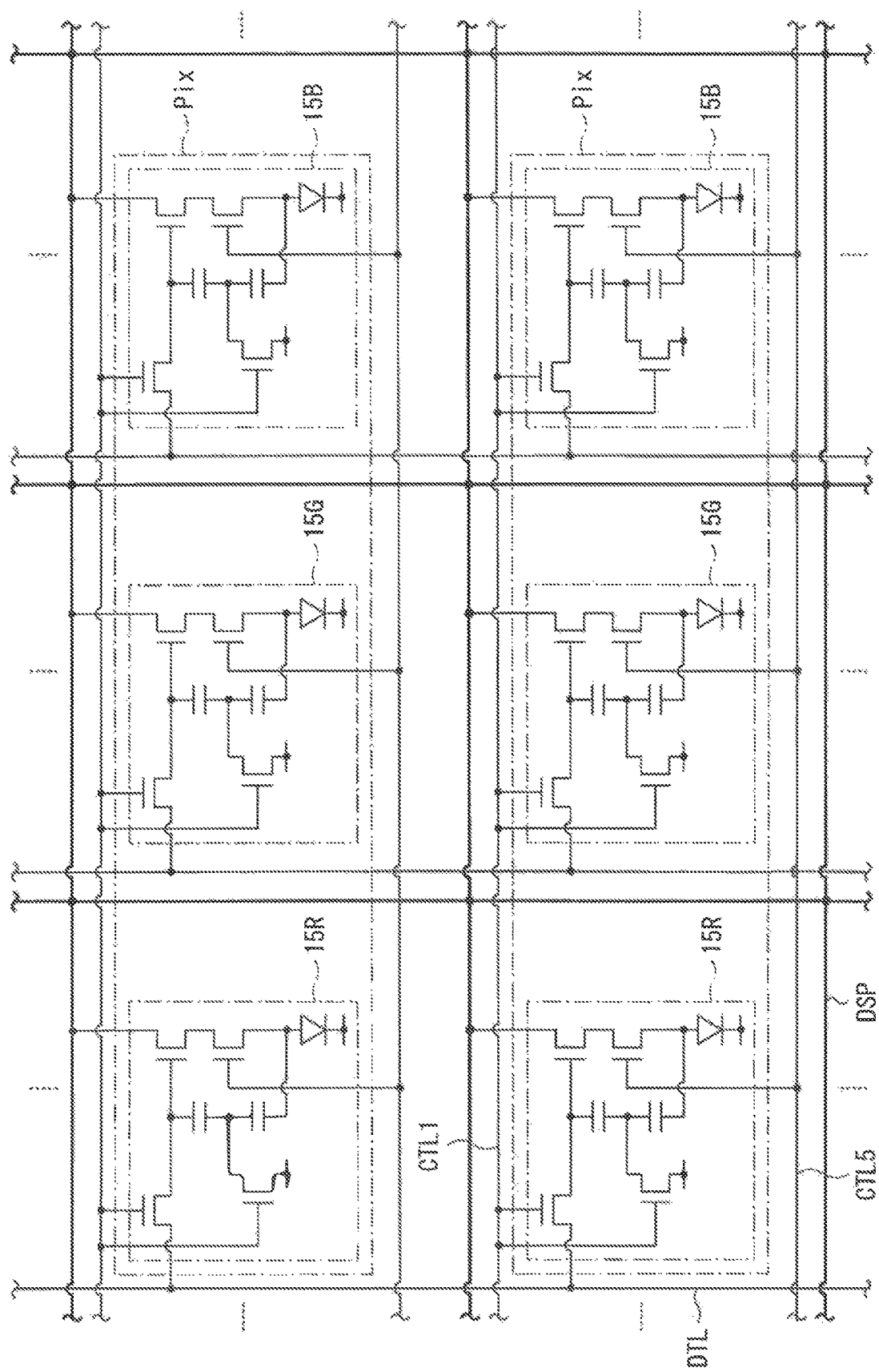
FIG. 19 is a circuit diagram illustrating a configuration example of a display section illustrated in FIG. 18.

FIG. 19 illustrates a configuration example of the display section 10F. The display section 10F has a single power line DSP. In this example, the power line DSP is formed in a lattice pattern inside the display section 10F. Further, a drain of a drive transistor Tr6 in each of the sub-pixels 15 is coupled to this power line DSP. It is to be noted that the power line DSP is formed in a lattice pattern in this example; however, a configuration is not limited thereto, and, for example, inside the display section 10F, the power line DSP may be formed using a plurality of wires extending in a horizontal direction (transverse direction) or using a plurality of wires extending in a vertical direction (longitudinal direction).

The driving section 20F has an image signal processor 21, a timing generator 22F, a writing control line driving section 23F, a control line driving section 27F, a power signal generator 28F, and a data line driving section 29C. The timing generator 22F provides a control signal to each of the writing control line driving section 23F, the control line driving section 27F, the power signal generator 28F, and the data line driving section 29C on the basis of the synchronous signal Ssync to be provided externally, and controls these line driving sections to operate in synchronization with one another. The writing control line driving section 23F selects the sub-pixels 15 sequentially on each row basis by applying the writing control signals G1 sequentially to the plurality of writing control lines CTL1 in accordance with the control signal provided from the timing generator 22F. At this time, in performing the preparatory driving DP, the writing control line driving section 23F applies the same signals to the plurality of writing control lines CTL1. The control line driving section 27F controls operation of the sub-pixels 15 on each row basis by applying the control signals G5 sequentially to the plurality of control lines CTL5 in accordance with the control signal provided from the timing generator 22F. At this time, in performing the preparatory driving DP, the control line driving section 27F applies the same signals to the plurality of control lines CTL5. The power signal generator 28F generates a power signal DS, and provides such a power signal DS to each of the sub-pixels 15 via the single power line DSP.

Figure 20:
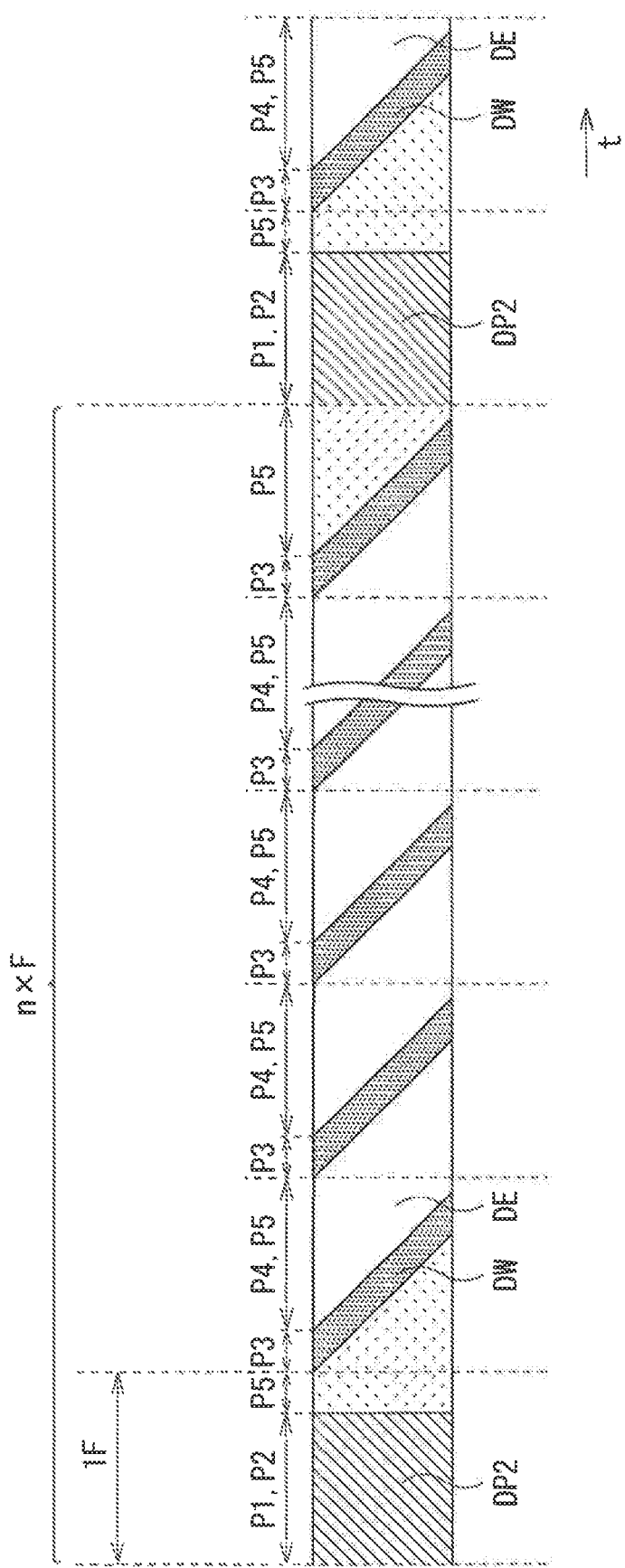
FIG. 20 is a timing chart illustrating an operation example of the display unit illustrated in FIG. 18.

FIG. 20 illustrates scan driving in the display unit 1E As with the display unit 1 according to the above-described embodiment, the display unit 1F carries out preparatory driving DP2 periodically at a rate of once per a plurality of frames ("n" frames) to perform the Vth correction. At this time, in the display unit 1F, the driving section 20F performs the preparatory driving DP2 at the same time for each of the sub-pixels 15 of the display section 10F. This ensures that the initialization and Vth correction are carried out at the same time in each of the sub-pixels 15 of the display section 10F. In write driving DW immediately before the preparatory driving DP2, the driving section 20F may write, for example, a pixel voltage Vsig of a voltage Vofs or less (Vsig≤Vofs) into each of the sub-pixels 15. This makes it possible to put each of the sub-pixels 15 in a non-luminescent state during a period from this write driving DW until starting of the next preparatory driving DP2. It is to be noted that a write operation is not limited thereto, and, for example, in the write driving DW immediately before the preparatory driving DP2, the pixel voltage Vsig for light emission of the sub-pixels 15 may be written into each of the sub-pixels 15 in order to display images on the display section 10F. In such a case, it is preferable to correct the pixel voltage Vsig beforehand considering that a time length of a luminescent period may be different depending on a location in a vertical direction of the display section 10F.

With such a configuration, it is also possible to obtain the effects similar to those achieved by the display unit 1 according to the above-described embodiment. Further, the display unit 1F eliminates the necessity for performing scan driving in providing the power signal DS to each of the sub-pixels 15, thus making it possible to achieve simple operation and simple circuit configuration. Additionally, the display unit 1F is allowed to enhance degrees of freedom of layout in the display section 10F. Especially, the power line DSP is formed in a lattice pattern in the display section 10F, and therefore it is possible to lower a wiring impedance and to provide a supply voltage (power signal DS) to each of the sub-pixels 15 more easily.

Modification Example 1-8

In the above-described embodiment, the drain of the write transistor Tr1 is coupled to the gate of the drive transistor Tr6; however, a configuration is not limited thereto. Hereinafter, a modification example 1-8 is described in detail.

Figure 21:
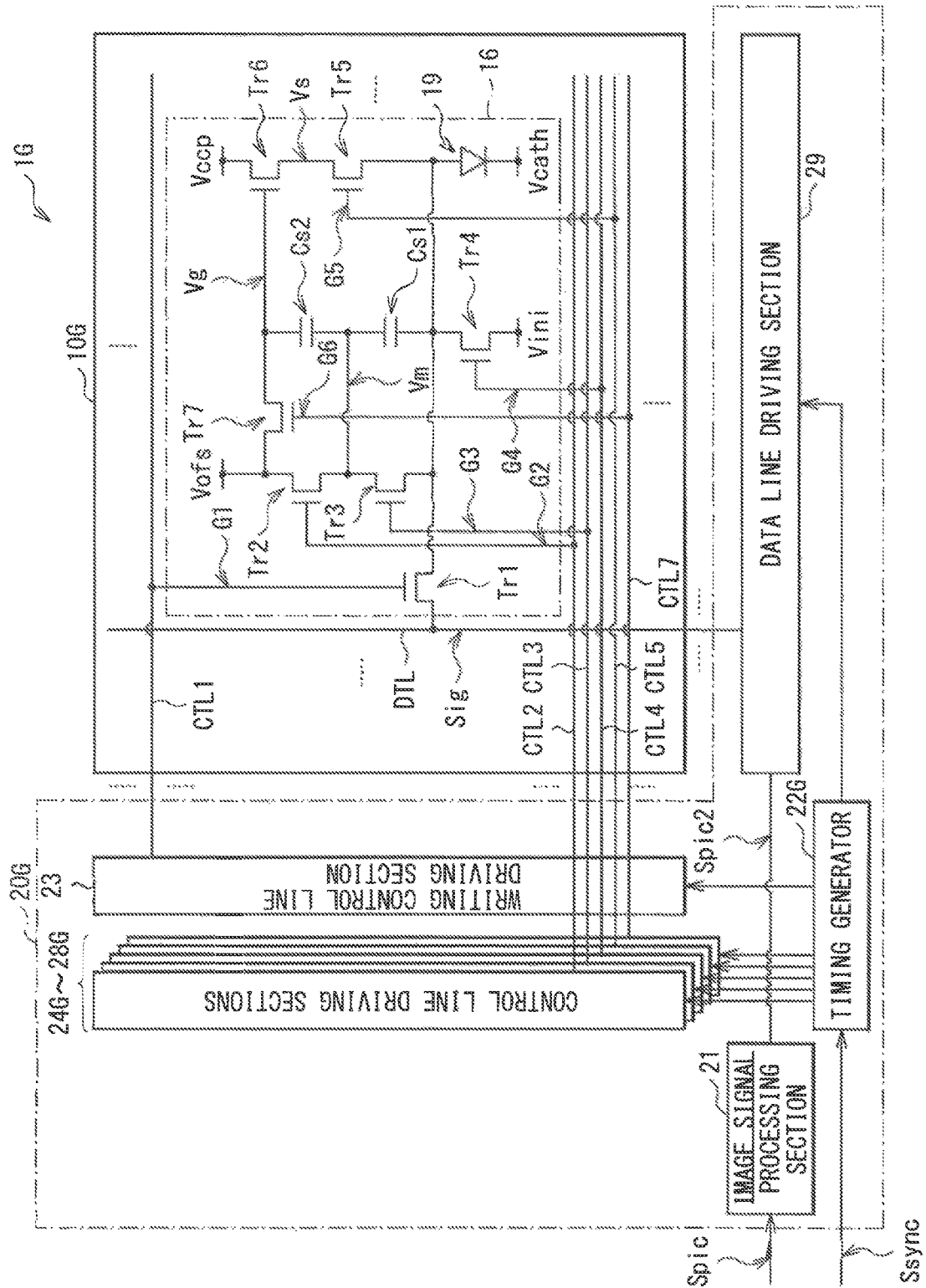
FIG. 21 is a circuit diagram illustrating a configuration example of a display unit according to a modification example.

FIG. 21 illustrates a configuration example of a display unit 1G according to the modification example 1-8. The display unit 1G includes a display section 10G and a driving section 20G.

The display section 10G has a sub-pixel 16. The sub-pixel 16 has a write transistor Tr1, a drive transistor Tr6, control transistors Tr2 to Tr5 and Tr7, capacitors Cs1 and Cs2, and a light-emitting device 19. In other words, the sub-pixel 16 has a so-called "7Tr2C" configuration. Further, the display section 10G has a plurality of control lines CTL2 to CTL5 and CTL7 extending in a row direction (transverse direction). A gate of the write transistor Tr1 is coupled to the writing control line CTL1; a source thereof is coupled to the data line DTL; and a drain thereof is coupled to sources of the control transistors Tr3 and Tr5, a drain of the control transistor Tr4, a second end of the capacitor Cs1, and an anode of the light-emitting device 19. A gate of the drive transistor Tr6 is coupled to a drain of the control transistor Tr7 and a first end of the capacitor Cs2; a drain thereof is supplied with a supply voltage Vccp by the driving section 20G; and a source thereof is coupled to a drain of the control transistor Tr5. A gate of the control transistor Tr2 is coupled to the control line CTL2; a drain thereof is coupled to a source of the control transistor Tr7, and is supplied with a voltage Vofs by the driving section 20G; and a source thereof is coupled to a drain of the control transistor Tr3, a first end of the capacitor Cs1, and a second end of the capacitor Cs2. A gate of the control transistor Tr3 is coupled to the control line CTL3; a drain thereof is coupled to the source of the control transistor Tr2, the first end of the capacitor Cs1, and the second end of the capacitor Cs2; and a source thereof is coupled to drains of the write transistor Tr1 and the control transistor Tr4, a source of the control transistor Tr5, the second end of the capacitor Cs1, and the anode of the light-emitting device 19. A gate of the control transistor Tr4 is coupled to the control line CTL4; a drain thereof is coupled to the drain of the write transistor Tr1, sources of the control transistors Tr3 and Tr5, the second end of the capacitor Cs1, and the anode of the light-emitting device 19; and a source thereof is supplied with a voltage Vini by the driving section 20G. A gate of the control transistor Tr5 is coupled to the control line CTL5; a drain thereof is coupled to the source of the drive transistor Tr6; and a source thereof is coupled to the drains of the write transistor Tr1 and the control transistor Tr4, the source of the control transistor Tr3, the second end of the capacitor Cs1, and the anode of the light-emitting device 19. A gate of the control transistor Tr7 is coupled to the control line CTL7; a drain thereof is coupled to the gate of the drive transistor Tr6 and the first end of the capacitor Cs2; and a source thereof is coupled to the drain of the control transistor Tr2, and is supplied with a voltage Vofs by the driving section 20G. The capacitor Cs1 holds a voltage corresponding to a pixel voltage Vsig, and the first end thereof is coupled to the source of the control transistor Tr2, the drain of the control transistor Tr3, and the second end of the capacitor Cs2, while the second end thereof is coupled to the drains of the write transistor Tr1 and the control transistor Tr4, the sources of the control transistors Tr3 and Tr5, and the anode of the light-emitting device 19. The capacitor Cs2 holds a voltage corresponding to a threshold voltage Vth of the drive transistor Tr6, and the first end thereof is coupled to the gate of the drive transistor Tr6 and the drain of the control transistor Tr7, while the second end thereof is coupled to the source of the control transistor Tr2, the drain of the control transistor Tr3, and the first end of the capacitor Cs1. The anode of the light-emitting device 19 is coupled to the drains of the write transistor Tr1 and the control transistor Tr4, the sources of the control transistors Tr3 and Tr5, and the second end of the capacitor Cs1, while a cathode thereof is supplied with a voltage Vcath by the driving section 20G.

The driving section 20G has an image signal processor 21, a timing generator 22G, a writing control line driving section 23, control line driving sections 24G to 28G, and a data line driving section 29. The timing generator 22G provides a control signal to each of the writing control line driving section 23, the control line driving sections 24G to 28G, and the data line driving section 29 on the basis of the synchronous signal Ssync to be provided externally, and controls these line driving sections to operate in synchronization with one another. The control line driving section 24G controls operation of the sub-pixels 16 on each row basis by applying the control signals G2 sequentially to the plurality of control lines CTL2 in accordance with the control signal provided from the timing generator 22G. Similarly, the control line driving section 25G controls operation of the sub-pixels 16 on each row basis by applying the control signals G3 sequentially to the plurality of control lines CTL3 in accordance with the control signal provided from the timing generator 22G. The control line driving section 26G controls operation of the sub-pixels 16 on each row basis by applying the control signals G4 sequentially to the plurality of control lines CTL4 in accordance with the control signal provided from the timing generator 22G. The control line driving section 27G controls operation of the sub-pixels 16 on each row basis by applying the control signals G5 sequentially to the plurality of control lines CTL5 in accordance with the control signal provided from the timing generator 22G. The control line driving section 28G controls operation of the sub-pixels 16 on each row basis by applying the control signals G7 sequentially to the plurality of control lines CTL7 in accordance with the control signal provided from the timing generator 22G.

FIG. 22 illustrates a timing chart of the display operation in the display unit 1G. (A) denotes a waveform of the writing control signal G1; (B) denotes a waveform of the control signal G2; (C) denotes a waveform of the control signal G3; (D) denotes a waveform of the control signal G4; (E) denotes a waveform of the control signal G5; (F) denotes a waveform of the control signal G7; (G) denotes a waveform of the data signal Sig; (H) denotes a waveform of a gate voltage Vg of the drive transistor Tr6; (I) denotes a waveform of a source voltage Vs of the drive transistor Tr6; and (J) denotes a voltage Vm. FIGS. 23A to 23G illustrate status of the sub-pixel 16 during various periods.

First, the driving section 20G initializes the sub-pixel 16 during a period of timing between t41 and t42 (initialization period P1). More specifically, at the timing t41, the control line driving section 25G varies a voltage of the control signal G3 from low level to high level ((C) of FIG. 22), and the control line driving section 26G varies a voltage of the control signal G4 from low level to high level ((D) of FIG. 22). With this operation, the control transistors Tr3 and Tr4 turn on, and the voltage Vm on the first end of the capacitor Cs1 is set at a voltage Vini ((J) of FIG. 22), and the second end of the capacitor Cs1 is also set at the voltage Vini. At the same time, the control line driving section 28G varies a voltage of the control signal G7 from low level to high level ((F) of FIG. 22). With this operation, the control transistor Tr7 turns on, and the gate voltage Vg of the drive transistor Tr6 is set at a voltage Vofs ((H) of FIG. 22).

In such a manner, in the sub-pixel 16, a potential difference across both ends of the capacitor Cs2 is set at (Vofs−Vini), and a potential difference across both ends of the capacitor Cs1 is set at 0 V as illustrated in FIG. 23A. The potential difference across both ends of the capacitor Cs2 of (Vofs−Vini) is greater than a threshold voltage Vth of the drive transistor Tr6.

Next, the driving section 20G carries out the Vth correction during a period of timing between t42 and t43 (Vth correction period P2). More specifically, the control line driving section 26G varies a voltage of the control signal G4 from high level to low level at the timing t42 ((D) of FIG. 22). With this operation, the control transistor Tr4 turns off, and feeding of the voltage Vini to the second end of the capacitor Cs1 is stopped. Further, at the same time, the control line driving section 27G varies a voltage of the control signal G5 from low level to high level ((E) of FIG. 22). With this operation, the control transistor Tr5 turns on, and a gate-source voltage Vgs of the drive transistor Tr6 is set at (Vofs−Vini). As a result, a current flows from the drain to the source of the drive transistor Tr6, and the source voltage Vs of the drive transistor Tr6 increases gradually to converge on a voltage (Vofs−Vth) as with the case of the above-described embodiment ((I) of FIG. 22). In such a manner, in the sub-pixel 16, a potential difference across both ends of the capacitor Cs2 is set at the voltage Vth as illustrated in FIG. 23B.

Subsequently, at the timing t43, the control line driving section 25G varies a voltage of the control signal G3 from high level to low level ((C) of FIG. 22); the control line driving section 27G varies a voltage of the control signal G5 from high level to low level ((E) of FIG. 22); and the control line driving section 28G varies a voltage of the control signal G7 from high level to low level ((F) of FIG. 22). With this operation, the control transistors Tr3, Tr5, and Tr7 turn off.

Next, the driving section 20G writes the pixel voltage Vsig (Vsig1) into the sub-pixel 16 during a period of timing between t44 and t45 (writing period P3). More specifically, to begin with, at the timing t44, the control line driving section 24G varies a voltage of the control signal G2 from low level to high level ((B) of FIG. 22). With this operation, the control transistor Tr2 turns on, and the voltage Vm on the first end of the capacitor Cs1 is set at the voltage Vofs ((J) of FIG. 22). In response, the gate voltage Vg of the drive transistor Tr6 increases ((H) of FIG. 22). At the same time, the data line driving section 29 sets a voltage of the data signal Sig at the pixel voltage Vsig1 ((G) of FIG. 22), and the writing control line driving section 23 varies a voltage of the writing control signal G1 from low level to high level ((A) of FIG. 22). With this operation, the write transistor Tr1 turns on, and a voltage on the second end of the capacitor Cs1 is set at the voltage Vsig1. In such a manner, in the sub-pixel 16, a potential difference across both ends of the capacitor Cs1 is set at (Vofs−Vsig1) while the capacitor Cs2 keeps a potential difference across both ends of (Vth) as illustrated in FIG. 23C.

Next, the driving section 20G makes the sub-pixel 16 luminescent during a period of timing between t45 and t47 (luminescent period P4). More specifically, at the timing t45, the writing control line driving section 23 varies a voltage of the writing control signal G1 from high level to low level ((A) of FIG. 22), and the control line driving section 24G varies a voltage of the control signal G2 from high level to low level ((B) of FIG. 22). With this operation, the write transistor Tr1 and the control transistor Tr2 turn off, and from then on a voltage corresponding to the pixel voltage Vsig1 is held in the capacitor Cs1. At the same time, the control line driving section 27G varies a voltage of the control signal G5 from low level to high level ((E) of FIG. 22). With this operation, the control transistor Tr5 turns on, and the light-emitting device 19 is put in a luminescent state as with the case of the above-described embodiment. In such a manner, in the sub-pixel 16, the light-emitting device 19 is put in a luminescent state while the capacitor Cs1 keeps a potential difference across both ends of (Vofs−Vsig1) and while the capacitor Cs2 keeps a potential difference across both ends of (Vth) as illustrated in FIG. 23D.

Subsequently, after the elapse of a period of a time length corresponding to a luminescent duty ratio, at the timing t47, the control line driving section 24G varies a voltage of the control signal G2 from low level to high level ((B) of FIG. 22), and the control line driving section 27G varies a voltage of the control signal G5 from high level to low level ((E) of FIG. 22). With this operation, the control transistor Tr2 turns on, and the control transistor Tr5 turns off, resulting in the light-emitting device 19 being put in a non-luminescent state as with the case of the above-described embodiment. At this time, in the sub-pixel 16, the light-emitting device 19 is put in a non-luminescent state while the capacitor Cs1 keeps a potential difference across both ends and while the capacitor Cs2 keeps a potential difference across both ends as illustrated in FIG. 23E.

Next, the driving section 20G writes the pixel voltage Vsig (Vsig2) into the sub-pixel 16 during a period of timing between t48 and t49 (writing period P3). More specifically, at the timing t48, the data line driving section 29 sets a voltage of the data signal Sig at the pixel voltage Vsig2 ((G) of FIG. 22), and the writing control line driving section 23 varies a voltage of the writing control signal G1 from low level to high level ((A) of FIG. 22). With this operation, the write transistor Tr1 turns on, and a voltage on the second end of the capacitor Cs1 is set at the voltage Vsig2. In such a manner, in the sub-pixel 16, a potential difference across both ends of the capacitor Cs1 is set at (Vofs−Vsig2) while the capacitor Cs2 keeps a potential difference across both ends of (Vth) as illustrated in FIG. 23F.

Next, the driving section 20G makes the sub-pixel 16 luminescent during a period from the timing t49 on (luminescent period P4). More specifically, at the timing t49, the writing control line driving section 23 varies a voltage of the writing control signal G1 from high level to low level ((A) of FIG. 22), and the control line driving section 24G varies a voltage of the control signal G2 from high level to low level ((B) of FIG. 22). With this operation, the write transistor Tr1 and the control transistor Tr2 turn off, and from then on a voltage corresponding to the pixel voltage Vsig2 is held in the capacitor Cs1. At the same time, the control line driving section 27G varies a voltage of the control signal G5 from low level to high level ((E) of FIG. 22). With this operation, the control transistor Tr5 turns on, and the light-emitting device 19 is put in a luminescent state as with the case of the above-described embodiment. In such a manner, in the sub-pixel 16, the light-emitting device 19 is put in a luminescent state while the capacitor Cs1 keeps a potential difference across both ends of (Vofs−Vsig2) and while the capacitor Cs2 keeps a potential difference across both ends of (Vth) as illustrated in FIG. 23G.

Thereafter, in the display unit 1G, after the elapse of a period of a time length corresponding to a luminescent duty ratio, the luminescent period P4 is terminated, and the light-emitting device 19 is put in a non-luminescent state.

With such a configuration, it is also possible to obtain the effects similar to those achieved by the display unit 1 according to the above-described embodiment.

2. Second Embodiment

Next, the description will be provided on a display unit 2 according to a second embodiment of the disclosure. In the second embodiment, a drive transistor is configured by a P-channel MOS TFT. It is to be noted that any component parts essentially the same as those in the display unit 1 according to the above-described first embodiment are denoted with the same reference numerals, and the related descriptions are omitted as appropriate.

Figure 24:
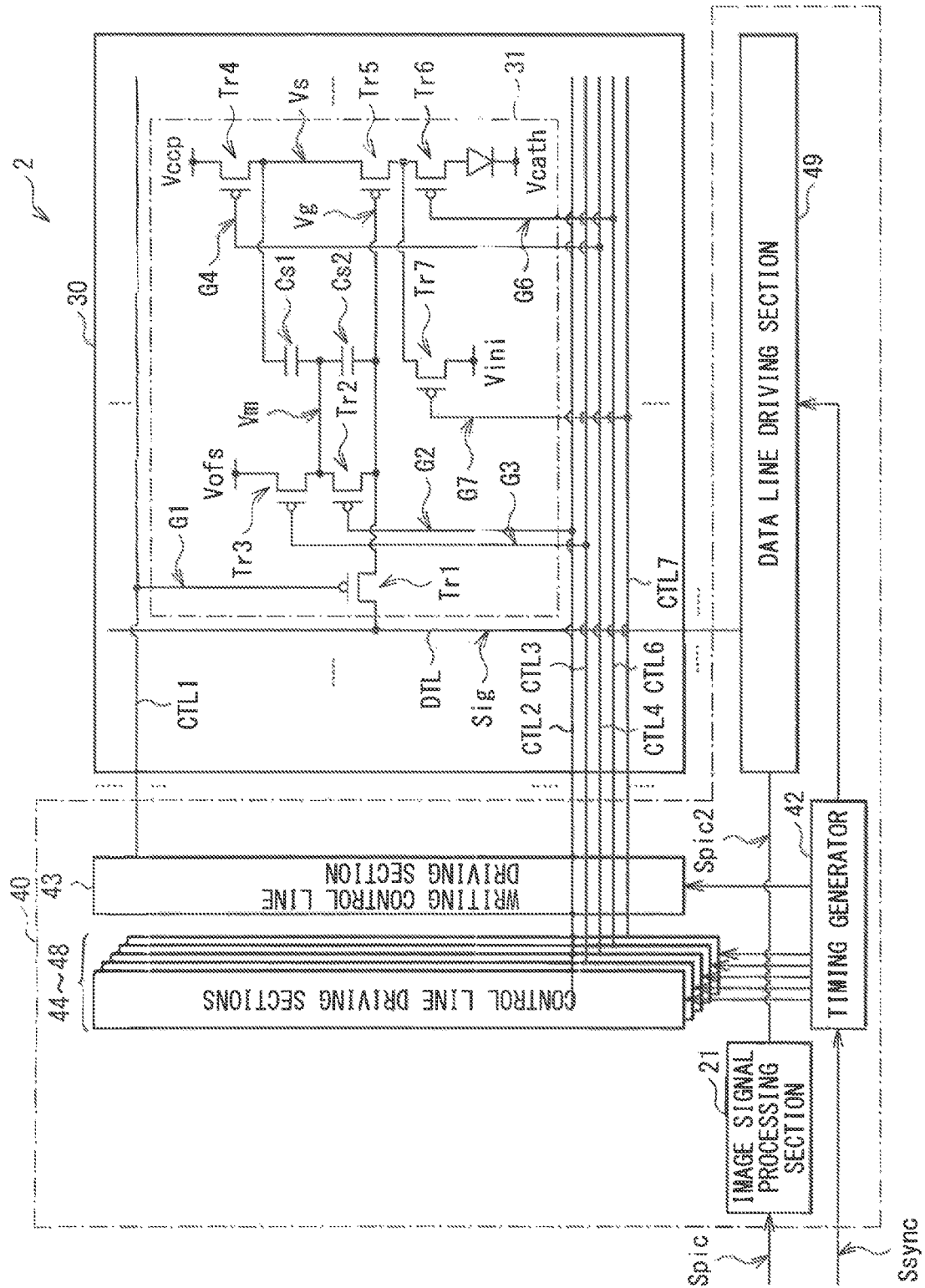
FIG. 24 is a circuit diagram illustrating a configuration example of a display unit according to a second embodiment.

FIG. 24 illustrates a configuration example of the display unit 2 according to the second embodiment. The display unit 2 includes a display section 30 and a driving section 40.

The display section 30 includes a sub-pixel 31, a plurality of writing control lines CTL1 extending in a row direction (transverse direction), a plurality of control lines CTL2 to CTL4, CTL6, and CTL7 extending in a row direction, and a plurality of data lines DTL extending in a column direction (longitudinal direction). Each of the sub-pixels 31 is coupled to the writing control line CTL1, the control lines CTL2 to CTL4, CTL6, and CTL7, as well as the data line DTL.

As illustrated in FIG. 24, the sub-pixel 31 includes a write transistor Tr1, a drive transistor Tr5, control transistors Tr2 to Tr4, Tr6, and Tr7, capacitors Cs1 and Cs2, and a light-emitting device 19. In other words, in this example, the sub-pixel 31 has a so-called "7Tr2C" configuration where the sub-pixel 31 is configured using seven transistors and two capacitors.

Each of the write transistor Tr1, the drive transistor Tr5, and the control transistors Tr2 to Tr4, Tr6, and Tr7 may be configured by, for example, a P-channel MOS TFT. A gate of the write transistor Tr1 is coupled to the writing control line CTL1; a source thereof is coupled to the data line DTL; and a drain thereof is coupled to a gate of the drive transistor Tr5, a drain of the control transistor Tr2, and a first end of the capacitor Cs2. The gate of the drive transistor Tr5 is coupled to the drain of the write transistor Tr1, the drain of the control transistor Tr2, and the first end of the capacitor Cs2; a source thereof is coupled to a drain of the control transistor Tr4 and a second end of the capacitor Cs1; and a drain thereof is coupled to sources of the control transistors Tr6 and Tr7. A gate of the control transistor Tr2 is coupled to the control line CTL2; a source thereof is coupled to a drain of the control transistor Tr3, a first end of the capacitor Cs1, and a second end of the capacitor Cs2; and a drain thereof is coupled to the drain of the write transistor Tr1, the gate of the drive transistor Tr5, and the first end of the capacitor Cs2. A gate of the control transistor Tr3 is coupled to the control line CTL3; a source thereof is supplied with a voltage Vofs by the driving section 40; and a drain thereof is coupled to the source of the control transistor Tr2, the first end of the capacitor Cs1, and the second end of the capacitor Cs2. A gate of the control transistor Tr4 is coupled to the control line CTL4; a source thereof is supplied with a supply voltage Vccp by the driving section 40; and a drain thereof is coupled to a source of the control transistor Tr5 and the second end of the capacitor Cs1. A gate of the control transistor Tr6 is coupled to the control line CTL6; a source thereof is coupled to the drain of the control transistor Tr5 and a source of the control transistor Tr7; and a drain thereof is coupled to an anode of the light-emitting device 19. A gate of the control transistor Tr7 is coupled to the control line CTL7; a source thereof is coupled to the drain of the control transistor Tr5 and the source of the control transistor Tr6; and a drain thereof is supplied with a voltage Vini by the driving section 40.

It is to be noted that, in this example, the write transistor Tr1 and the control transistors Tr2 to Tr4, Tr6, and Tr7 may be configured by the P-channel MOS TFTs; however, the configuration is not limited thereto, and one or more of these transistors may be configured by N-channel MOS TFTs alternatively.

The capacitor Cs1 holds a voltage corresponding to a threshold voltage Vth of the drive transistor Tr5, and the first end thereof is coupled to the source of the control transistor Tr2, the drain of the control transistor Tr3, and the second end of the capacitor Cs2, while the second end thereof is coupled to the source of the control transistor Tr5 and the drain of the control transistor Tr4. The capacitor Cs2 holds a voltage corresponding to a pixel voltage Vsig, and the first end thereof is coupled to the drain of the write transistor Tr1, the gate of the control transistor Tr5, and the drain of the control transistor Tr2, while the second end thereof is coupled to the source of the control transistor Tr2, the drain of the control transistor Tr3, and the first end of the capacitor Cs1. The anode of the light-emitting device 19 is coupled to the drain of the control transistor Tr6, and a cathode thereof is supplied with a voltage Vcath by the driving section 40.

With such a configuration, in the sub-pixel 31, a voltage corresponding to the threshold voltage Vth of the drive transistor Tr5 is set up in the capacitor Cs1 (Vth correcting operation), and a voltage corresponding to the pixel voltage Vsig is set up in the capacitor Cs2 (writing operation). Then, the drive transistor Tr5 provides a drive current to the light-emitting device 19 via the control transistor Tr6. This ensures that the light-emitting device 19 emits light at the luminance in accordance with the pixel voltage Vsig.

As illustrated in FIG. 24, the driving section 40 has a timing generator 42, a writing control line driving section 43, control line driving sections 44 to 48, and a data line driving section 49.

The timing generator 42 provides a control signal to each of the writing control line driving section 43, the control line driving sections 44 to 48, and the data line driving section 49 on the basis of the synchronous signal Ssync to be provided externally, and controls these line driving sections to operate in synchronization with one another.

The writing control line driving section 43 selects the sub-pixels 31 sequentially on each row basis by applying writing control signals G1 sequentially to the plurality of writing control lines CTL1 in accordance with the control signal provided from the timing generator 42.

The control line driving section 44 controls operation of the sub-pixels 31 on each row basis by applying control signals G2 sequentially to the plurality of control lines CTL2 in accordance with the control signal provided from the timing generator 42. Similarly, the control line driving section 45 controls operation of the sub-pixels 31 on each row basis by applying control signals G3 sequentially to the plurality of control lines CTL3 in accordance with the control signal provided from the timing generator 42. The control line driving section 46 controls operation of the sub-pixels 31 on each row basis by applying control signals G4 sequentially to the plurality of control lines CTL4 in accordance with the control signal provided from the timing generator 42. The control line driving section 47 controls operation of the sub-pixels 31 on each row basis by applying control signals G6 sequentially to the plurality of control lines CTL6 in accordance with the control signal provided from the timing generator 42. The control line driving section 48 controls operation of the sub-pixels 31 on each row basis by applying control signals G7 sequentially to the plurality of control lines CTL7 in accordance with the control signal provided from the timing generator 42.

The data line driving section 49 generates a data signal Sig including the pixel voltage Vsig indicating the emission luminance of each of the sub-pixels 31 in accordance with an image signal Spic2 provided from an image signal processor 21 and the control signal provided from the timing generator 42, and applies the data signal Sig to each of the data lines DTL.

Here, the capacitor Cs1 and the capacitor Cs2 correspond to specific but not limitative examples of a "first capacitor" and a "second capacitor", respectively in one embodiment of the disclosure. The control transistor Tr3, the control transistor Tr4, the control transistor Tr6, and the control transistor Tr7 correspond to specific but not limitative examples of a "first transistor", a "sixth transistor", a "seventh transistor", and an "eighth transistor", respectively in one embodiment of the disclosure. The voltage Vofs and the voltage Vini correspond to specific but not limitative examples of a "first voltage" and a "third voltage", respectively in one embodiment of the disclosure.

FIG. 25 illustrates a timing chart of the display operation in the display unit 2. (A) denotes a waveform of the writing control signal G1; (B) denotes a waveform of the control signal G2; (C) denotes a waveform of the control signal G3; (D) denotes a waveform of the control signal G4; (E) denotes a waveform of the control signal G6; (F) denotes a waveform of the control signal G7; (G) denotes a waveform of the data signal Sig; (H) denotes a waveform of a gate voltage Vg of the drive transistor Tr5; (I) denotes a waveform of a source voltage Vs of the drive transistor Tr5; and (J) denotes a voltage Vm on the first end of the capacitor Cs1 (second end of the capacitor Cs2). FIGS. 26A to 26G illustrate status of the sub-pixel 31 during various periods.

First, the driving section 40 initializes the sub-pixel 31 during a period of timing between t51 and t52 (initialization period P1). More specifically, to begin with, the control line driving section 45 varies a voltage of the control signal G3 from high level to low level at the timing t51 ((C) of FIG. 25). With this operation, the control transistor Tr3 turns on, and the voltage Vm on the first end of the capacitor Cs1 is set at the voltage Vofs ((J) of FIG. 25). At the same time, the control line driving section 44 varies a voltage of the control signal G2 from high level to low level ((B) of FIG. 25). With this operation, the control transistor Tr2 turns on to discharge the capacitor Cs2, and the gate voltage Vg of the drive transistor Tr5 is set at the voltage Vofs ((H) of FIG. 25). Further, at the same time, the control line driving section 46 varies a voltage of the control signal G4 from high level to low level ((D) of FIG. 25). With this operation, the control transistor Tr4 turns on, and a voltage on the second end of the capacitor Cs1 is set at the voltage Vccp.

In such a manner, in the sub-pixel 31, a potential difference across both ends of the capacitor Cs1 is set at (Vccp−Vofs), and a potential difference across both ends of the capacitor Cs2 is set at 0 V as illustrated in FIG. 26A. The potential difference across both ends of the capacitor Cs1 of (Vccp−Vofs) is greater than an absolute value |Vth| of the threshold voltage Vth of the drive transistor Tr5.

Next, the driving section 40 carries out the Vth correction during a period of timing between t52 and t53 (Vth correction period P2). More specifically, the control line driving section 46 varies a voltage of the control signal G4 from low level to high level at the timing t52 ((D) of FIG. 25). With this operation, the control transistor Tr4 turns off, and feeding of the voltage Vccp to the second end of the capacitor Cs1 is stopped. Further, at the same time, the control line driving section 48 varies a voltage of the control signal G7 from high level to low level ((F) of FIG. 25). With this operation, the control transistor Tr7 turns on, and a current flows from the source to the drain of the drive transistor Tr5. Then, the source voltage Vs of the drive transistor Tr5 decreases to converge on a voltage (Vofs+|Vth|) as with the case of the above-described first embodiment ((I) of FIG. 25). In other words, at this time, a potential difference across both ends of the capacitor Cs1 may become equal to the absolute value |Vth| of the threshold voltage Vth of the drive transistor Tr5. In such a manner, in the sub-pixel 31, a potential difference across both ends of the capacitor Cs1 is set at the voltage |Vth| as illustrated in FIG. 26B.

Subsequently, at the timing t53, the control line driving section 48 varies a voltage of the control signal G7 from low level to high level ((F) of FIG. 25). With this operation, the control transistor Tr7 turns off.

Thereafter, the driving section 40 writes the pixel voltage Vsig (Vsig1) into the sub-pixel 31 during a period of timing between t54 and t55 (writing period P3). More specifically, to begin with, the control line driving section 44 varies a voltage of the control signal G2 from low level to high level at the timing t54 ((B) of FIG. 25). With this operation, the control transistor Tr2 turns off. At the same time, the data line driving section 49 sets a voltage of the data signal Sig at the pixel voltage Vsig1 ((G) of FIG. 25), and the writing control line driving section 43 varies a voltage of the writing control signal G1 from high level to low level ((A) of FIG. 25). With this operation, the write transistor Tr1 turns on, and a voltage on the first end of the capacitor Cs2 is set at the voltage Vsig1. In such a manner, in the sub-pixel 31, a potential difference across both ends of the capacitor Cs2 is set at (Vofs−Vsig1) while the capacitor Cs1 keeps a potential difference across both ends of (|Vth|) as illustrated in FIG. 26C.

Next, the driving section 40 makes the sub-pixel 31 luminescent during a period of timing between t55 and t57 (luminescent period P4). More specifically, at the timing t55, the writing control line driving section 43 varies a voltage of the writing control signal G1 from low level to high level ((A) of FIG. 25), and the control line driving section 45 varies a voltage of the control signal G3 from low level to high level ((C) of FIG. 25). With this operation, the write transistor Tr1 and the control transistor Tr3 turn off, and from then on a voltage corresponding to the pixel voltage Vsig1 is held in the capacitor Cs2. At the same time, the control line driving section 46 varies a voltage of the control signal G4 from high level to low level ((D) of FIG. 25), and the control line driving section 47 varies a voltage of the control signal G6 from high level to low level ((E) of FIG. 25). With this operation, the control transistors Tr4 and Tr6 turn on, and the source voltage Vs of the drive transistor Tr5 rises up to the voltage Vccp ((I) of FIG. 25). Accordingly, the gate voltage Vg also increases ((H) of FIG. 25), leading to light emission of the light-emitting device 19. In such a manner, in the sub-pixel 31, the light-emitting device 19 is put in a luminescent state while the capacitor Cs1 keeps a potential difference across both ends of (|Vth|) and while the capacitor Cs2 keeps a potential difference across both ends of (Vofs−Vsig1) as illustrated in FIG. 26D.

Subsequently, after the elapse of a period of a time length corresponding to a luminescent duty ratio, at the timing t57, the control line driving section 45 varies a voltage of the control signal G3 from high level to low level ((C) of FIG. 25); the control line driving section 46 varies a voltage of the control signal G4 from low level to high level ((D) of FIG. 25); and the control line driving section 47 varies a voltage of the control signal G6 from low level to high level ((E) of FIG. 25). With this operation, the control transistor Tr3 turns on, and the control transistors Tr4 and Tr6 turn off to stop supply of a current to the light-emitting device 19. Then, the gate voltage Vg and the source voltage Vs of the drive transistor Tr5 will drop ((H) and (I) of FIG. 25), resulting in the light-emitting device 19 being put in a non-luminescent state. At this time, in the sub-pixel 31, the light-emitting device 19 is put in a non-luminescent state while the capacitor Cs1 keeps a potential difference across both ends and while the capacitor Cs2 keeps a potential difference across both ends as illustrated in FIG. 26E.

Thereafter, the driving section 40 writes the pixel voltage Vsig (Vsig2) into the sub-pixel 31 during a period of timing between t58 and t59 (writing period P3). More specifically, at the timing t58, the data line driving section 49 sets a voltage of the data signal Sig at the pixel voltage Vsig2 ((G) of FIG. 25), and the writing control line driving section 43 varies a voltage of the writing control signal G1 from high level to low level ((A) of FIG. 25). With this operation, the write transistor Tr1 turns on, and a voltage on the first end of the capacitor Cs2 is set at the voltage Vsig2. In such a manner, in the sub-pixel 31, a potential difference across both ends of the capacitor Cs2 is set at (Vofs−Vsig2) while the capacitor Cs1 keeps a potential difference across both ends of (|Vth|) as illustrated in FIG. 26F.

Next, the driving section 40 makes the sub-pixel 31 luminescent during a period from the timing t59 on (luminescent period P4). More specifically, at the timing t59, the writing control line driving section 43 varies a voltage of the writing control signal G1 from low level to high level ((A) of FIG. 25), and the control line driving section 45 varies a voltage of the control signal G3 from low level to high level ((C) of FIG. 25). With this operation, the write transistor Tr1 and the control transistor Tr3 turn off, and from then on a voltage corresponding to the pixel voltage Vsig2 is held in the capacitor Cs2. At the same time, the control line driving section 46 varies a voltage of the control signal G4 from high level to low level ((D) of FIG. 25), and the control line driving section 47 varies a voltage of the control signal G6 from high level to low level ((E) of FIG. 25). With this operation, the control transistors Tr4 and Tr6 turn on, and the source voltage Vs of the drive transistor Tr5 rises up to the voltage Vccp ((I) of FIG. 25). Accordingly, the gate voltage Vg also increases ((H) of FIG. 25), leading to light emission of the light-emitting device 19. In such a manner, in the sub-pixel 31, the light-emitting device 19 is put in a luminescent state while the capacitor Cs1 keeps a potential difference across both ends of (|Vth|) and while the capacitor Cs2 keeps a potential difference across both ends of (Vofs−Vsig2) as illustrated in FIG. 26G.

Thereafter, in the display unit 2, after the elapse of a period of a time length corresponding to a luminescent duty ratio, the luminescent period P4 is terminated, and the light-emitting device 19 is put in a non-luminescent state.

With such a configuration, it is also possible to obtain the effects similar to those achieved by the display unit 1 according to the above-described first embodiment.

Modification Example 2-1

In the above-described embodiment, the voltage Vini is provided to the drain of the control transistor Tr7; however, a configuration is not limited thereto. For example, the voltage Vcath may be provided to the drain of the control transistor Tr7. Alternatively, for example, when the drive transistor Tr5 is an enhancement type, it is possible to provide the voltage Vofs to the drain of the control transistor Tr7.

Modification Example 2-2

In the above-described embodiment, the control transistor Tr2 is provided; however, a configuration is not limited thereto. Hereinafter, a modification example 2-2 is described in detail.

Figure 27:
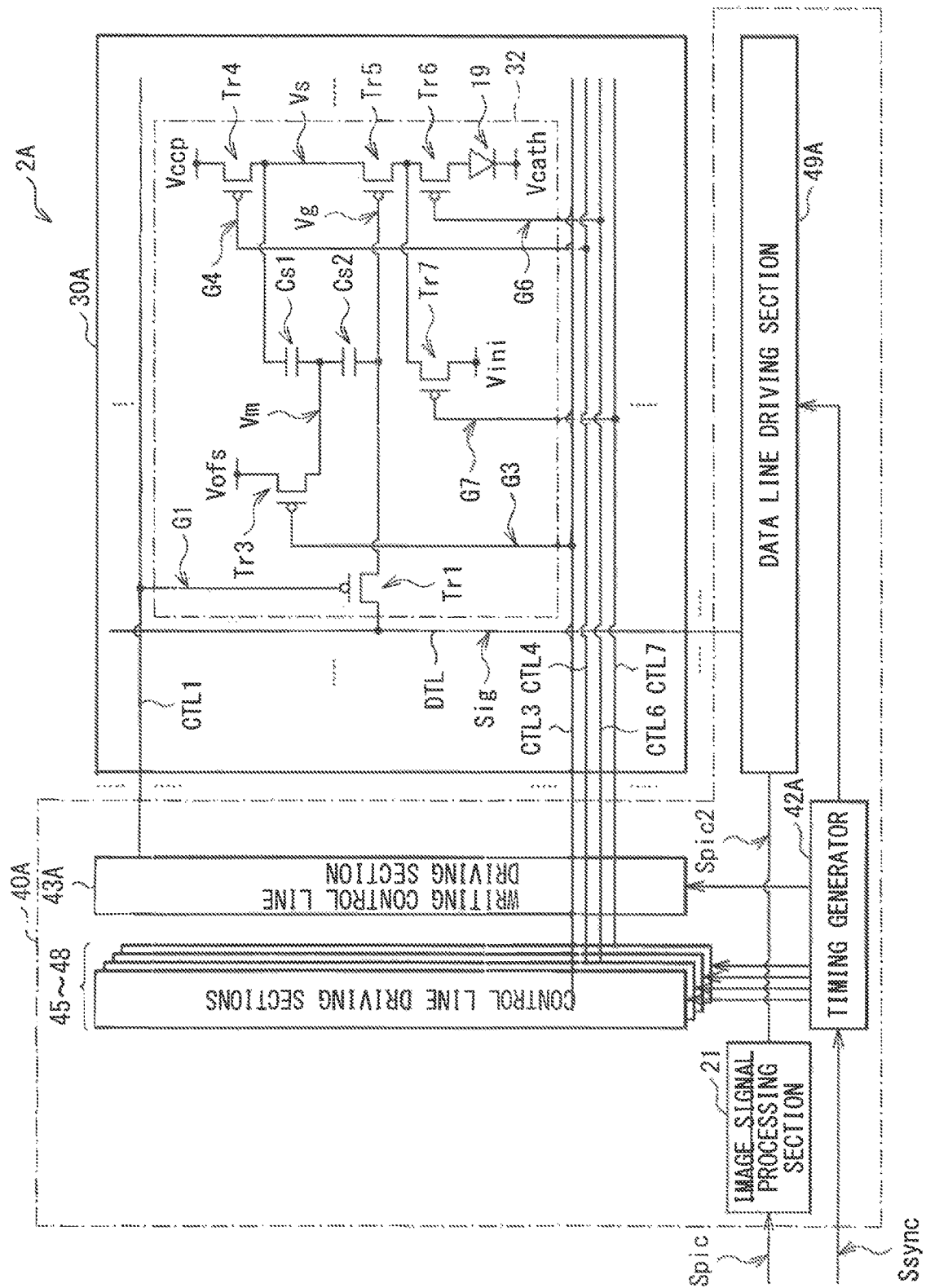
FIG. 27 is a circuit diagram illustrating a configuration example of a display unit according to a modification example.

FIG. 27 illustrates a configuration example of a display unit 2A according to a modification example 2-2. The display unit 2A includes a display section 30A and a driving section 40A. The display section 30A has a sub-pixel 32. The sub-pixel 32 has a write transistor Tr1, a drive transistor Tr5, control transistors Tr3, Tr4, Tr6, and Tr7, capacitors Cs1 and Cs2, and a light-emitting device 19. In other words, the sub-pixel 32 eliminates the control transistor Tr2 from the sub-pixel 31 according to the above-described embodiment (FIG. 24), and has a so-called "6Tr2C" configuration. The driving section 40A has an image signal processor 21, a timing generator 42A, a writing control line driving section 43A, control line driving sections 45 to 48, and a data line driving section 49A. The timing generator 42A provides a control signal to each of the writing control line driving section 43A, the control line driving sections 45 to 48, and the data line driving section 49A on the basis of the synchronous signal S sync to be provided externally, and controls these line driving sections to operate in synchronization with one another. The writing control line driving section 43A selects the sub-pixels 32 sequentially on each row basis by applying writing control signals G1 sequentially to the plurality of writing control lines CTL1 in accordance with the control signal provided from the timing generator 42A. The data line driving section 49A generates a data signal Sig including the pixel voltage Vsig and the voltage Vofs in accordance with an image signal Spic2 provided from the image signal processor 21 and the control signal provided from the timing generator 42A, and applies the data signal Sig to each of the data lines DTL. In other words, the driving section 40A is configured in a manner of eliminating the control line driving section 44, changing the writing control line driving section 43 to the writing control line driving section 43A, changing the data line driving section 49 to the data line driving section 49A, and changing the timing generator 42 to the timing generator 42A in the driving section 40 according to the above-described embodiment (FIG. 24).

Figure 28:
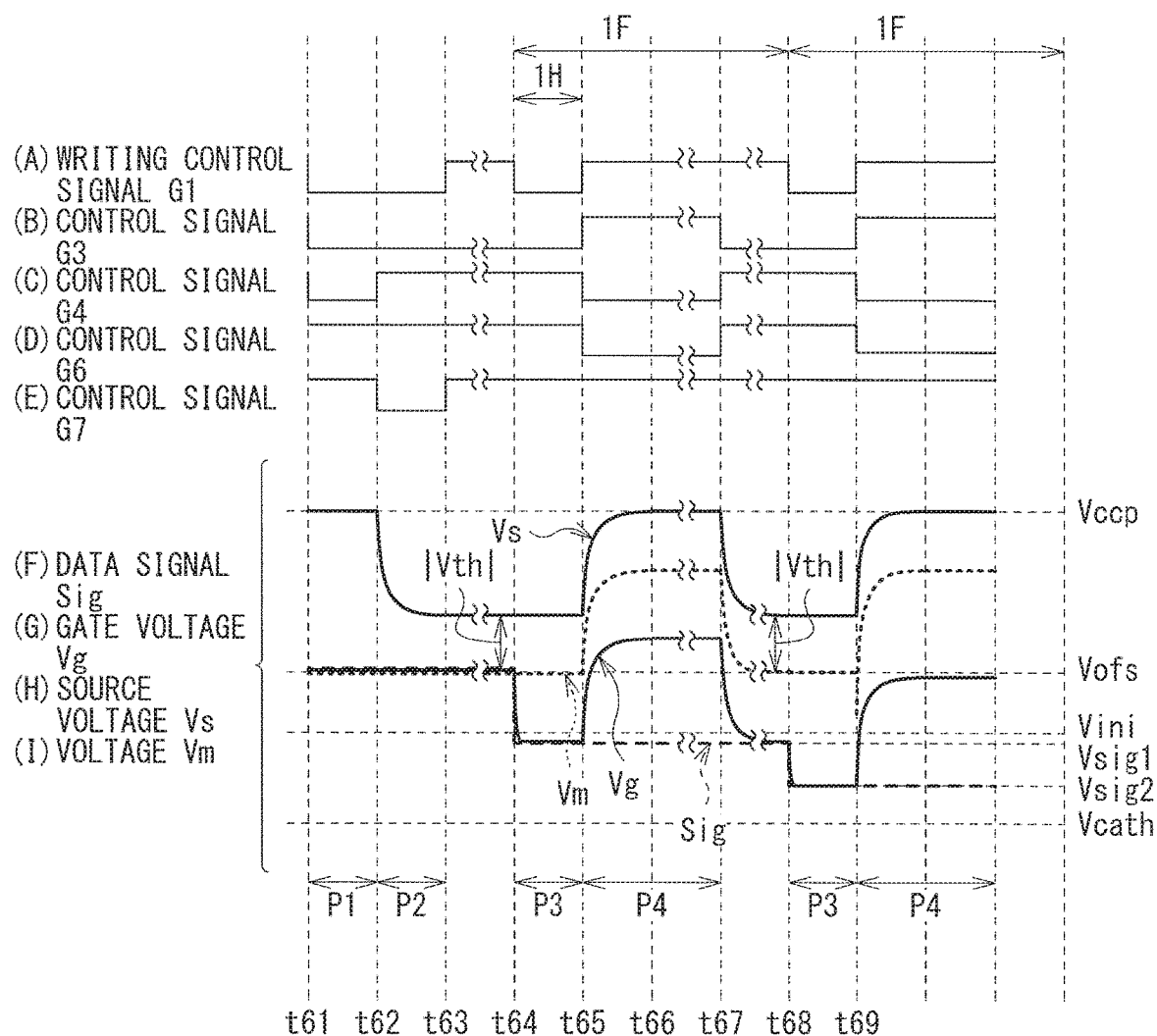
FIG. 28 is a timing waveform chart illustrating an operation example of a sub-pixel illustrated in FIG. 27.

FIG. 28 illustrates a timing chart of the display operation in the display unit 2A. (A) denotes a waveform of the writing control signal G1; (B) denotes a waveform of the control signal G3; (C) denotes a waveform of the control signal G4; (D) denotes a waveform of the control signal G6; (E) denotes a waveform of the control signal G7; (F) denotes a waveform of the data signal Sig; (G) denotes a waveform of a gate voltage Vg of the drive transistor Tr5; (H) denotes a waveform of a source voltage Vs of the drive transistor Tr5; and (I) denotes a voltage Vm.

First, the driving section 40A initializes the sub-pixel 32 during a period of timing between t61 and t62 (initialization period P1). More specifically, at the timing t61, the data line driving section 49A sets a voltage of the data line DTL at the voltage Vofs ((F) of FIG. 28); the writing control line driving section 43A varies a voltage of the writing control signal G1 from high level to low level ((A) of FIG. 28); and the control line driving section 45 varies a voltage of the control signal G3 from high level to low level ((B) of FIG. 28). With this operation, the write transistor Tr1 and the control transistor Tr3 turn on to set the voltage Vm on the first end of the capacitor Cs1 at the voltage Vofs ((I) of FIG. 28), and the gate voltage Vg of the drive transistor Tr5 is set at the voltage Vofs ((G) of FIG. 28). At the same time, the control line driving section 46 varies a voltage of the control signal G4 from high level to low level ((C) of FIG. 28). With this operation, the control transistor Tr4 turns on, and a voltage on the second end of the capacitor Cs1 is set at the voltage Vccp.

Next, the driving section 40A carries out the Vth correction during a period of timing between t62 and t63 (Vth correction period P2) as with the case of the above-described embodiment.

Subsequently, at the timing t63, the writing control line driving section 43A varies a voltage of the writing control signal G1 from low level to high level ((A) of FIG. 28), and the control line driving section 48 varies a voltage of the control signal G7 from low level to high level ((E) of FIG. 28). With this operation, the write transistor Tr1 and the control transistor Tr7 turn off.

The operation from this timing period on is similar to that in a case of the display unit 1 according to the above-described embodiment (FIG. 4).

Figure 29:
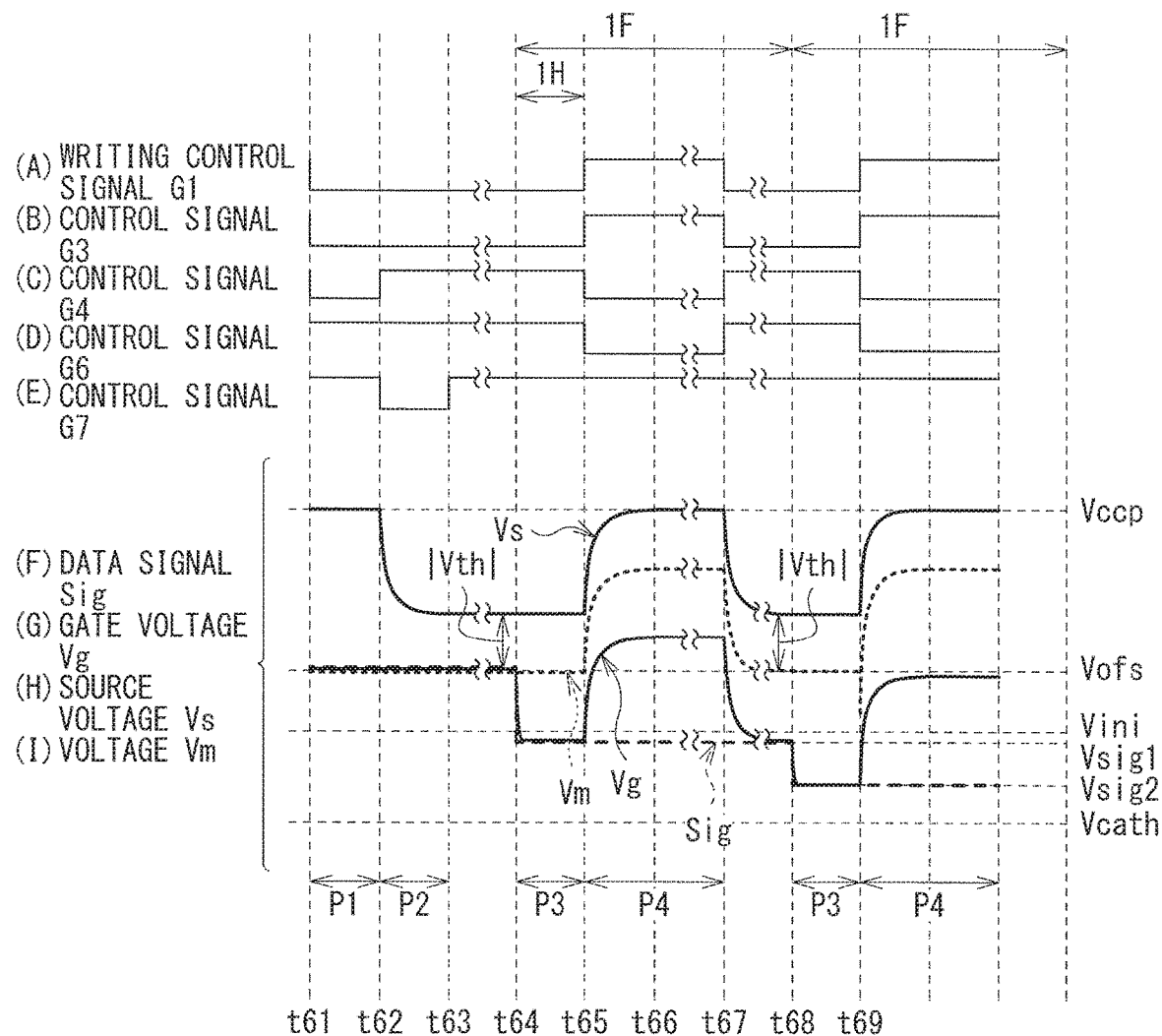
FIG. 29 is a timing waveform chart illustrating another operation example of the sub-pixel illustrated in FIG. 27.

FIG. 29 illustrates a timing chart of another display operation in the display unit 2A. In this example, a voltage of the writing control signal G1 is held at low level during a period of timing between t63 and t64 and during a period of timing between t67 and t68. Hereinafter, this operation is described in detail.

First, the driving section 40A initializes the sub-pixel 32 during a period of timing between t61 and t62 (initialization period P1) as with the case of FIG. 28, and carries out the Vth correction during a period of timing between t62 and t63 (Vth correction period P2) as with the case of FIG. 28.

Next, at the timing t63, the control line driving section 48 varies a voltage of the control signal G7 from low level to high level ((E) of FIG. 29). With this operation, the control transistor Tr7 turns off.

Subsequently, the driving section 40A writes the pixel voltage Vsig (Vsig1) into the sub-pixel 32 during a period of timing between t64 and t65 (writing period P3). More specifically, at the timing t64, the data line driving section 49A sets a voltage of the data signal Sig at the pixel voltage Vsig1 ((F) of FIG. 29). With this operation, a voltage on the first end of the capacitor Cs2 is set at the voltage Vsig1.

Thereafter, the driving section 40A makes the sub-pixel 32 luminescent during a period of timing between t65 and t67 (luminescent period P4) as with the case of FIG. 28.

Then, after the elapse of a period of a time length corresponding to a luminescent duty ratio, at the timing t67, the writing control line driving section 43A varies a voltage of the writing control signal G1 from high level to low level ((A) of FIG. 29); the control line driving section 45 varies a voltage of the control line CTL3 from high level to low level ((B) of FIG. 29); the control line driving section 46 varies a voltage of the control signal G4 from low level to high level ((C) of FIG. 29); and the control line driving section 47 varies a voltage of the control signal G6 from low level to high level ((D) of FIG. 29). With this operation, the write transistor Tr1 and the control transistor Tr3 turn on, and the control transistors Tr4 and Tr6 turn off, resulting in the light-emitting device 19 being put in a non-luminescent state as with the case of FIG. 28.

Next, the driving section 40A writes the pixel voltage Vsig (Vsig2) into the sub-pixel 32 during a period of timing between t68 and t69 (writing period P3). More specifically, at the timing t68, the data line driving section 49A sets a voltage of the data signal Sig at the pixel voltage Vsig2 ((F) of FIG. 29). With this operation, a voltage on the first end of the capacitor Cs2 is set at the voltage Vsig2.

Next, the driving section 40A makes the sub-pixel 32 luminescent during a period from the timing t69 on (luminescent period P4) as with the case of FIG. 28.

Thereafter, in the display unit 2A, after the elapse of a period of a time length corresponding to a luminescent duty ratio, the luminescent period P4 is terminated, and the light-emitting device 19 is put in a non-luminescent state.

With such a configuration, it is also possible to obtain the effects similar to those achieved by the display unit 2 according to the above-described embodiment. Further, the display unit 2A allows the number of transistors to be reduced in each of the sub-pixels 32, and therefore, for example, it is possible to enhance degrees of freedom in layout of the sub-pixel 32, or to increase the pixel density by reducing the area of the sub-pixel 32. Moreover, the display unit 2A allows the number of the control line driving sections to be reduced, thus making it possible to achieve a simple configuration.

Modification Example 2-3

In the above-described embodiment, the gate of the control transistor Tr3 is coupled to the control line CTL3; however, a configuration is not limited thereto. Hereinafter, the modification example 2-3 is described in detail.

Figure 30:
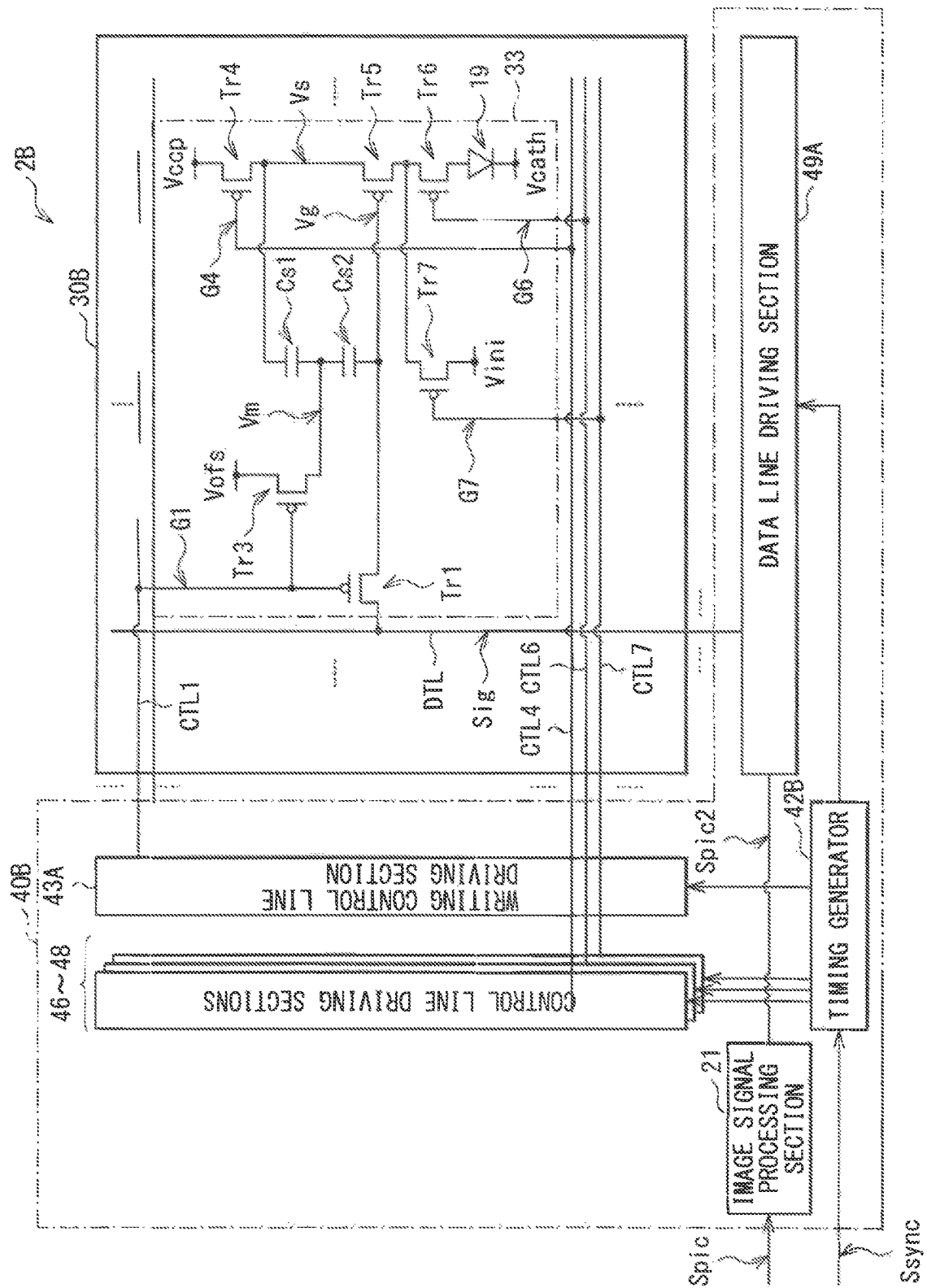
FIG. 30 is a circuit diagram illustrating a configuration example of a display unit according to a modification example.

FIG. 30 illustrates a configuration example of a display unit 2B according to a modification example 2-3. The display unit 2B is configured in such a manner that the present modification example is applied to the display unit 2A according to the above-described modification example 2-2 (FIG. 27). The display unit 2B includes a display section 30B and a driving section 40B. The display section 30B has a sub-pixel 33. A gate of a control transistor Tr3 of the sub-pixel 33 is coupled to the writing control line CTL1. In other words, in the sub-pixel 32 according to the above-described modification example 2-2 (FIG. 27), a gate of the control transistor Tr3 is coupled to the control line CTL3; however, the gate of the control transistor Tr3 is coupled to the writing control line CTL1 in the sub-pixel 33 according to the present modification example (FIG. 30). The driving section 40B has an image signal processor 21, a timing generator 42B, a writing control line driving section 43A, control line driving sections 46 to 48, and a data line driving section 49A. The timing generator 42B provides a control signal to each of the writing control line driving section 43A, the control line driving sections 46 to 48, and the data line driving section 49A on the basis of the synchronous signal Ssync to be provided externally, and controls these line driving sections to operate in synchronization with one another. In other words, the driving section 40B is configured in a manner of eliminating the control line driving section 45 and changing the timing generator 42A to the timing generator 42B in the driving section 40A according to the above-described modification example 2-2 (FIG. 27).

In other words, in the display unit 2B, the writing control signal G1 is provided to the gate of the write transistor Tr1 with attention focused on a fact that a waveform of the writing control signal G1 ((A) of FIG. 29) and a waveform of the control signal G3 ((B) of FIG. 29) are similar to each other in the display unit 2A according to the above-described modification example 2-2 (FIG. 29).

Figure 31:
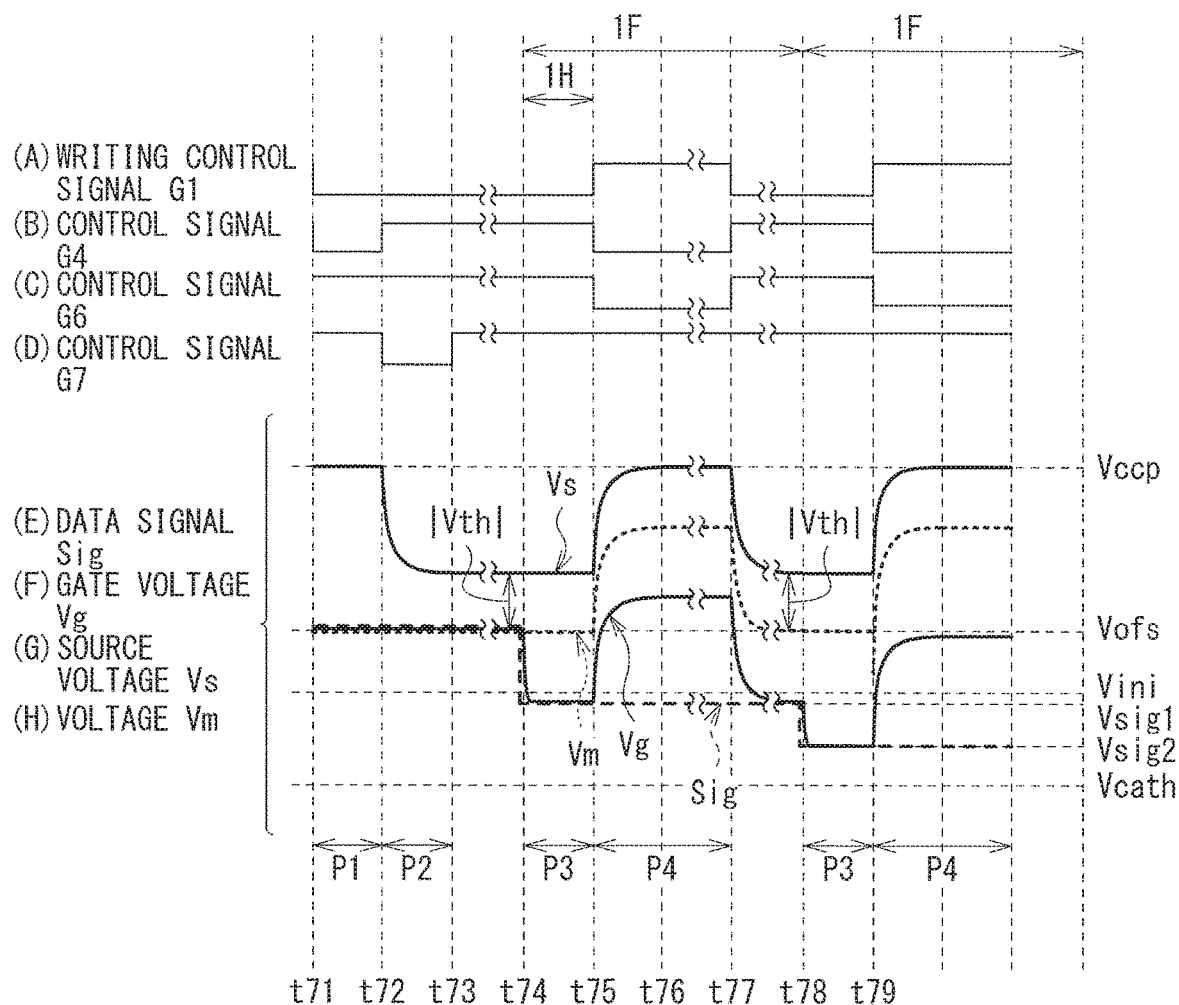
FIG. 31 is a timing waveform chart illustrating an operation example of a sub-pixel illustrated in FIG. 30.

FIG. 31 illustrates a timing chart of the display operation in the display unit 2B. (A) denotes a waveform of the writing control signal G1; (B) denotes a waveform of the control signal G4; (C) denotes a waveform of the control signal G6; (D) denotes a waveform of the control signal G7; (E) denotes a waveform of the data signal Sig; (F) denotes a waveform of a gate voltage Vg of the drive transistor Tr5; (G) denotes a waveform of a source voltage Vs of the drive transistor Tr5; and (H) denotes a voltage Vm. FIG. 31 omits a waveform of the control signal G3 from the timing chart (FIG. 29) of the display unit 2A according to the modification example 2-2. In other words, the display unit 2B performs the operation similar to that of the display unit 2A (FIGS. 27 and 29).

With such a configuration, it is also possible to obtain the effects similar to those achieved by the display unit 2 according to the above-described embodiment. Further, the display unit 2B allows the number of the control line driving sections to be reduced, thus making it possible to achieve a simple configuration.

Modification Example 2-4

In the above-described embodiment, the control transistor Tr6 is provided; however, a configuration is not limited thereto. Hereinafter, a modification example 2-4 is described in detail.

Figure 32:
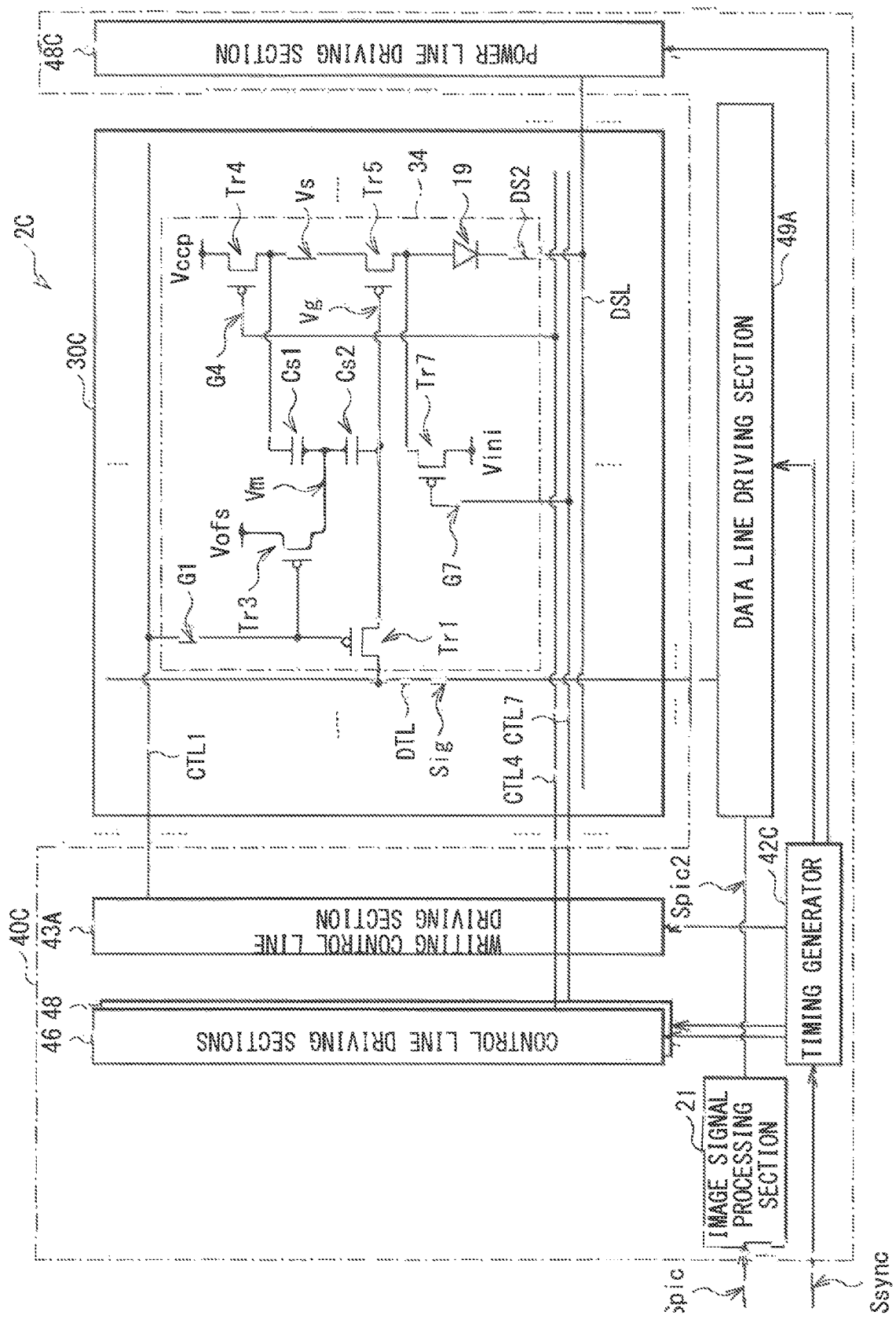
FIG. 32 is a circuit diagram illustrating a configuration example of a display unit according to a modification example.

FIG. 32 illustrates a configuration example of a display unit 2C according to a modification example 2-4. The display unit 2C is configured in such a manner that the present modification example is applied to the display unit 2B according to the above-described modification example 2-3 (FIG. 30). The display unit 2C includes a display section 30C and a driving section 40C. The display section 30C has a sub-pixel 34. The sub-pixel 34 has a write transistor Tr1, a drive transistor Tr5, control transistors Tr3, Tr4, and Tr7, capacitors Cs1 and Cs2, and a light-emitting device 19. In other words, the sub-pixel 34 eliminates the control transistor Tr6 from the sub-pixel 33 according to the above-described modification example 2-3 (FIG. 30), and has a so-called "5Tr2C" configuration. Further, the display section 30C has a plurality of power lines DSL extending in a row direction (transverse direction). A cathode of the light-emitting device 19 is coupled to the power line DSL. The driving section 40C has an image signal processor 21, a timing generator 42C, a writing control line driving section 43A, control line driving sections 46 and 48, a power line driving section 48C, and a data line driving section 49A. The timing generator 42C provides a control signal to each of the writing control line driving section 43A, the control line driving sections 46 and 48, the power line driving section 48C, and the data line driving section 49A on the basis of the synchronous signal Ssync to be provided externally, and controls these line driving sections to operate in synchronization with one another. The power line driving section 48C controls operation of the sub-pixels 34 on each row basis by applying power signals DS2 sequentially to the plurality of power lines DSL in accordance with the control signal provided from the timing generator 42C. The power signal DS2 makes the transition between a voltage Vcath and a voltage Vccp. In other words, the driving section 40C is configured in a manner of eliminating the control line driving section 47, adding the power line driving section 48C, and changing the timing generator 42B to the timing generator 42C in the driving section 40B according to the above-described modification example 2-3 (FIG. 30).

Figure 33:
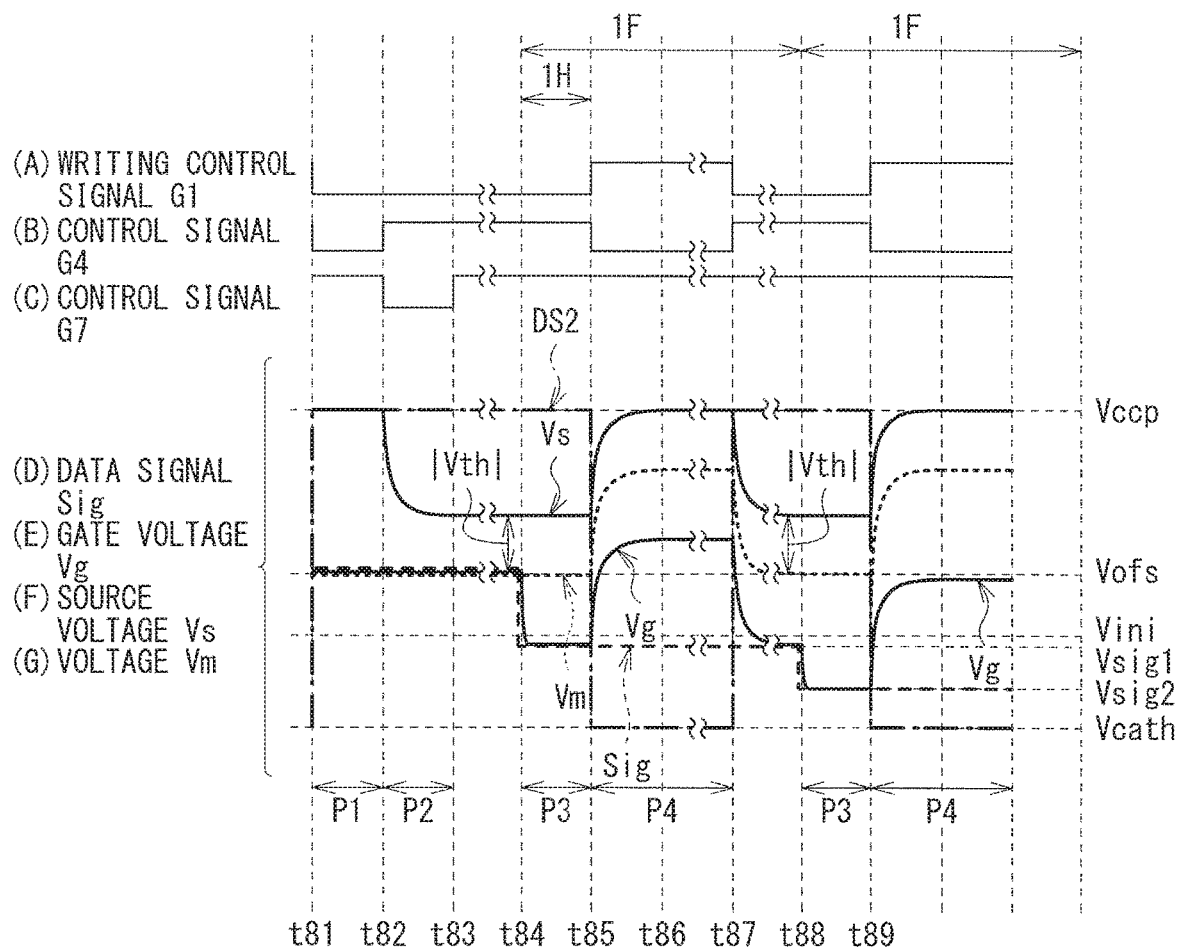
FIG. 33 is a timing waveform chart illustrating an operation example of a sub-pixel illustrated in FIG. 32.

FIG. 33 illustrates a timing chart of the display operation in the display unit 2C. (A) denotes a waveform of the writing control signal G1; (B) denotes a waveform of the control signal G4; (C) denotes a waveform of the control signal G7; (D) denotes a waveform of the data signal Sig; (E) denotes a waveform of the power signal DS2; (F) denotes a waveform of a gate voltage Vg of the drive transistor Tr5; (G) denotes a waveform of a source voltage Vs of the drive transistor Tr5; and (H) denotes a voltage Vm.

First, the driving section 40C initializes the sub-pixel 34 during a period of timing between t81 and t82 (initialization period P1). More specifically, at the timing t81, the data line driving section 49A sets a voltage of the data line DTL at the voltage Vofs ((D) of FIG. 33); the writing control line driving section 43A varies a voltage of the writing control signal G1 from high level to low level ((A) of FIG. 33); and the control line driving section 46 varies a voltage of the control signal G4 from high level to low level ((B) of FIG. 33) as with the case of the modification example 2-3. At the same time, the power line driving section 48C changes a voltage of the power signal DS2 to the voltage Vccp ((E) of FIG. 33). With this operation, the light-emitting device 19 is put in an inversely-biased state, leading to the light-emitting device 19 being put in a non-luminescent state. As a result, the sub-pixel 34 is initialized as with the case of the modification example 2-3.

Next, the driving section 40C carries out the Vth correction during a period of timing between t82 and t83 (Vth correction period P2) as with the case of the modification example 2-3.

Subsequently, at the timing t83, the control line driving section 48 varies a voltage of the control signal G7 from low level to high level ((C) of FIG. 33). With this operation, the control transistor Tr7 turns off.

Thereafter, the driving section 40C writes the pixel voltage Vsig (Vsig1) into the sub-pixel 34 during a period of timing between t84 and t85 (writing period P3). More specifically, at the timing t84, the data line driving section 49A sets a voltage of the data signal Sig at the pixel voltage Vsig1 ((D) of FIG. 33). With this operation, a voltage on the first end of the capacitor Cs2 is set at the voltage Vsig1.

Next, the driving section 40C makes the sub-pixel 34 luminescent during a period of timing between t85 and t87 (luminescent period P4). More specifically, at the timing t85, the writing control line driving section 43A varies a voltage of the writing control signal G1 from low level to high level ((A) of FIG. 33). With this operation, the write transistor Tr1 and the control transistor Tr3 turn off, and from then on a voltage corresponding to the pixel voltage Vsig1 is held in the capacitor Cs2. At the same time, the control line driving section 46 varies a voltage of the control signal G4 from high level to low level ((B) of FIG. 33), and the power line driving section 48C changes a voltage of the power signal DS2 from the voltage Vccp to the voltage Vcath ((E) of FIG. 33). With this operation, the control transistor Tr4 turns on, and the light-emitting device 19 is put in a forward-biased state, leading to the light-emitting device 19 being put in a luminescent state as with the case of the above-described modification example 2-3.

Then, after the elapse of a period of a time length corresponding to a luminescent duty ratio, at the timing t87, the writing control line driving section 43A varies a voltage of the writing control signal G1 from high level to low level ((A) of FIG. 33); the control line driving section 46 varies a voltage of the control signal G4 from low level to high level ((B) of FIG. 33); and the power line driving section 48C changes a voltage of the power signal DS2 from the voltage Vcath to the voltage Vccp ((E) of FIG. 33). With this operation, the write transistor Tr1 and the control transistor Tr3 turn on, the control transistor Tr4 turns off, and further the light-emitting device 19 is put in an inversely-biased state. As a result, the light-emitting device 19 is put in a non-luminescent state as with the case of the above-described modification example 2-3.

Thereafter, the driving section 40C writes the pixel voltage Vsig (Vsig2) into the sub-pixel 34 during a period of timing between t88 and t89 (writing period P3). More specifically, at the timing t88, the data line driving section 49A sets a voltage of the data signal Sig at the pixel voltage Vsig2 ((D) of FIG. 33). With this operation, a voltage on the first end of the capacitor Cs2 is set at the voltage Vsig2.

Subsequently, the driving section 40C makes the sub-pixel 34 luminescent during a period from the timing t89 on (luminescent period P4). More specifically, at the timing t89, the writing control line driving section 43A varies a voltage of the writing control signal G1 from low level to high level ((A) of FIG. 33). With this operation, the write transistor Tr1 and the control transistor Tr3 turn off, and from then on a voltage corresponding to the pixel voltage Vsig2 is held in the capacitor Cs2. At the same time, the control line driving section 46 varies a voltage of the control signal G4 from high level to low level ((B) of FIG. 33), and the power line driving section 48C changes a voltage of the power signal DS2 from the voltage Vccp to the voltage Vcath ((E) of FIG. 33). With this operation, the control transistor Tr4 turns on, and the light-emitting device 19 is put in a forward-biased state, leading to the light-emitting device 19 being put in a luminescent state as with the case of the above-described modification example 2-3.

Thereafter, in the display unit 2C, after the elapse of a period of a time length corresponding to a luminescent duty ratio, the luminescent period P4 is terminated, and the light-emitting device 19 is put in a non-luminescent state.

With such a configuration, it is also possible to obtain the effects similar to those achieved by the display unit 2 according to the above-described embodiment. Further, the display unit 2C allows the number of transistors to be reduced in each of the sub-pixels 34, and therefore, for example, it is possible to enhance degrees of freedom in layout of the sub-pixel 34, or to increase the pixel density by reducing the area of the sub-pixel 34.

Modification Example 2-5

In the above-described embodiment, the control transistor Tr6 is configured by a P-channel MOS TFT; however, a configuration is not limited thereto. Hereinafter, the modification example 2-5 is described in detail.

Figure 34:
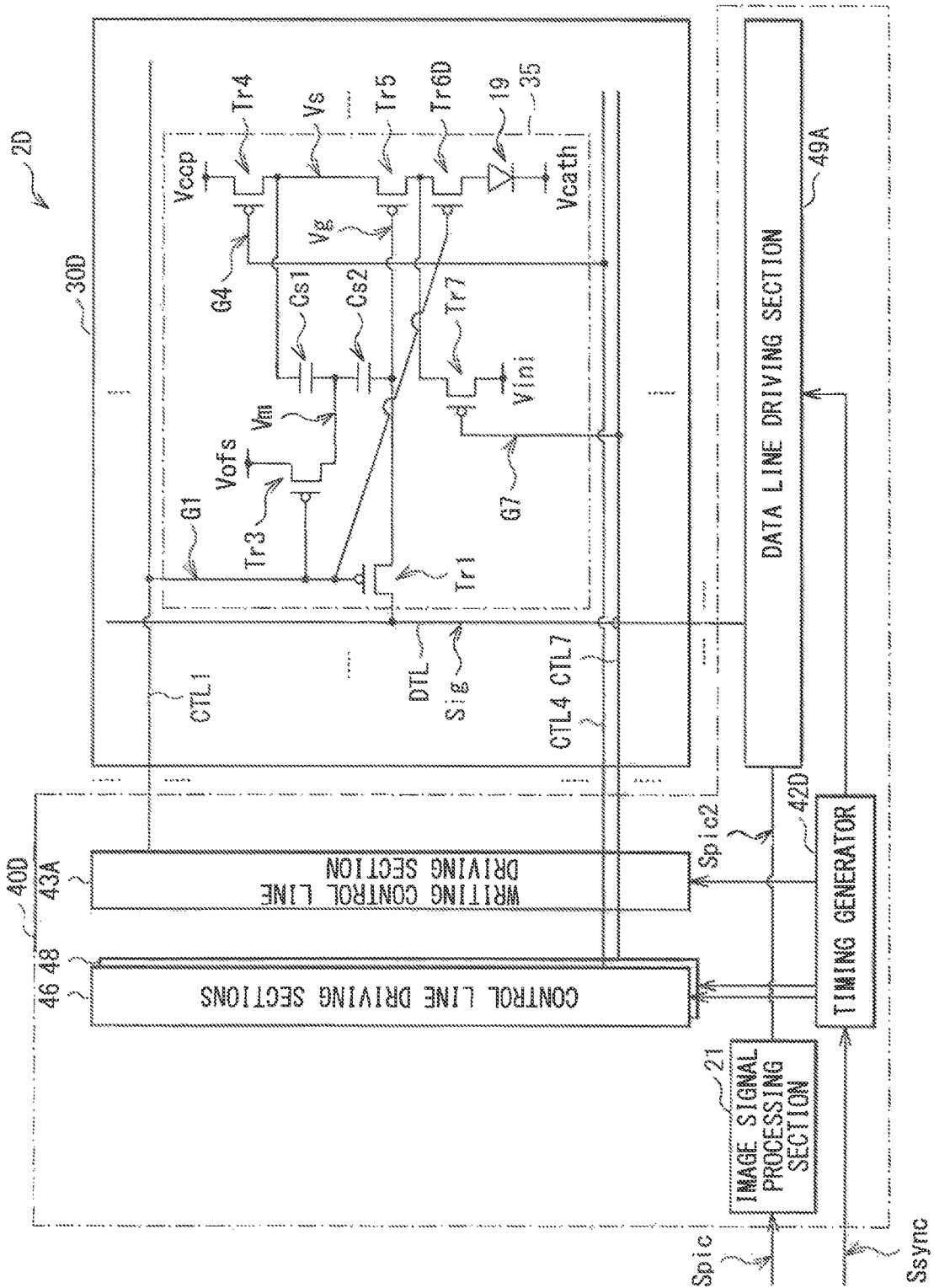
FIG. 34 is a circuit diagram illustrating a configuration example of a display unit according to a modification example.

FIG. 34 illustrates a configuration example of a display unit 2D according to a modification example 2-5. The display unit 2D is configured in such a manner that the present modification example is applied to the display unit 2B according to the above-described modification example 2-3 (FIG. 30). The display unit 2D includes a display section 30D and a driving section 40D. The display section 30D has a sub-pixel 35. The sub-pixel 35 has a control transistor Tr6D. In this example, the control transistor Tr6D is configured by an N-channel MOS TFT. A gate of the control transistor Tr6D is coupled to the writing control line CTL1. In other words, in the sub-pixel 33 according to the above-described modification example 2-3 (FIG. 30), the control transistor Tr6 is configured by a P-channel MOS TFT, and a gate of the control transistor Tr6 is coupled to the control line CTL6; however, the control transistor Tr6D is configured by an N-channel MOS TFT, and the gate of the control transistor Tr6D is coupled to the writing control line CTL1 in the sub-pixel 35 according to the present modification example (FIG. 34). The driving section 40D has an image signal processor 21, a timing generator 42D, a writing control line driving section 43A, control line driving sections 46 and 48, and a data line driving section 49A. The timing generator 42D provides a control signal to each of the writing control line driving section 43A, the control line driving sections 46 and 48, and the data line driving section 49A on the basis of the synchronous signal Ssync to be provided externally, and controls these line driving sections to operate in synchronization with one another. In other words, the driving section 40D is configured in a manner of eliminating the control line driving sections 47 and changing the timing generator 42B to the timing generator 42D in the driving section 40B according to the above-described modification example 2-3 (FIG. 30).

In other words, in the display unit 2D, the control transistor Tr6 that is a P-channel MOS TFT is replaced with the control transistor Tr6D that is an N-channel MOS TFT, and the writing control signal G1 is provided to the gate of the control transistor Tr6D with attention focused on a fact that a waveform of the writing control signal G1 ((A) of FIG. 31) and a waveform of the control signal G6 ((C) of FIG. 31) are inverted to each other in the display unit 2B according to the above-described modification example 2-3 (FIG. 31).

Figure 35:
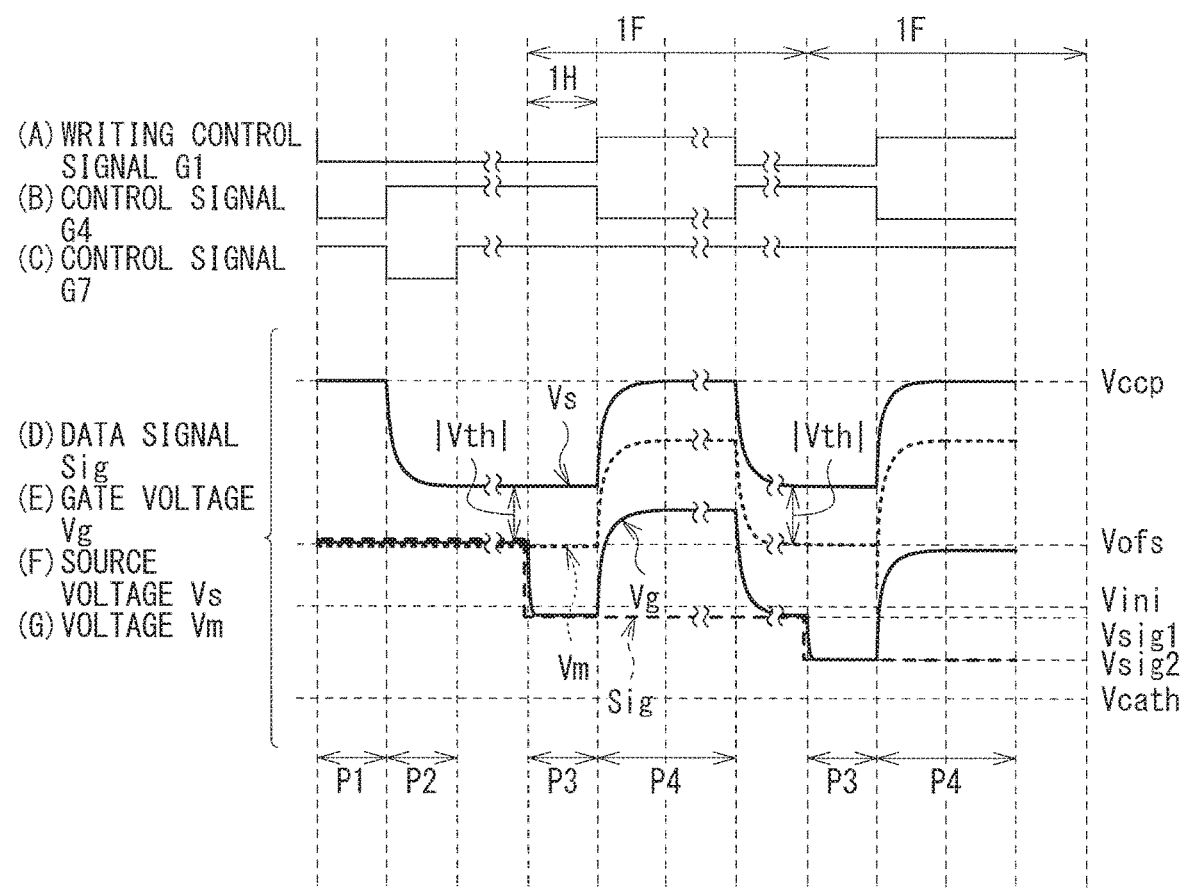
FIG. 35 is a timing waveform chart illustrating an operation example of a sub-pixel illustrated in FIG. 34.

FIG. 35 illustrates a timing chart of the display operation in the display unit 2D. (A) denotes a waveform of the writing control signal G1; (B) denotes a waveform of the control signal G4; (C) denotes a waveform of the control signal G7; (D) denotes a waveform of the data signal Sig; (E) denotes a waveform of a gate voltage Vg of the drive transistor Tr5; (F) denotes a waveform of a source voltage Vs of the drive transistor Tr5; and (G) denotes a voltage Vm. FIG. 35 omits a waveform of the control signal G6 from the timing chart (FIG. 31) of the display unit 2B according to the modification example 2-3. In other words, the display unit 2D performs the operation similar to that of the display unit 2B (FIGS. 30 and 31).

With such a configuration, it is also possible to obtain the effects similar to those achieved by the display unit 2 according to the above-described embodiment. Further, the display unit 2D allows the number of the control line driving sections to be reduced, thus making it possible to achieve a simple configuration.

Modification Example 2-6

In the above-described embodiment, the control transistor Tr7 is provided; however, a configuration is not limited thereto. Hereinafter, a modification example 2-6 is described in detail.

Figure 36:
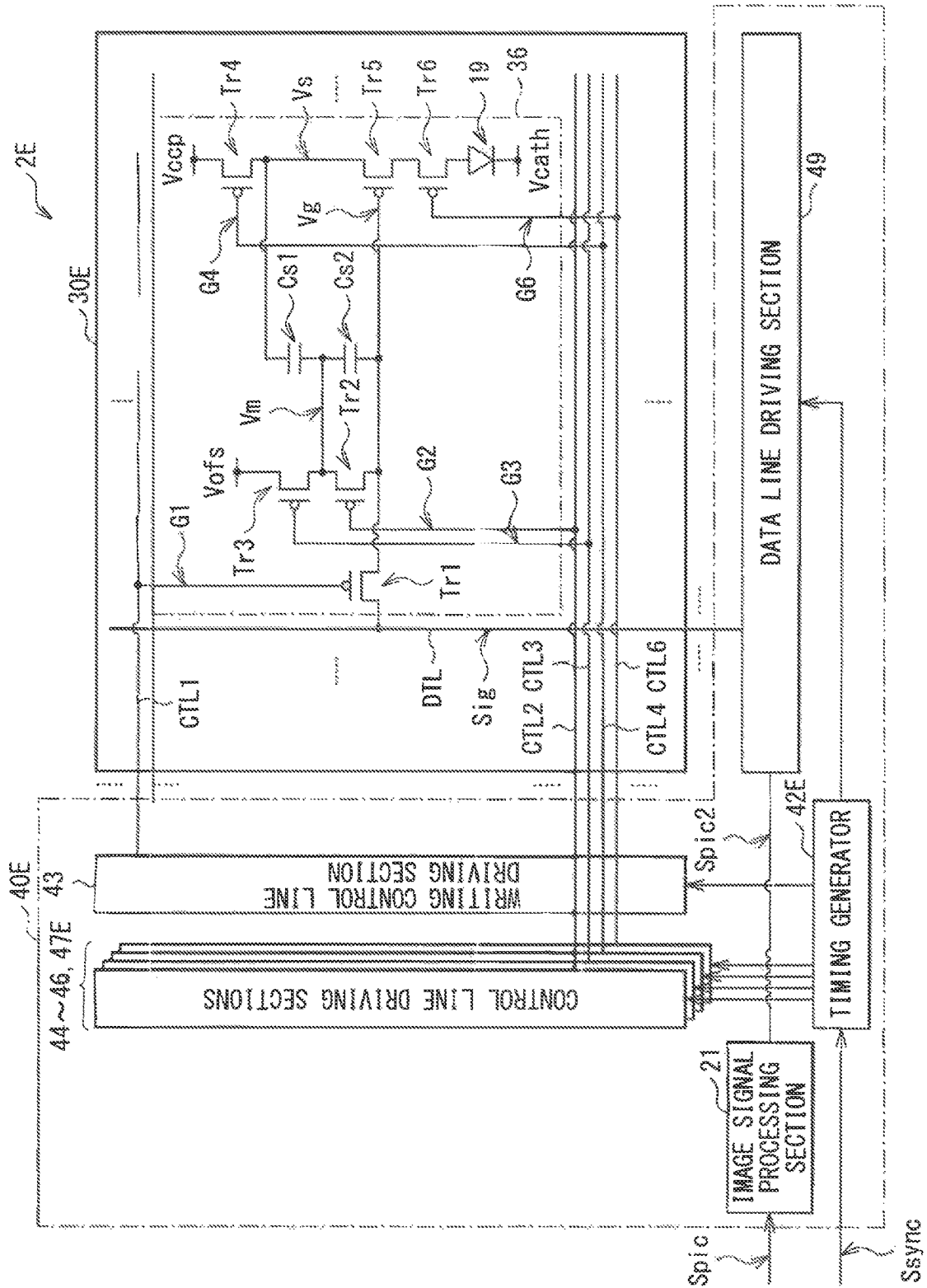
FIG. 36 is a circuit diagram illustrating a configuration example of a display unit according to a modification example.

FIG. 36 illustrates a configuration example of a display unit 2E according to a modification example 2-6. The display unit 2E is configured in such a manner that the present modification example is applied to the display unit 2 according to the above-described embodiment (FIG. 24). The display unit 2E includes a display section 30E and a driving section 40E. The display section 30E has a sub-pixel 36. The sub-pixel 36 has a write transistor Tr1, a drive transistor Tr5, control transistors Tr2 to Tr4, and Tr6, capacitors Cs1 and Cs2, and a light-emitting device 19. In other words, the sub-pixel 36 eliminates the control transistor Tr7 from the sub-pixel 31 according to the above-described embodiment (FIG. 24), and has a so-called "6Tr2C" configuration. The driving section 40E has an image signal processor 21, a timing generator 42E, a writing control line driving section 43, control line driving sections 44 to 46, and 47E, and a data line driving section 49. The timing generator 42E provides a control signal to each of the writing control line driving section 43, the control line driving sections 44 to 46, and 47E, and the data line driving section 49 on the basis of the synchronous signal Ssync to be provided externally, and controls these line driving sections to operate in synchronization with one another. The control line driving section 47E controls operation of the sub-pixels 36 on each row basis by applying control signals G6 sequentially to the plurality of control lines CTL6 in accordance with the control signal provided from the timing generator 42E. In other words, the driving section 40E is configured in a manner of eliminating the control line driving section 48, changing the control line driving section 47 to the control line driving section 47E, and changing the timing generator 42 to the timing generator 42E in the driving section 40 according to the above-described embodiment (FIG. 24).

FIG. 37 illustrates a timing chart of the display operation in the display unit 2E. (A) denotes a waveform of the writing control signal G1; (B) denotes a waveform of the control signal G2; (C) denotes a waveform of the control signal G3; (D) denotes a waveform of the control signal G4; (E) denotes a waveform of the control signal G6; (F) denotes a waveform of the data signal Sig; (G) denotes a waveform of a gate voltage Vg of the drive transistor Tr5; (H) denotes a waveform of a source voltage Vs of the drive transistor Tr5; and (I) denotes a voltage Vm on the first end of the capacitor Cs' (second end of the capacitor Cs2). FIGS. 38A to 38G illustrate status of the sub-pixel 36 during various periods.

First, the driving section 40E initializes the sub-pixel 36 during a period of timing between t101 and t102 (initialization period P1) as with the case of the above-described embodiment (FIG. 25). With this operation, in the sub-pixel 36, a potential difference across both ends of the capacitor Cs1 is set at (Vccp−Vofs), and a potential difference across both ends of the capacitor Cs2 is set at 0 V as illustrated in FIG. 38A.

Next, the driving section 40E carries out the Vth correction during a period of timing between t102 and t103 (Vth correction period P2). More specifically, the control line driving section 46 varies a voltage of the control signal G4 from low level to high level at the timing t102 ((D) of FIG. 37). With this operation, the control transistor Tr4 turns off, and feeding of the voltage Vccp to the second end of the capacitor Cs1 is stopped. Further, at the same time, the control line driving section 47E varies a voltage of the control signal G6 from high level to low level ((E) of FIG. 37). With this operation, the control transistor Tr6 turns on, and a current flows from the source to the drain of the drive transistor Tr5. Then, the source voltage Vs of the drive transistor Tr5 decreases to converge on a voltage (Vofs+ |Vth|) as with the case of the above-described embodiment ((H) of FIG. 37). At this time, a current flows through the light-emitting device 19 transiently, leading to transient light emission of the light-emitting device 19. In such a manner, in the sub-pixel 36, a potential difference across both ends of the capacitor Cs1 is set at a voltage |Vth| as illustrated in FIG. 38B.

Subsequently, at the timing t103, the control line driving section 47E varies a voltage of the control signal G6 from low level to high level ((E) of FIG. 33). With this operation, the control transistor Tr6 turns off.

Thereafter, the driving section 40E writes the pixel voltage Vsig (Vsig1) into the sub-pixel 36 during a period of timing between t104 and t105 (writing period P3) as with the case of the above-described embodiment (FIG. 25). With this operation, in the sub-pixel 36, a potential difference across both ends of the capacitor Cs2 is set at (Vofs−Vsig1) while the capacitor Cs1 keeps a potential difference across both ends of (|Vth|) as illustrated in FIG. 38C. Thereafter, the driving section 40E makes the sub-pixel 36 luminescent during a period of timing between t105 and t107 (luminescent period P4) as with the case of the above-described embodiment (FIG. 25). With this operation, in the sub-pixel 36, the light-emitting device 19 is put in a luminescent state while the capacitor Cs1 keeps a potential difference across both ends of (|Vth|) and while the capacitor Cs2 keeps a potential difference across both ends of (Vofs−Vsig1) as illustrated in FIG. 38D. Then, after the elapse of a period of a time length corresponding to a luminescent duty ratio, at the timing t107, the light-emitting device 19 is put in a non-luminescent state as with the case of the above-described embodiment (FIG. 25). In such a manner, in the sub-pixel 36, the light-emitting device 19 is put in a non-luminescent state while the capacitor Cs1 keeps a potential difference across both ends and while the capacitor Cs2 keeps a potential difference across both ends as illustrated in FIG. 38E.

Subsequently, the driving section 40E writes the pixel voltage Vsig (Vsig2) into the sub-pixel 36 during a period of timing between t108 and t109 (writing period P3) as with the case of the above-described embodiment (FIG. 25). With this operation, in the sub-pixel 36, a potential difference across both ends of the capacitor Cs2 is set at (Vofs−Vsig2) while the capacitor Cs1 keeps a potential difference across both ends of (|Vth|) as illustrated in FIG. 38F. Thereafter, the driving section 40E makes the sub-pixel 36 luminescent during a period from the timing t109 on (luminescent period P4) as with the case of the above-described embodiment (FIG. 25). With this operation, in the sub-pixel 36, the light-emitting device 19 is put in a luminescent state while the capacitor Cs1 keeps a potential difference across both ends of (|Vth|) and while the capacitor Cs2 keeps a potential difference across both ends of (Vofs−Vsig2) as illustrated in FIG. 38G. Then, in the display unit 2E, after the elapse of a period of a time length corresponding to a luminescent duty ratio, the luminescent period P4 is terminated, and the light-emitting device 19 is put in a non-luminescent state.

Next, a case where the present modification example is applied to the display unit 2A according to the above-described modification example 2-2 (FIG. 27) is described as an example.

Figure 39:
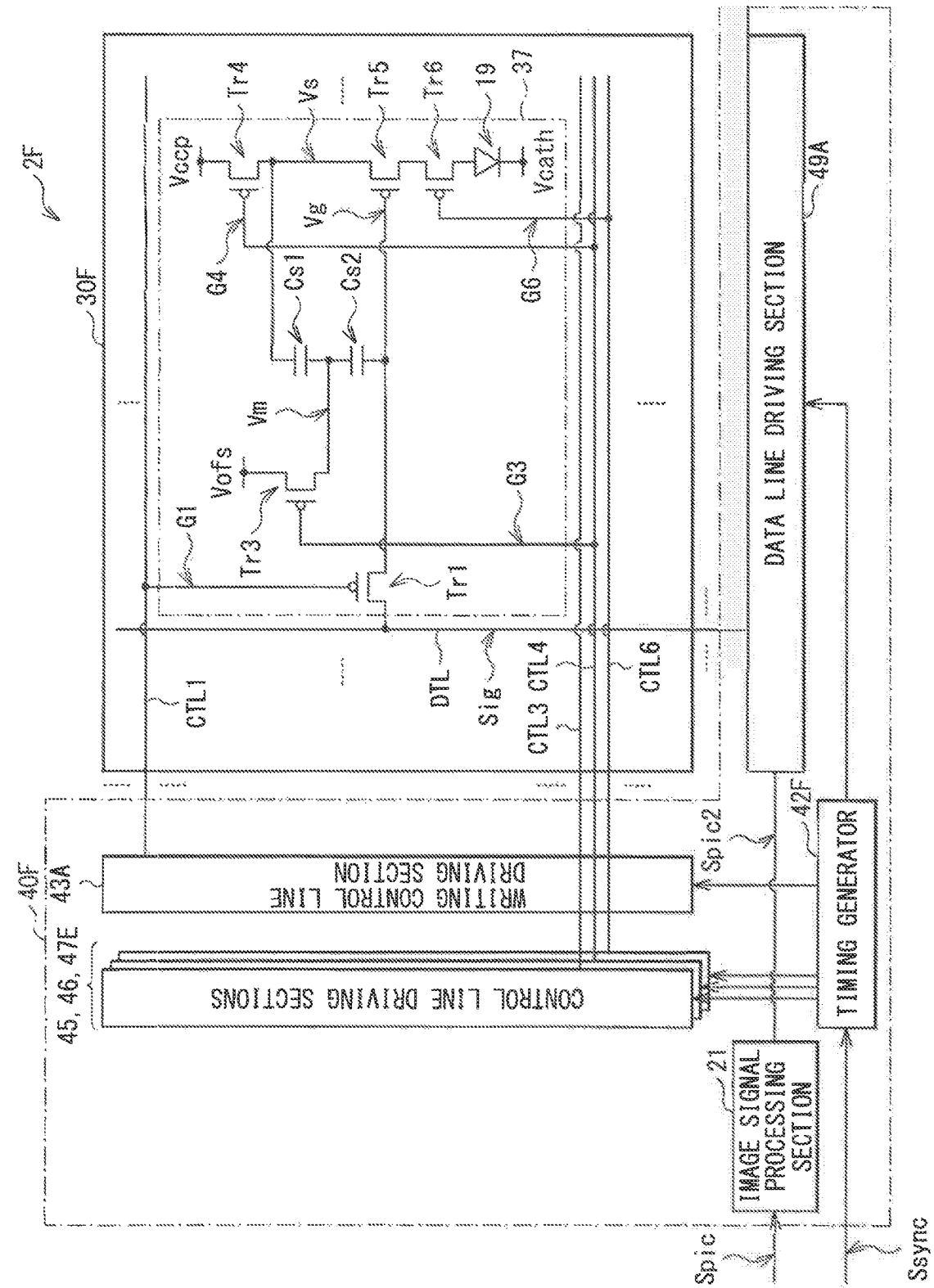
FIG. 39 is a circuit diagram illustrating a configuration example of a display unit according to a modification example.

FIG. 39 illustrates a configuration example of a display unit 2F according to the present modification example. The display unit 2F includes a display section 30F and a driving section 40F. The display section 30F has a sub-pixel 37. The sub-pixel 37 has a write transistor Tr1, a drive transistor Tr5, control transistors Tr3, Tr4, and Tr6, capacitors Cs1 and Cs2, and a light-emitting device 19. In other words, the sub-pixel 37 eliminates the control transistor Tr7 from the sub-pixel 32 according to the above-described modification example 2-2 (FIG. 27), and has a so-called "5Tr2C" configuration. The driving section 40F has an image signal processor 21, a timing generator 42F, a writing control line driving section 43A, control line driving sections 45, 46, and 47E, and a data line driving section 49A. The timing generator 42F provides a control signal to each of the writing control line driving section 43A, the control line driving sections 45, 46, and 47E, and the data line driving section 49A on the basis of the synchronous signal Ssync to be provided externally, and controls these line driving sections to operate in synchronization with one another. In other words, the driving section 40F is configured in a manner of eliminating the control line driving section 48, changing the control line driving section 47 to the control line driving section 47E, and changing the timing generator 42A to the timing generator 42F in the driving section 40A according to the above-described modification example 2-2 (FIG. 27).

Figure 40:
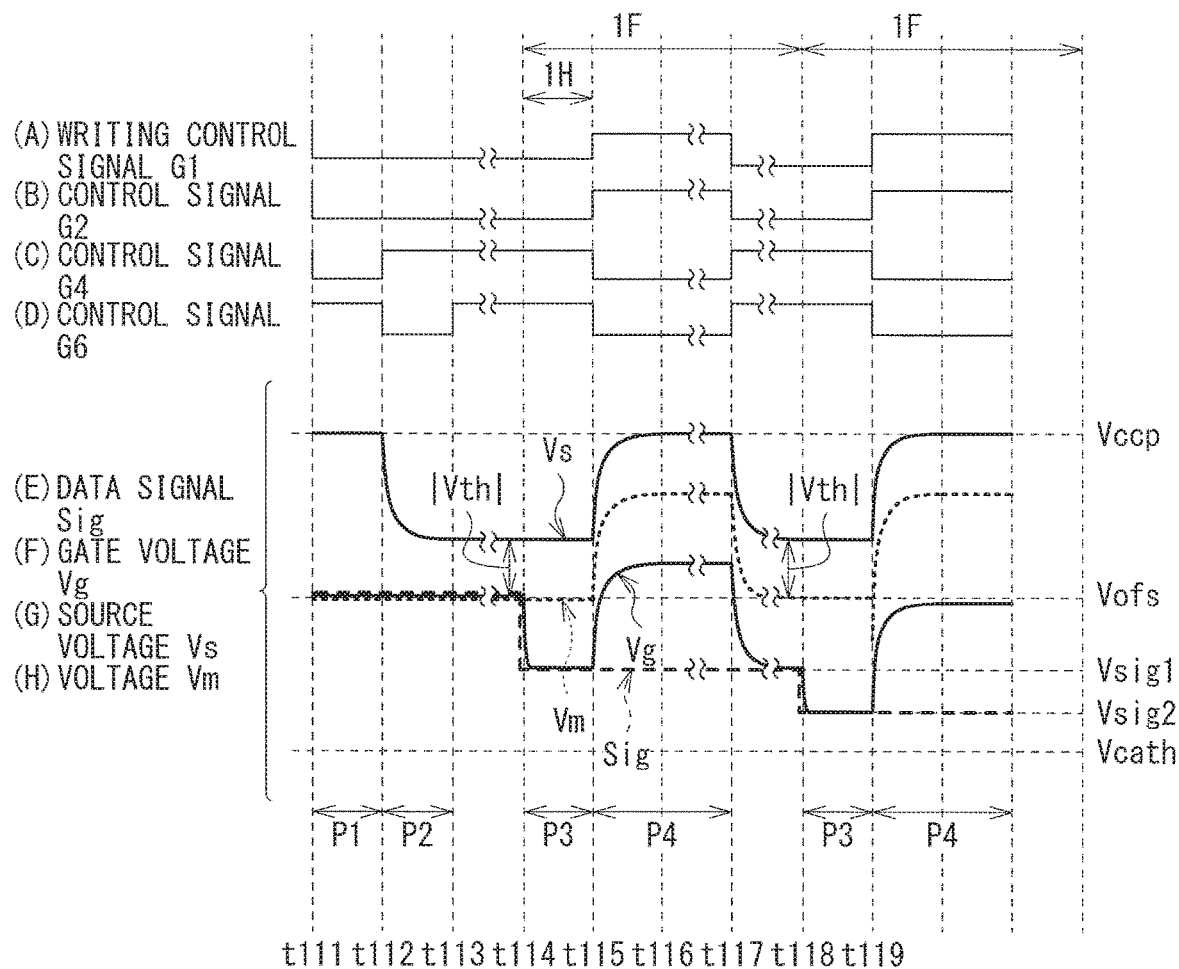
FIG. 40 is a timing waveform chart illustrating an operation example of a sub-pixel illustrated in FIG. 39.

FIG. 40 illustrates a timing chart of the display operation in the display unit 2F. (A) denotes a waveform of the writing control signal G1; (B) denotes a waveform of the control signal G3; (C) denotes a waveform of the control signal G4; (D) denotes a waveform of the control signal G6; (E) denotes a waveform of the data signal Sig; (F) denotes a waveform of a gate voltage Vg of the drive transistor Tr5; (G) denotes a waveform of a source voltage Vs of the drive transistor Tr5; and (H) denotes a voltage Vm.

First, the driving section 40F initializes the sub-pixel 37 during a period of timing between t111 and t112 (initialization period P1) as with the case of the above-described modification example 2-2 (FIG. 29).

Next, the driving section 40F carries out the Vth correction during a period of timing between t112 and t113 (Vth correction period P2). More specifically, the control line driving section 46 varies a voltage of the control signal G4 from low level to high level at the timing t112 ((C) of FIG. 40). With this operation, the control transistor Tr4 turns off, and feeding of the voltage Vccp to the second end of the capacitor Cs1 is stopped. Further, at the same time, the control line driving section 47E varies a voltage of the control signal G6 from high level to low level ((D) of FIG. 40). With this operation, the control transistor Tr6 turns on, and a current flows from the source to the drain of the drive transistor Tr5. Then, the source voltage Vs of the drive transistor Tr5 decreases to converge on a voltage (Vofs+ |Vth|) as with the case of the above-described modification example 2-2 ((G) of FIG. 40). At this time, a current flows through the light-emitting device 19 transiently, leading to transient light emission of the light-emitting device 19.

Subsequently, at the timing t113, the control line driving section 47E varies a voltage of the control signal G6 from low level to high level ((D) of FIG. 40). With this operation, the control transistor Tr6 turns off.

The operation from this timing period on is similar to that in a case of the display unit 2A according to the above-described modification example 2-2 (FIG. 29).

Next, a case where the present modification example is applied to the display unit 2B according to the above-described modification example 2-3 (FIG. 30) is described as an example.

Figure 41:
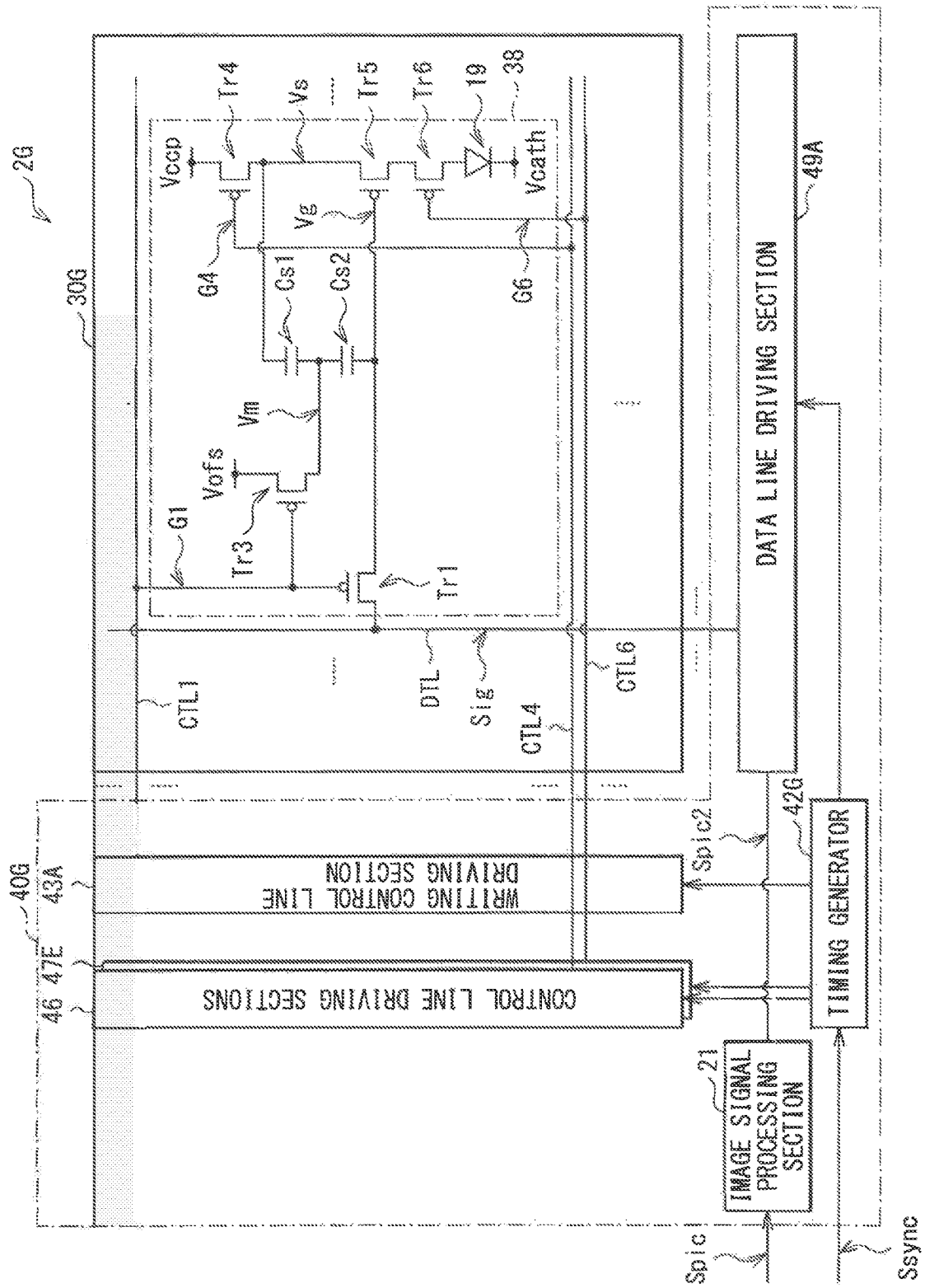
FIG. 41 is a circuit diagram illustrating a configuration example of a display unit according to a modification example.

FIG. 41 illustrates a configuration example of a display unit 2G according to the present modification example. The display unit 2G is configured in such a manner that the present modification example is applied to the display unit 2B according to the above-described modification example 2-3. The display unit 2G includes a display section 30G and a driving section 40G. The display section 30G has a sub-pixel 38. The sub-pixel 38 has a write transistor Tr1, a drive transistor Tr5, control transistors Tr3, Tr4, and Tr6, capacitors Cs1 and Cs2, and a light-emitting device 19. In other words, the sub-pixel 38 eliminates the control transistor Tr7 from the sub-pixel 33 according to the above-described modification example 2-3 (FIG. 30), and has a so-called "5Tr2C" configuration. The driving section 40G has an image signal processor 21, a timing generator 42G, a writing control line driving section 43A, control line driving sections 46 and 47E, and a data line driving section 49A. The timing generator 42G provides a control signal to each of the writing control line driving section 43A, the control line driving sections 46 and 47E, and the data line driving section 49A on the basis of the synchronous signal Ssync to be provided externally, and controls these line driving sections to operate in synchronization with one another. In other words, the driving section 40G is configured in a manner of eliminating the control line driving section 48, changing the control line driving section 47 to the control line driving section 47E, and changing the timing generator 42B to the timing generator 42G in the driving section 40B according to the above-described modification example 2-3 (FIG. 30).

Figure 42:
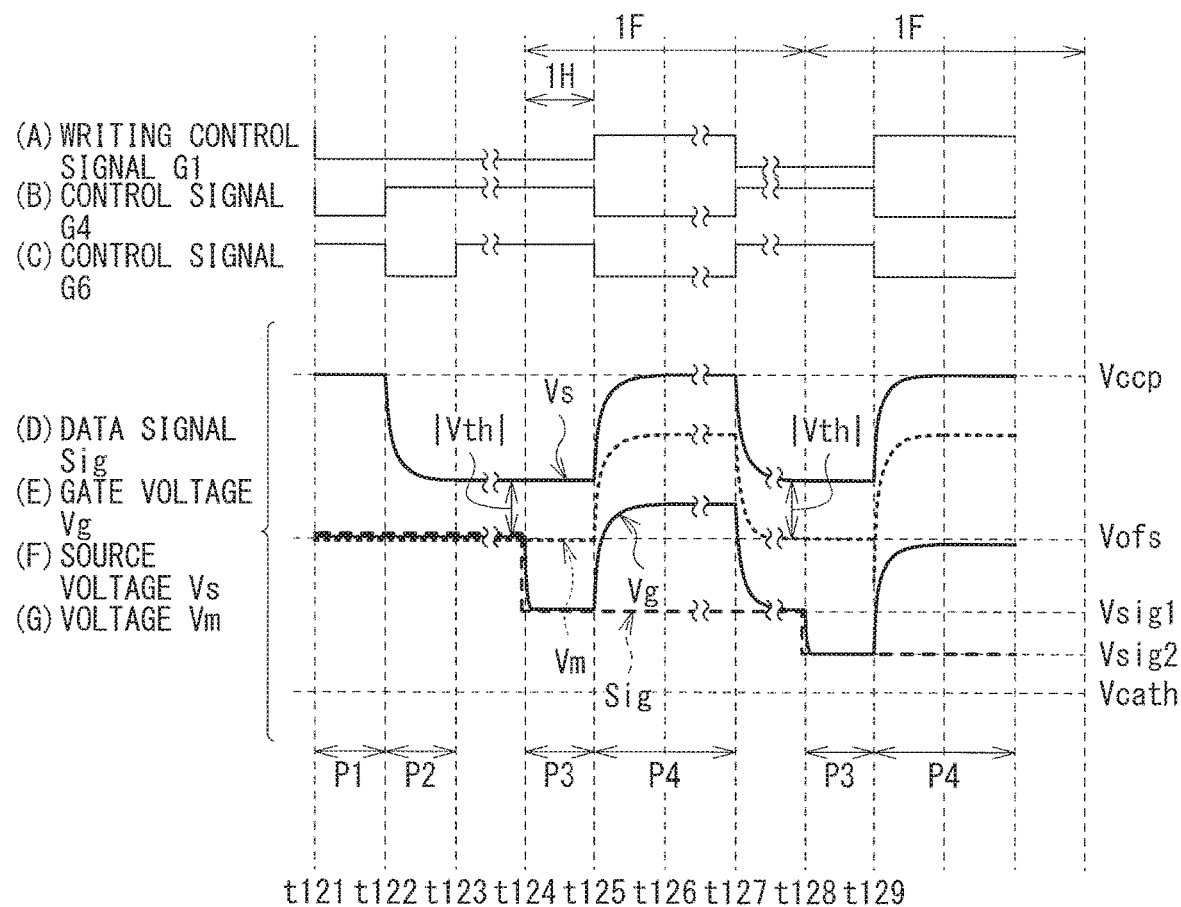
FIG. 42 is a timing waveform chart illustrating an operation example of a sub-pixel illustrated in FIG. 41.

FIG. 42 illustrates a timing chart of the display operation in the display unit 2G. (A) denotes a waveform of the writing control signal G1; (B) denotes a waveform of the control signal G4; (C) denotes a waveform of the control signal G6; (D) denotes a waveform of the data signal Sig; (E) denotes a waveform of a gate voltage Vg of the drive transistor Tr5; (F) denotes a waveform of a source voltage Vs of the drive transistor Tr5; and (G) denotes a voltage Vm.

First, the driving section 40G initializes the sub-pixel 38 during a period of timing between t121 and t122 (initialization period P1) as with the case of the above-described modification example 2-3 (FIG. 31).

Next, the driving section 40G carries out the Vth correction during a period of timing between t122 and t123 (Vth correction period P2). More specifically, the control line driving section 46 varies a voltage of the control signal G4 from low level to high level at the timing t122 ((B) of FIG. 42). With this operation, the control transistor Tr4 turns off, and feeding of the voltage Vccp to the second end of the capacitor Cs1 is stopped. Further, at the same time, the control line driving section 47E varies a voltage of the control signal G6 from high level to low level ((C) of FIG. 42). With this operation, the control transistor Tr6 turns on, and a current flows from the source to the drain of the drive transistor Tr5. Then, the source voltage Vs of the drive transistor Tr5 decreases to converge on a voltage (Vofs+ |Vth|) as with the case of the above-described modification example 2-3 ((F) of FIG. 42). At this time, a current flows through the light-emitting device 19 transiently, leading to transient light emission of the light-emitting device 19.

Subsequently, at the timing t123, the control line driving section 47E varies a voltage of the control signal G6 from low level to high level ((C) of FIG. 42). With this operation, the control transistor Tr6 turns off.

The operation from this timing period on is similar to that in a case of the display unit 2B according to the above-described modification example 2-3 (FIG. 31).

With such a configuration, it is also possible to obtain the effects similar to those achieved by the display unit 2 and the like according to any of the above-described embodiments. Further, the display units 2E, 2F, and 2G allow the number of the control line driving sections to be reduced, thus making it possible to achieve a simple configuration. It is to be noted that the light-emitting device 19 emits light transiently during the Vth correction period P2, and therefore the contrast may deteriorate. Accordingly, the display units 2E, 2F, and 2G may be usable for any applications where such deterioration in the contrast does not matter.

Modification Example 2-7

Figure 43:
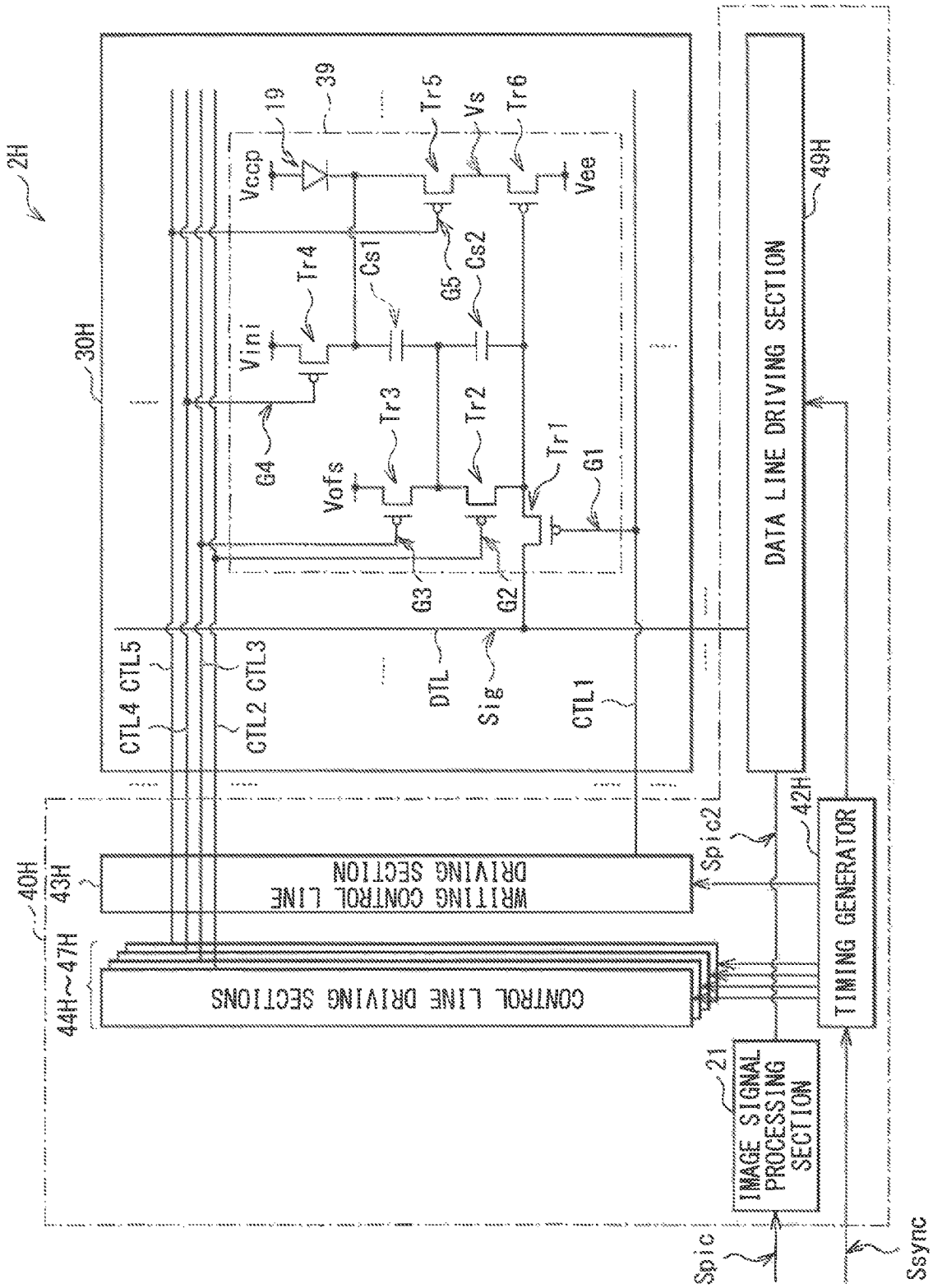
FIG. 43 is a circuit diagram illustrating a configuration example of a display unit according to a modification example.

In the above-described embodiment, a voltage is provided to a cathode of the light-emitting device 19 from a driving section; however, a configuration is not limited thereto, and alternatively a voltage may be provided to an anode of the light-emitting device 19 from a driving section like a display unit 2H as illustrated in FIG. 43 for example. The display unit 2H includes a display section 30H and a driving section 40H. The display unit 2H is configured in a manner of changing each transistor from an N-channel MOS type to a P-channel MOS type and inverting orientation of the light-emitting device 19. The driving section 40H has an image signal processor 21, a timing generator 42H, a writing control line driving section 43H, control line driving sections 44H to 47H, and a data line driving section 49.

3. Application Examples

Next, the description will be provided on application examples of any of the display units mentioned in the above-described respective embodiments. Any of the display units according to the above-described respective embodiments may be applicable to a display unit in an electronic apparatus in every field where image signals to be input externally or internally generated image signals are displayed as images or video pictures, such as a television receiver, a digital camera, a notebook personal computer, a mobile terminal including a mobile phone, or a video camera.

Figure 44:
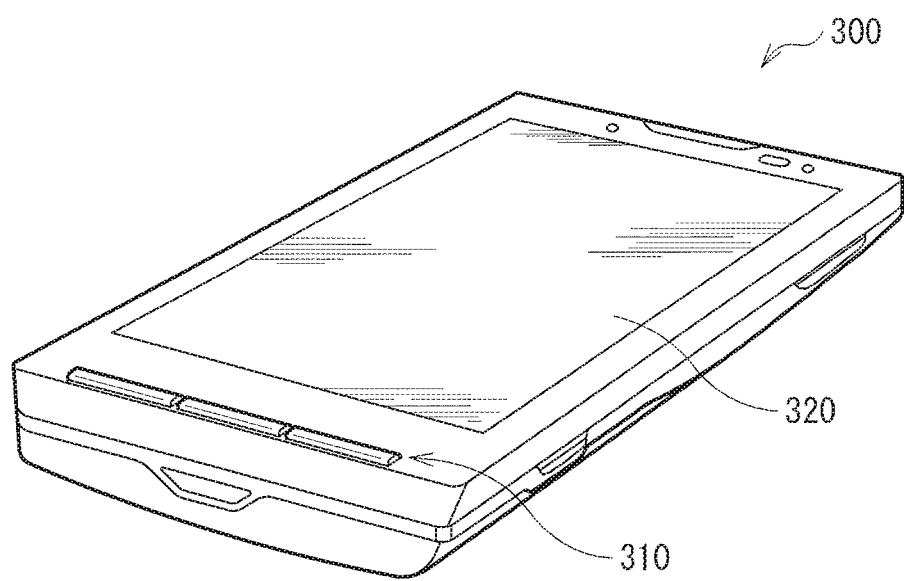
FIG. 44 is a perspective view illustrating an external appearance configuration of a smartphone to which any of the display units according to the embodiments of the disclosure may be applicable.

FIG. 44 illustrates an external appearance of a smartphone 300. The smartphone 300 may have, for example, a main body section 310 and a display section 320, and the display section 320 is configured by any of the above-described display units.

Any of the display units mentioned in the above-described respective embodiments may be applicable to a variety of electronic apparatuses in such a manner, and the technology allows for reduction of the power consumption. Especially in a mobile electronic apparatus having a battery, the technology contributes significantly to extension of a battery drive time period.

The technology is described thus far with reference to some embodiments and modification examples thereof, as well as examples of application to electronic apparatuses; however, the technology is not limited to the above-described embodiments and the like, but various modifications are possible.

Figure 45:
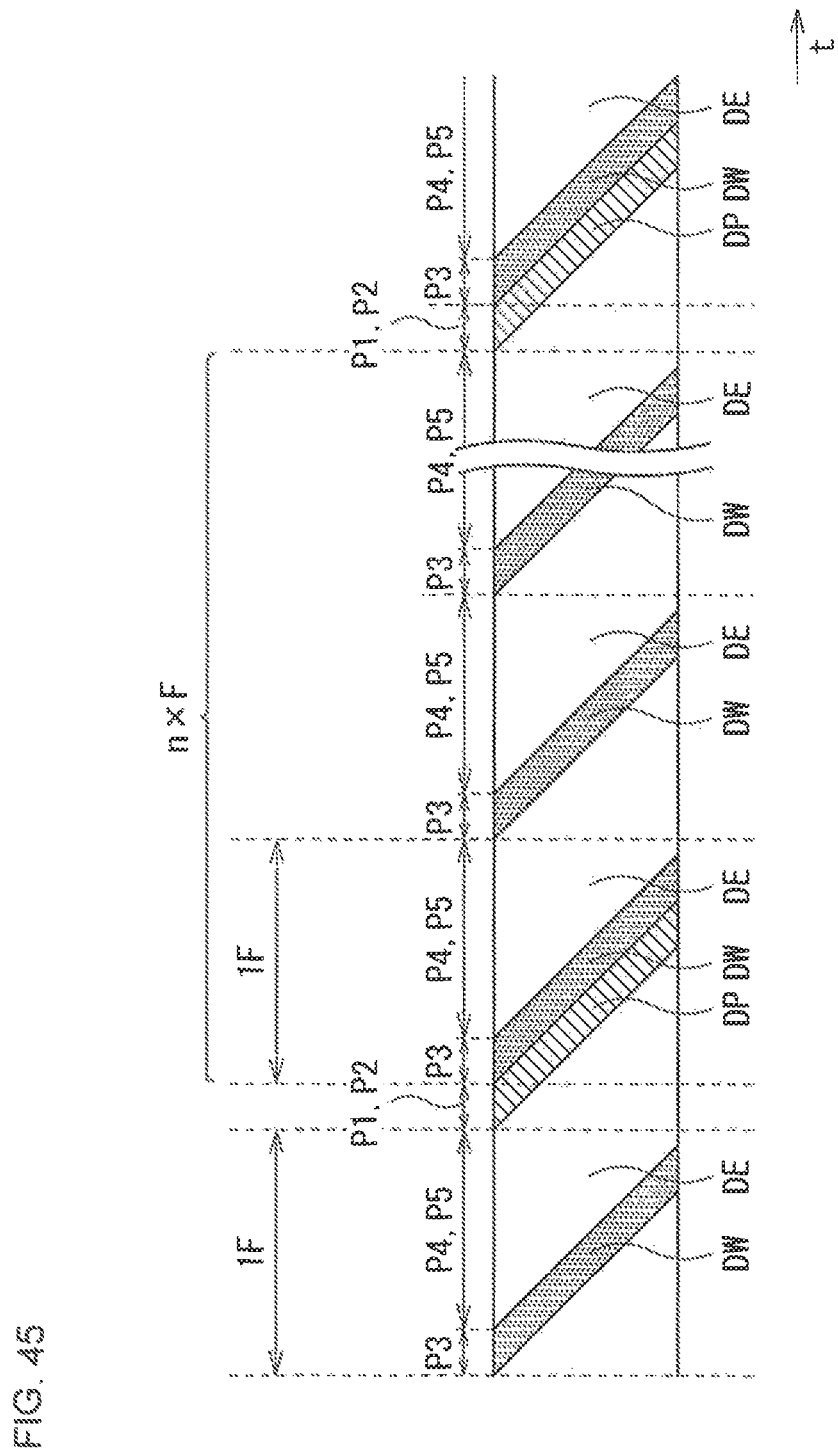
FIG. 45 is a timing chart illustrating an operation example of a display unit according to a modification example.

For example, in the above-described respective embodiments, scan driving is carried out while keeping a length of a frame period; however, the operation is not limited thereto. For example, as illustrated in FIG. 45, a length of a frame period may be shortened in performing the preparatory driving DP, and the write driving DW may be performed immediately after the preparatory driving DP.

It is to be noted that the effects described in the present specification are provided only for illustrative purposes. Therefore, the effects of the technology are not limited to those described in the present specification. The technology may have any effects other than those described in the present specification.

For example, the technology may be configured as follows.

(1)

A display unit, including:
a unit pixel; and
a driving section that drives the unit pixel, wherein
the unit pixel includes
a light-emitting device,
a capacitor section having a first capacitor and a second capacitor that are coupled in series through a first node,
a drive transistor that supplies a drive current corresponding to a potential difference across both ends of the capacitor section to the light-emitting device, and
a first transistor that delivers a first voltage to the first node by turning on.

(2)

The display unit according to (1), wherein the driving section performs preparatory driving, and performs write driving and luminescent driving more than once alternately after the preparatory driving, the preparatory driving setting a predetermined voltage in the first capacitor, the write driving setting a voltage corresponding to a pixel voltage in the second capacitor, and the luminescent driving supplying the drive current to the light-emitting device.

(3)

The display unit according to (2), wherein
the drive transistor has a gate and a source,
the light-emitting device is coupled to a second node,
the unit pixel further includes a second transistor that couples the source of the drive transistor to the second node by turning on,
the first capacitor is inserted between the first node and the second node, and
the second capacitor is inserted between the first node and the gate of the drive transistor.

(4)

The display unit according to (3), wherein
the preparatory driving includes first preparatory driving, and second preparatory driving performed after the first preparatory driving, and
the driving section turns on the first transistor and applies a first supply voltage to a drain of the drive transistor in the first preparatory driving, and turns on the first transistor and the second transistor and applies a second supply voltage to the drain of the drive transistor in the second preparatory driving.

(5)

The display unit according to (3), wherein the preparatory driving includes first preparatory driving, and second preparatory driving performed after the first preparatory driving, the unit pixel further includes a third transistor that delivers a second voltage to the second node by turning on, and the driving section turns on the first transistor and the third transistor and turns off the second transistor in the first preparatory driving, and turns on the first transistor and the second transistor and turns off the third transistor in the second preparatory driving.

(6)

The display unit according to (4) or (5), wherein the unit pixel further includes a write transistor that delivers the pixel voltage or the first voltage selectively to the gate of the drive transistor by turning on, and the driving section delivers the first voltage to the gate of the drive transistor by turning on the write transistor in the preparatory driving, and delivers the pixel voltage to the gate of the drive transistor by turning on the write transistor in the write driving.

(7)

The display unit according to (6), wherein a gate of the write transistor is coupled to a gate of the first transistor.

(8)

The display unit according to (4) or (5), wherein the unit pixel further includes a fourth transistor that couples the gate of the drive transistor to the first node by turning on, and a write transistor that delivers the pixel voltage to the gate of the drive transistor by turning on, and the driving section turns on the fourth transistor and turns off the write transistor in the preparatory driving, and turns off the fourth transistor and turns on the write transistor in the write driving.

(9)

The display unit according to (2), wherein the drive transistor includes a gate, a drain, and a source, the light-emitting device is coupled to the source of the drive transistor, the first capacitor is inserted between the first node and the source of the drive transistor, and the second capacitor is inserted between the first node and the gate of the drive transistor.

(10)

The display unit according to (9), wherein the unit pixel further includes a fifth transistor that delivers a supply voltage to the drain of the drive transistor by turning on.

(11)

The display unit according to (2), wherein the drive transistor includes a gate, a drain, and a source, the unit pixel further includes a sixth transistor that delivers a supply voltage to the source of the drive transistor by turning on, and a seventh transistor that couples the drain of the drive transistor to the light-emitting device by turning on, the first capacitor is inserted between the first node and the source of the drive transistor, and the second capacitor is inserted between the first node and the gate of the drive transistor.

(12)

The display unit according to (11), wherein the unit pixel further includes an eighth transistor that delivers a third voltage to the drain of the drive transistor by turning on, the preparatory driving includes first preparatory driving, and second preparatory driving performed after the first preparatory driving, and the driving section turns on the first transistor and the sixth transistor and turns off the seventh transistor and the eighth transistor in the first preparatory driving, and turns on the first transistor and the eighth transistor and turns off the sixth transistor and the seventh transistor in the second preparatory driving.

(13)

The display unit according to (12), wherein a gate of the first transistor is coupled to a gate of the seventh transistor.

(14)

The display unit according to (12) or (13), wherein the third voltage is a voltage equal to the first voltage.

(15)

The display unit according to (11), wherein the preparatory driving includes first preparatory driving, and second preparatory driving performed after the first preparatory driving, and the driving section turns on the first transistor and the sixth transistor and turns off the seventh transistor in the first preparatory driving, and turns on the first transistor and the seventh transistor and turns off the sixth transistor in the second preparatory driving.

(16)

The display unit according to (2), wherein the drive transistor includes a gate, a drain, and a source, the unit pixel further includes a sixth transistor that delivers a supply voltage to the source of the drive transistor by turning on, and an eighth transistor that delivers a third voltage to the drain of the drive transistor by turning on, the light-emitting device includes a cathode and an anode, the anode being coupled to the drain of the drive transistor, the first capacitor is inserted between the first node and the source of the drive transistor, and the second capacitor is inserted between the first node and the gate of the drive transistor.

(17)

The display unit according to (16), wherein the preparatory driving includes first preparatory driving, and second preparatory driving performed after the first preparatory driving, and the driving section turns on the first transistor and the sixth transistor, turns off the eighth transistor and applies a third supply voltage to the cathode of the light-emitting device in the first preparatory driving, and turns on the first transistor and the eighth transistor, turns off the sixth transistor and applies the third supply voltage to the cathode of the light-emitting device in the second preparatory driving.

(18)

The display unit according to (17), wherein the driving section applies the third supply voltage to the cathode of the light-emitting device in the write driving, and applies a fourth supply voltage to the cathode of the light-emitting device in the luminescent driving.

(19)

The display unit according to any one of (2) to (18), wherein the driving section performs the preparatory driving for the unit pixel in a time shorter than a time equivalent to a single frame period.

(20)

The display unit according to (19), wherein the driving section performs an initial write driving of the write driving performed more than once immediately after the preparatory driving.

(21)

The display unit according to (19), wherein the driving section performs an initial write driving of the write driving performed more than once after elapse of a predetermined period upon completion of the preparatory driving.

(22)

The display unit according to any one of (2) to (18), wherein the driving section performs the preparatory driving for the unit pixel over a period of time equivalent to a single frame period.

(23)

The display unit according to any one of (2) to (22), wherein the unit pixel comprises a plurality of unit pixels, and the driving section performs the preparatory driving for the plurality of unit pixels together.

(24)

The display unit according to (23), wherein drains of the drive transistors in the plurality of unit pixels are coupled to one another.

(25)

The display unit according to any one of (2) to (22), wherein the unit pixel comprises a plurality of unit pixels, and the driving section performs the preparatory driving for the plurality of unit pixels by carrying out, on a basis of one or more lines as a unit, scanning of the plurality of unit pixels.

(26)

The display unit according to (25), wherein the drains of the drive transistors in the unit pixel corresponding to one or more lines are coupled to one another.

(27)

A driving method, including:

performing preparatory driving that sets a predetermined voltage in a first capacitor of a capacitor section; and performing write driving and luminescent driving more than once alternately after the preparatory driving, the write driving setting a voltage corresponding to a pixel voltage in a second capacitor of the capacitor section, the second capacitor being coupled in series to the first capacitor through a first node, and the luminescent driving supplying a drive current corresponding to a potential difference across both ends of the capacitor section to a light-emitting device.

(28)

An electronic apparatus provided with a display unit and a control section that controls operation for the display unit, the display unit including:

a unit pixel; and a driving section that drives the unit pixel), wherein the unit pixel includes a light-emitting device, a capacitor section having a first capacitor and a second capacitor that are coupled in series through a first node, a drive transistor that supplies a drive current corresponding to a potential difference across both ends of the capacitor section to the light-emitting device, and a first transistor that delivers a first voltage to the first node by turning on.

This application claims the priority on the basis of Japanese Patent Application No. 2014-100767 filed on May 14, 2014 in Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

What is claimed:

1. A display apparatus comprising:

a unit pixel;

a first driving section configured to drive the unit pixel; and a second driving section configured to drive the unit pixel, wherein the unit pixel includes a light-emitting device, a first capacitor and a second capacitor that are electrically connected in series, a first transistor configured to supply a data signal from a data signal line to the first capacitor when the first transistor is in a non state, a second transistor configured to supply a drive current from a first voltage line to the light-emitting device according to a voltage stored in the first capacitor, a third transistor connected between the first voltage line and the second transistor, and a fourth transistor connected between a second voltage line and a node, the node being connected to the first capacitor and the second capacitor, a control terminal of the first transistor and a control terminal of the fourth transistor a reconnected to the first driving section, and a control terminal of the third transistor is connected to the second driving section.

2. The display apparatus according to claim 1, wherein the control terminal of the first transistor and the control terminal of the fourth transistor are connected to the first driving section through a same control line.

3. The display apparatus according to claim 1, wherein the unit pixel includes a fifth transistor connected between the second transistor and an anode electrode of the light-emitting device, and a control terminal of the fifth transistor is connected to the second driving section.

4. The display apparatus according to claim 3, wherein the control terminal of the third transistor is connected to the second driving section through a first control line, and the control terminal of the fifth transistor is connected to the second driving section through a second control line.

5. The display apparatus according to claim 1, wherein the unit pixel includes a sixth transistor connected to an anode electrode of the light emitting device.

6. The display apparatus according to claim 1, wherein the first transistor, the second transistor, the third transistor, and the fourth transistor are respectively configured by P-channel metal oxide semiconductor transistors.

7. The display apparatus according to claim 1, wherein the node is between the first capacitor and the second capacitor.

8. The display apparatus according to claim 1, wherein a first terminal of the first capacitor is electrically connected with a first terminal of the second capacitor, and a second terminal of the second capacitor is electrically connected with a control terminal of the second transistor.

9. The display apparatus according to claim 8, wherein the second terminal of the second capacitor is electrically connected with a source or a drain of the first transistor.

10. The display apparatus according to claim 1, wherein the light-emitting device is an organic electroluminescent device.

11. An electronic apparatus comprising a display unit and image signal processing circuitry, the display unit comprising:
a unit pixel;
a first driving section configured to drive the unit pixel; and a second driving section configured to drive the unit pixel,
wherein the unit pixel includes
a light-emitting device,
a first capacitor and a second capacitor that are electrically connected in series,
a first transistor configured to supply a data signal from a data signal line to the first capacitor when the first transistor is in an on state,
a second transistor configured to supply a drive current from a first voltage line to the light-emitting device according to a voltage stored in the first capacitor,
a third transistor connected between the first voltage line and the second transistor, and
a fourth transistor connected between a second voltage line and a node,
the node being connected to the first capacitor and the second capacitor,
a control terminal of the first transistor and a control terminal of the fourth transistor are connected to the first driving section, and
a control terminal of the third transistor is connected to the second driving section.

12. The electronic apparatus according to claim 11, wherein the control terminal of the first transistor and the control terminal of the fourth transistor are connected to the first driving section through a same control line.

13. The electronic apparatus according to claim 11, wherein
the unit pixel includes a fifth transistor connected between the second transistor and an anode electrode of the light-emitting device, and
a control terminal of the fifth transistor is connected to the second driving section.

14. The electronic apparatus according to claim 13, wherein
the control terminal of the third transistor is connected to the second driving section through a first control line, and
the control terminal of the fifth transistor is connected to the second driving section through a second control line.

15. The electronic apparatus according to claim 11, wherein the unit pixel includes a sixth transistor connected to an anode electrode of the light emitting device.

16. The electronic apparatus according to claim 11, wherein the first transistor, the second transistor, the third transistor, and the fourth transistor are respectively configured by P-channel metal oxide semiconductor transistors.

17. The electronic apparatus according to claim 11, wherein the node is between the first capacitor and the second capacitor.

18. The electronic apparatus according to claim 11, wherein a first terminal of the first capacitor is electrically connected with a first terminal of the second capacitor, and a second terminal of the second capacitor is electrically connected with a control terminal of the second transistor.

19. The electronic apparatus according to claim 18, wherein the second terminal of the second capacitor is electrically connected with a source or a drain of the first transistor.

20. The electronic apparatus according to claim 11, wherein the light-emitting device is an organic electroluminescent device.

* * * * *